(12) United States Patent
Matsushita et al.

(10) Patent No.: US 8,557,717 B2
(45) Date of Patent: *Oct. 15, 2013

(54) METHOD FOR MANUFACTURING A SEMICONDUCTOR DEVICE

(75) Inventors: Daisuke Matsushita, Hiratsuka (JP); Koichi Muraoka, Sagamihara (JP); Koichi Kato, Yokohama (JP); Yasushi Nakasaki, Yokohama (JP); Yuichiro Mitani, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 466 days.

This patent is subject to a terminal disclaimer.

(21) Appl. No.: 12/801,912

(22) Filed: Jul. 1, 2010

(65) Prior Publication Data
US 2011/0003481 A1  Jan. 6, 2011

Related U.S. Application Data

(62) Division of application No. 11/547,691, filed as application No. PCT/JP2006/317385 on Aug. 28, 2006, now Pat. No. 7,772,129.

(30) Foreign Application Priority Data

Sep. 29, 2005 (JP) ................................. 2005-284057
Jun. 27, 2006 (JP) ................................. 2006-176863

(51) Int. Cl.
*H01L 21/31* (2006.01)
*H01L 21/469* (2006.01)

(52) U.S. Cl.
USPC ......................................... 438/775; 438/769

(58) Field of Classification Search
USPC .................................. 438/769, 775
See application file for complete search history.

(56) References Cited

U.S. PATENT DOCUMENTS 5,976,918 A * 11/1999 Matsuoka et al. ............ 438/149
2002/0040847 A1  4/2002 Ohmi et al.
(Continued)

FOREIGN PATENT DOCUMENTS

JP  57-075427  5/1982
JP  59-13335   1/1984
(Continued)

OTHER PUBLICATIONS

Matsushita et al. "Novel Fabrication Process to Realize Ultra-thin (EOT=0.7nm) and Ultra-low Leakage SiON Gate Dielectrics" Symposium on VLSI Technology; Digest of Technical Papers 2004, pp. 172-173.*

(Continued)

*Primary Examiner* — Thao Le
*Assistant Examiner* — Geoffrey Ida
(74) *Attorney, Agent, or Firm* — Finnegan, Henderson, Farabow, Garrett & Dunner, L.L.P.

(57) ABSTRACT

It is made possible to restrain generation of defects at the time of insulating film formation. A method for manufacturing a semiconductor device, includes: placing a semiconductor substrate into an atmosphere, thereby forming a nitride film on a surface of the semiconductor substrate, the atmosphere containing a first nitriding gas nitriding the surface of the semiconductor substrate and a first diluent gas not actually reacting with the semiconductor substrate, the ratio of the sum of the partial pressure of the first diluent gas and the partial pressure of the first nitriding gas to the partial pressure of the first nitriding gas being 5 or higher, and the total pressure of the atmosphere being 40 Torr or lower.

24 Claims, 43 Drawing Sheets

(56) References Cited

U.S. PATENT DOCUMENTS

| | | | |
|---|---|---|---|
| 2002/0137362 | A1 | 9/2002 | Jammy et al. |
| 2002/0197882 | A1 | 12/2002 | Niimi et al. |
| 2003/0052377 | A1* | 3/2003 | Weimer .................. 257/411 |
| 2003/0214001 | A1 | 11/2003 | Yasuda et al. |
| 2004/0082198 | A1 | 4/2004 | Nakamura et al. |
| 2004/0121539 | A1 | 6/2004 | Omi et al. |
| 2004/0235311 | A1 | 11/2004 | Nakanishi et al. |
| 2004/0256660 | A1 | 12/2004 | Ozawa et al. |
| 2005/0064667 | A1 | 3/2005 | Matsushita et al. |
| 2007/0009661 | A1 | 1/2007 | Aizawa et al. |

FOREIGN PATENT DOCUMENTS

| | | |
|---|---|---|
| JP | 02-015630 | 1/1990 |
| JP | 10-163197 | 6/1998 |
| JP | 2000-269483 | 9/2000 |
| JP | 2001-176870 | 6/2001 |
| JP | 2003-264190 | 9/2003 |
| JP | 2004-193414 | 7/2004 |
| JP | 2005-089791 | 4/2005 |
| JP | 2005-93865 | 4/2005 |
| JP | 2005-235792 | 9/2005 |
| JP | 2006-216897 | 8/2006 |
| KR | 10-2005-0060268 | 6/2005 |

OTHER PUBLICATIONS

Notification of Reasons for Rejection issued by the Japanese Patent Office on Feb. 1, 2011, for Japanese Patent Application No. 2006-176863, and English-language translation thereof.

Matsushita et al., "Dramatic Improvement of $V_{fb}$ shift and $G_m^{max}$ with ultra-thin and ultra-low-leakage SiN-based SiON gate dielectrics," International Electron Devices Meeting (2005), pp. 847-850.

Kato et al., "Uniform Sub-nm Nitridation on Si(100) through Strong N Condensation," Physics of Semiconductors: $27^{th}$ International Conference on the Physics of Semiconductors (2005), pp. 395-396.

Matsushita et al., "Novel Fabrication Process to Realize Ultra-thin (EOT=0.7nm) and Ultra-low Leakage SiON Gate Dielectrics," Symposium on VLSI Technology (2004), pp. 172-173.

Kraus et al., "Low-energy Nitrogen Plasmas for 65-nm node Oxynitride Gate Dielectrics: A Correlation of Plasma Characteristics and Device Parameters," Symposium on VLSI Technology (2003).

Matsushita et al., "Atomic-Scale Characterization of Nitridation Processes on Si(100)-2×1 Surfaces y Radical Nitrogen," Jpn. J. Appl. Phys. (Apr. 2001), 40:2827-29.

Fujisaki et al., "Damage-Free and Hydrogen-Free Nitridation of Silicon Substrate by Nitrogen Radical Source," Jpn. J. Appl. Phys., vol. 39, Part 2, No. 11A, pp. L1075-L1077, (2000).

Matsushita et al., "Novel Fabrication Process to Realize Ultra-thin (E0T=1.7nm) and Ultra-low Leakage SiON Gate Dielectrics," 2004 Symposium on VLSI Technology Digest of Technical Papers, pp. 172-173, (2004).

Notification of Argument Submission issued by the Korean Patent Office on Jul. 18, 2008, for Korean Patent Application No. 10-2007-7017030, and English-language translation thereof.

Written Opinion issued by the European Patent Office for International Patent Application No. PCT/JP2006/317385.

International Preliminary Report on Patentability for International Application No. PCT/JP2006/317385, dated Apr. 10, 2008.

Notification of Reasons for Rejection issued by the Japanese Patent Office on Nov. 4, 2011, for Japanese Patent Application No. 2006-176863, and English-language translation thereof.

Communication pursuant to Article 94(3) EPC, dated Aug. 10, 2010, from the European Patent Office in corresponding EP Application No. 06 783 160.2.

* cited by examiner

| N₂ GAS DILUTION RATE (N₂+NH₃)/NH₃ | TOTAL PRESSURE [Torr] | | | | | | |
|---|---|---|---|---|---|---|---|
| | 3 | 10 | 30 | 60 | 100 | 300 | 740 |
| 1 | 1.85 | 1.84 | 1.82 | 1.77 | 1.77 | 1.77 | 1.76 |
| 2 | 1.86 | 1.84 | 1.815 | 1.78 | 1.77 | 1.765 | 1.76 |
| 5 | 1.88 | 1.87 | 1.85 | 1.79 | 1.78 | 1.78 | 1.77 |
| 10 | 1.91 | 1.91 | 1.9 | 1.815 | 1.8 | 1.78 | 1.77 |
| 100 | 1.92 | 1.92 | 1.91 | 1.83 | 1.815 | 1.79 | 1.77 |
| 1000 | 1.93 | 1.92 | 1.905 | 1.84 | 1.83 | 1.79 | 1.77 |
| 10000 | 1.94 | 1.93 | 1.91 | 1.85 | 1.84 | 1.79 | 1.78 |

FIG. 20

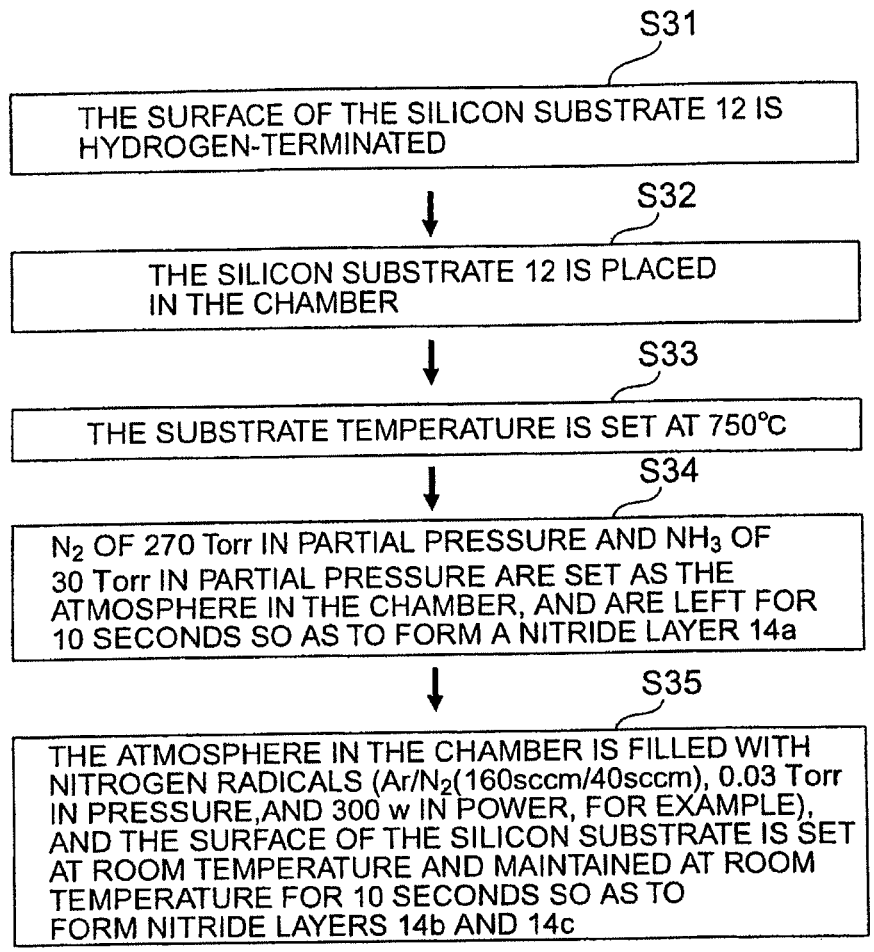
FIG. 24
FIG. 25A
FIG. 25B
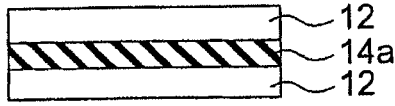
FIG. 25C
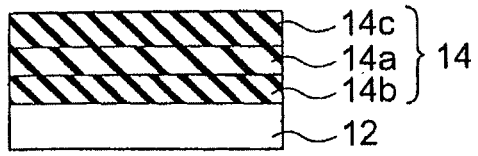

S59

$N_2$ OF 50 Torr IN PARTIAL PRESSURE IS SET AS THE ATMOSPHERE IN THE CHAMBER, AND THE SURFACE OF THE SILICON SUBSTRATE IS MAINTAINED AT 950°C FOR 300 SECONDS SO AS TO FORM A STABLE Si-O-N BOND IN THE SILICON OXYNITRIDE FILM

S59A

He OF 50 Torr IN PARTIAL PRESSURE IS SET AS THE ATMOSPHERE IN THE CHAMBER, AND THE SURFACE OF THE SILICON SUBSTRATE IS MAINTAINED AT 950°C FOR 300 SECONDS SO AS TO FORM A STABLE Si-O-N BOND IN THE SILICON OXYNITRIDE FILM

METHOD FOR MANUFACTURING A SEMICONDUCTOR DEVICE

This is a division of application Ser. No. 11/547,691, effectively filed Oct. 6, 2006, which is incorporated herein by reference, which is the U.S. National Stage of International Application No. PCT/JP2006/317385.

BACKGROUND OF THE INVENTION

1. Field of the Invention

The present invention relates to a method for manufacturing a semiconductor device.

2. Related Art

High-performance LSIs have been developed through miniaturization of transistors. In a currently available LSI, the thickness of the gate oxide film is almost as small as 1.5 nm. According to ITRS (International Technology Roadmap for Semiconductors), the thickness of each gate oxide film is expected to be approximately 0.7 nm by the year 2010, if the miniaturization progresses for even higher performances. In a conventional silicon oxide film with such a small thickness, a direct tunneling current that does not depend on voltage is dominant. Therefore, it is difficult to control the leakage current of the gate oxide film by adjusting voltage, and the performance as an insulator cannot be expected. To counter this problem, a material (a high-permittivity (high-k) material) with a higher relative permittivity than that of a silicon oxide film needs to be employed so as to obtain a greater physical film thickness.

Conventionally, SiON films have been used in place of silicon oxide films. A SiON film is formed by adding nitrogen to a silicon oxide film, so as to obtain a higher relative permittivity. A semiconductor device that has a SiON film on the surface side and a silicon oxide film between the SiON film and the substrate has been known (disclosed in JP-A 2003-264190 (KOKAI), for example). In such a semiconductor device, the SiON film is formed by nitriding the surface and the neighboring region of the silicon oxide film. Since the relative permittivity is increased by adding nitrogen to the silicon oxide film in the semiconductor device, the physical film thickness can be reduced, while the interface characteristics of the silicon oxide film are maintained. Accordingly, the leakage current can be reduced. In this manner, the structure of the silicon oxide film at the interface is maintained, and the nitrogen concentration in the SiON film is increased, so that the leakage current of the SiON film is reduced while the interface characteristics are maintained.

However, the high nitrogen concentration causes the problem of a significant shift in flat-band voltage. As the nitrogen concentration increases, the flat-band voltage shifts. Therefore, in terms of design, it is difficult to increase the nitrogen concentration.

As described above, so as to obtain a SiON film with a higher permittivity and a smaller film thickness, it is necessary to develop a process for allowing a higher nitrogen concentration. However, a SiON film characteristically exhibits a greater shift in flat-band voltage as the nitrogen concentration increases.

We found out that there are two causes for this phenomenon. One of the causes is the formation of defects such as interstitial silicon and dangling bonds due to the introduction of nitrogen. These defects remain in the form of fixed charges in the film, as the number of nitrogen atoms increases. As a result, a greater shift is caused in the flat-band voltage, as the nitrogen concentration becomes higher. The other cause is the boron atoms that are scattered from the gate electrode. The boron atoms are bonded to nitrogen atoms, resulting in silicon dangling bonds. With the a priori cause and the a posteriori cause, the flat-band voltage of the SiON film shifts as the nitrogen concentration becomes higher.

Therefore, so as to further increase the nitrogen concentration in the SiON film, formation of defects due to nitrogen introduction, and bonding between nitrogen and boron entering the SiON film should be prevented. The inventors have already developed a method for preventing the bonding between nitrogen and boron, and have filed a patent application (Japanese Patent Application No. 2005-30586) concerning the method. However, any method for preventing the generation of defects has not been developed yet.

SUMMARY OF THE INVENTION

The present invention is proposed in consideration of the aforementioned circumstances, and it is an object of the present invention to provide a method for manufacturing a semiconductor device by which generation of defects can be restrained at the time of insulating film formation.

A method for manufacturing a semiconductor device according to a first aspect of the present invention includes: placing a semiconductor substrate into an atmosphere, thereby forming a nitride film on a surface of the semiconductor substrate, the atmosphere containing a first nitriding gas nitriding the surface of the semiconductor substrate and a first diluent gas not actually reacting with the semiconductor substrate, the ratio of the sum of the partial pressure of the first diluent gas and the partial pressure of the first nitriding gas to the partial pressure of the first nitriding gas being 5 or higher, and the total pressure of the atmosphere being 40 Torr or lower.

A method for manufacturing a semiconductor device according to a second aspect of the present invention includes: placing a semiconductor substrate into a first atmosphere, thereby forming a nitride film on a surface of the semiconductor substrate, the first atmosphere containing a first nitriding gas nitriding the surface of the semiconductor substrate and a first diluent gas not actually reacting with the semiconductor substrate during production, the ratio of the sum of the partial pressure of the first diluent gas and the partial pressure of the first nitriding gas to the partial pressure of the first nitriding gas being 5 or higher, and the total pressure of the atmosphere being 40 Torr or lower; and placing the semiconductor substrate having the nitride film formed on the surface thereof into a second atmosphere containing a radical second nitriding gas, thereby forming a nitride layer between the semiconductor substrate and the nitride film.

A method for manufacturing a semiconductor device according to a third aspect of the present invention includes: placing a semiconductor substrate into a first atmosphere, thereby forming a nitride film on a surface of the semiconductor substrate, the first atmosphere containing a first nitriding gas nitriding the surface of the semiconductor substrate and a first diluent gas not actually reacting with the semiconductor substrate during production, the ratio of the sum of the partial pressure of the first diluent gas and the partial pressure of the first nitriding gas to the partial pressure of the first nitriding gas being 5 or higher, and the total pressure of the first atmosphere being 40 Torr or lower; and placing the semiconductor substrate having the nitride film formed on the surface thereof into a second atmosphere, thereby forming a first oxynitride layer between the semiconductor substrate and the nitride film, and a second oxynitride layer on a surface of the nitride film, the second atmosphere containing an oxidizing gas and a second dilution gas not actually reacting with the semiconductor substrate during production.

BRIEF DESCRIPTION OF THE DRAWINGS

FIG. 20 shows the refractive index of the silicon nitride films in a case where the dilution rate and the total pressure are varied;

FIG. 24 is a flowchart showing the manufacturing steps in a method for manufacturing a semiconductor device in accordance with a fourth embodiment of the present invention;

FIGS. 25A through 25C are cross-sectional views of a semiconductor device manufactured by the manufacturing method of the fourth embodiment;

DETAILED DESCRIPTION OF THE INVENTION

The following is a detailed description of embodiments of the present invention, with reference to the accompanying drawings.

The method for manufacturing a semiconductor device in accordance with each embodiment of the present invention is developed to restrain generation of defects due to nitrogen introduction.

The inventors discovered that, so as to minimize the generation of defects such as interstitial silicon and dangling bonds in a SiON film, a silicon nitride film having three-coordinate bonds that stabilize the binding between silicon (Si) and nitrogen (N) should be first formed during the silicon nitride film formation.

In view of this, a method of forming a silicon nitride film having three-coordinate bonds that stabilize the binding between silicon and nitrogen is described as a first embodiment.

First Embodiment

Figure 1:
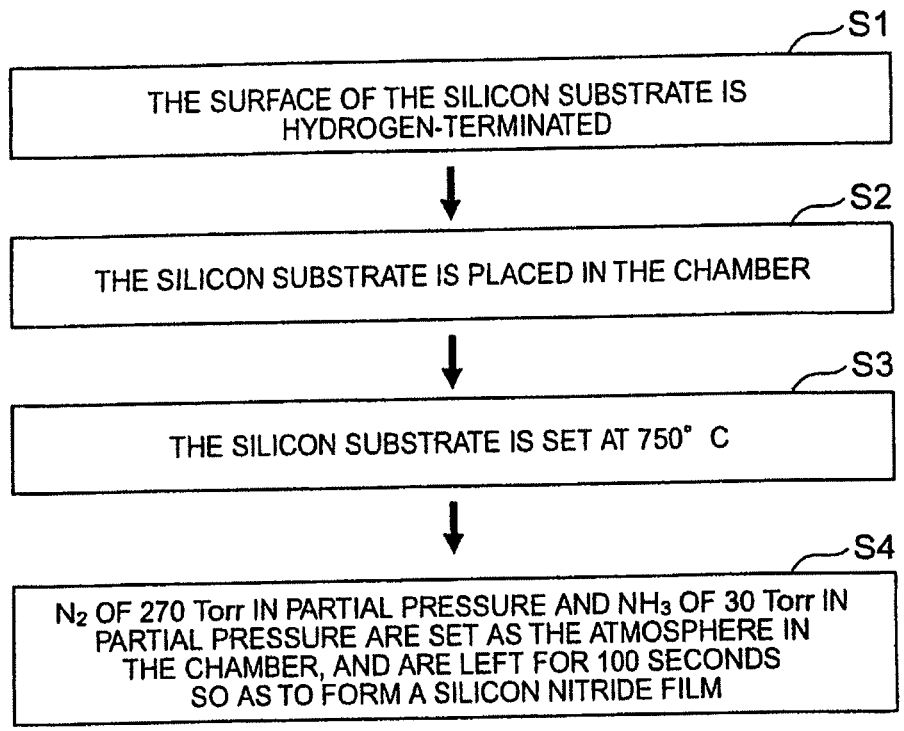
FIG. 1 is a flowchart illustrating the manufacturing steps in a method for manufacturing a semiconductor device in accordance with a first embodiment of the present invention.
Figure 2:
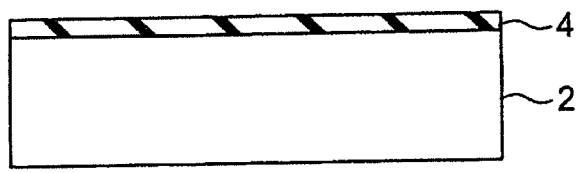
FIG. 2 is a cross-sectional view of a semiconductor device manufactured by the manufacturing method of the first embodiment.

Referring to FIGS. 1 and 2, a method for manufacturing a semiconductor device of the first embodiment of the present invention is described. FIG. 1 is a flowchart showing the manufacturing steps in accordance with the method for manufacturing the semiconductor device of this embodiment. FIG. 2 is a cross-sectional view of a semiconductor device manufactured in accordance with the manufacturing method of this embodiment.

In the method for manufacturing the semiconductor device, when a silicon nitride film is formed on a silicon substrate 2, nitriding gas $NH_3$ is mixed with $N_2$ gas as diluent gas, so as to form a silicon nitride film 4 containing less fixed charges than in a conventional silicon nitride film. The semiconductor device of each embodiment of the present invention is manufactured with the film forming device shown in FIG. 19.

Figure 19:
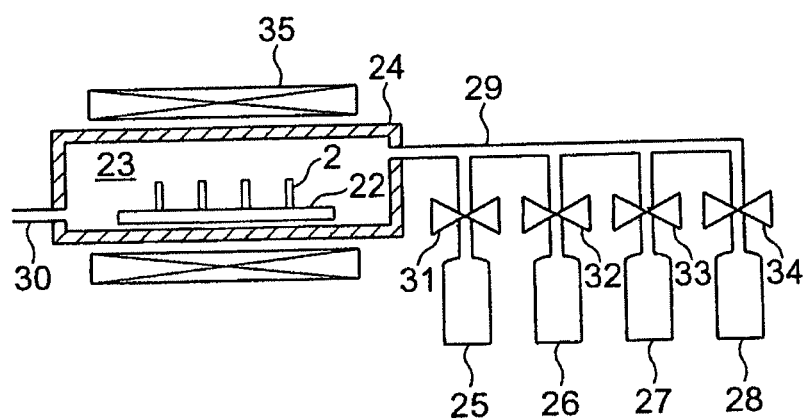
FIG. 19 illustrates a film forming device to be used in the manufacturing method of each embodiment of the present invention.

As shown in FIG. 19, the film forming device includes a chamber 24 having a heating furnace 23, with a movable susceptor 22 supporting semiconductor substrates 2. A $NH_3$ gas source 25, a nitrogen gas ($N_2$) source 26, a helium gas (He) source 27, and an oxygen gas ($O_2$) source 28 are connected as atmospheric gas sources to the chamber 24. The film forming device also has a gas inlet 29 for introducing $NH_3$ gas, nitrogen gas, helium gas, and oxygen gas from the gas sources, and a gas outlet 30 for discharging the gases. Valves 31, 32, 33, and 34 are attached to the $NH_3$ gas source 25, the nitrogen gas source 26, the helium gas source 27, and the oxygen gas source 28, respectively, so that the gas partial pressure can be controlled. A heater 35 is provided around the chamber 24, and is designed to be controlled by a temperature controlling device (not shown).

In accordance with the manufacturing method of this embodiment, the silicon substrates 2 are first subjected to dilution HF treatment, so that the surfaces of the silicon substrates 2 are hydrogen-terminated (step S1 of FIG. 1). The silicon substrates 2 are then placed in the chamber 24 of the film forming device shown in FIG. 19 (step S2 of FIG. 1).

Only gas (nitrogen gas, for example) that does not react with or etch the silicon during the manufacturing procedures is left in the atmosphere in the chamber, and the temperature of each silicon substrate 2 is increased to 750° C., so as to completely separate hydrogen from the silicon substrates 2 (step S3 of FIG. 1).

In the atmosphere of the chamber 24, $N_2$ gas of 270 Torr in partial pressure and $NH_3$ gas of 30 Torr in partial pressure, for example, are left, and the surface of each silicon substrate 2 is maintained at 750° C. for 200 seconds, so as to form the silicon nitride film 4 on each silicon substrate 2 (step S4 of FIG. 1, also shown in FIG. 2).

Next, the effect to be created by mixing the nitriding gas (NH$_3$) with the nitrogen gas (N$_2$) or diluting the NH$_3$ gas with the N$_2$ gas is described.

Figure 3:
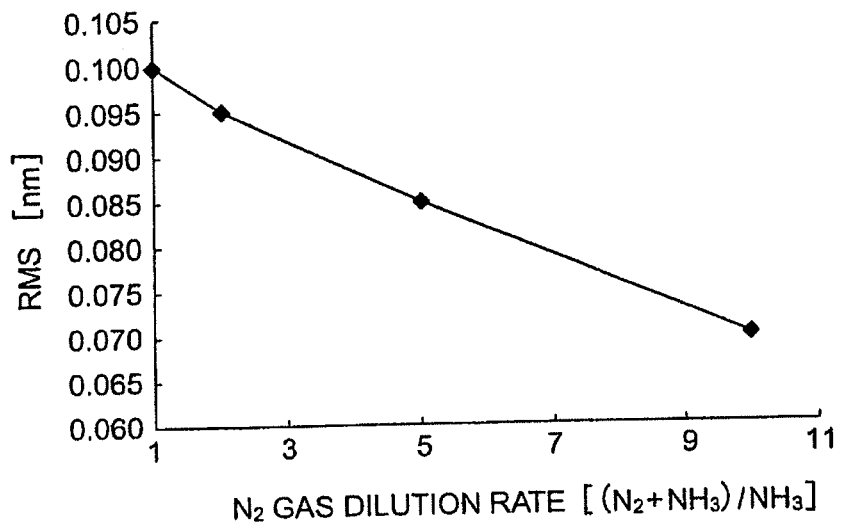
FIG. 3 shows a variation in surface roughness of a silicon nitride film formed by diluting nitriding gas with $N_2$ gas, in relation to the $N_2$ gas dilution rate.

FIG. 3 shows the variation in surface roughness caused by the dilution with the N$_2$ gas. In FIG. 3, the abscissa axis indicates the N$_2$ gas dilution rate (=[N$_2$+NH$_3$]/NH$_3$), which represents the ratio of the sum of the partial pressure of the N$_2$ gas and the partial pressure of the NH$_3$ gas to the partial pressure of the NH$_3$ gas (the ratio of the sum of the number of N$_2$ molecules and the number of NH$_3$ molecules to the number of NH$_3$ molecules). The ordinate axis indicates the root-mean-square (RMS) roughness of the surface of the silicon nitride film 4 formed on the silicon substrate 2. As can be seen from FIG. 3, the surface roughness is reduced by increasing the N$_2$ dilution rate (=[N$_2$+NH$_3$]/NH$_3$), and a smooth surface is formed accordingly.

Figure 4:
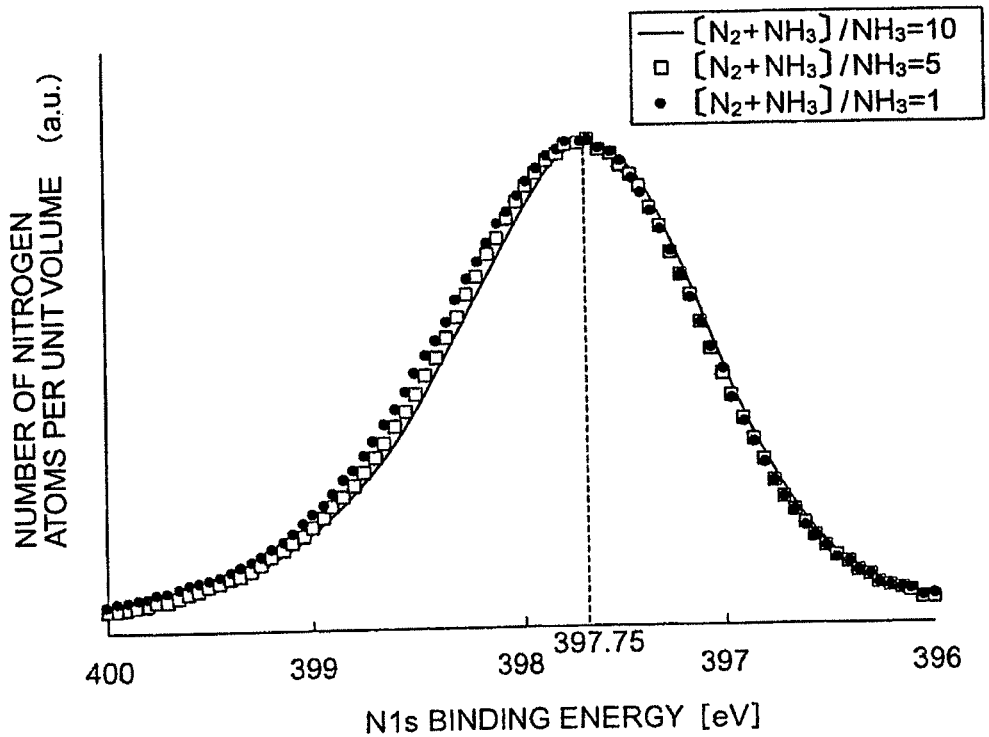
FIG. 4 shows the bonding state of the silicon nitride film formed by diluting nitriding gas with $N_2$ gas.

FIG. 4 shows the variations in bonding state of the nitrogen (N) in the silicon nitride film 4 diluted with the N$_2$ gas. The variations were measured by the x-ray photoelectron spectroscopy (XPS) method. In FIG. 4, the abscissa axis indicates the bond energy in the case where the silicon nitride film 4 contains nitrogen (N) in the is state, and the ordinate axis indicates the number of nitrogen atoms having the binding energy per unit volume. In the graph shown in FIG. 4, standardization is performed so that the number of nitrogen atoms with a binding energy of 397.75 eV, with which the number of nitrogen atoms becomes the largest, is constant, regardless of the N$_2$ dilution rate.

The number of nitrogen atoms having a binding energy lower than the binding energy of 397.75 eV, with which the number of nitrogen atoms becomes the largest, hardly varies even when the N$_2$ dilution rate is varied from 0 to 4 to 9. However, as the N$_2$ dilution rate increases from 0 to 4 to 9, the number of nitrogen atoms having a binding energy in the range of 398 eV to 399 eV decreases. In other words, as the N$_2$ dilution rate increases from 0 to 4 to 9, the energy of the nitrogen in the is state in the silicon nitride film becomes closer to 397.75 eV. Nitrogen having a binding energy in the range of 398 eV to 399 eV is in a two-coordinate bonding state or a metastable quasi-three-coordinate bonding state, while nitrogen having a binding energy of 397.75 eV is in a more stable three-coordinate bonding state.

As is apparent from the experiment results shown in FIG. 4, as the N$_2$ dilution rate increases, the amount of nitrogen in a more stable threefold bonding state increases, and a silicon nitride film in a more stable bonding state is formed.

Figure 5:
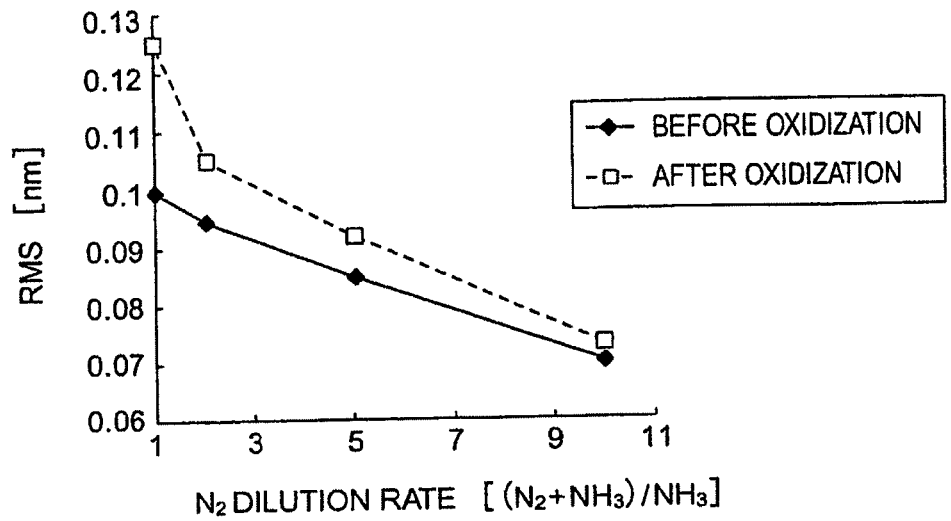
FIG. 5 shows variations in surface roughness before and after oxidization of the silicon nitride film formed by diluting nitriding gas with $N_2$ gas, in relation to the $N_2$ gas dilution rate.

The more stable bonding state can be seen in the variation in surface roughness due to oxidization. FIG. 5 shows the variation in surface roughness in a case where silicon nitride films formed at varied N$_2$ dilution rates are oxidized. As the N$_2$ dilution rate increases, the difference in surface roughness of a silicon nitride film diluted with diluent gas (N$_2$) becomes smaller between before and after oxidization. Even after oxidization, the surface roughness is almost the same as the surface roughness before the oxidization. By forming a silicon nitride film with diluent gas (N$_2$), deterioration of the surface roughness due to oxidization is restrained. This result shows that the oxidization occurs mostly at the interface between the silicon substrate and the silicon nitride film, instead on the surface of the silicon nitride film. Since oxidization hardly occurs on the surface of the silicon nitride film, the oxygen that has reached the silicon nitride film is not easily detached. In other words, the amounts of unstable interstitial silicon (Si) and dangling bonds that cause oxygen to detach from the silicon nitride film are small in the silicon nitride film and on the surface of the silicon nitride film, and the silicon nitride film has almost the same strength as a Si—O bond.

From the experiment results, the inventors discovered the following mechanism for silicon nitride film formation that is carried out by mixing nitriding gas with diluent gas:

(1) The diluent gas that has reached the surface of the silicon substrate collides with the silicon atoms drifting on the silicon surface, to deprive kinetic energy of the silicon atoms.

(2) The movement of the atoms on the surface of the silicon substrate then slows down.

(3) Since the second atomic layer of silicon on the substrate surface is the most stable attachment site for nitrogen atoms (see Proc, 27$^{th}$ ICPS, 2004, by K. Kato, Y. Nakasaki, D. Matsushita, and K. Muraoka, for example), the nitrogen atoms concentrate on the second atomic layer, and silicon atoms are discharged due to stress. The discharged silicon atoms drift on the surface, but hardly scatter on the surface of the silicon substrate and in the silicon substrate, because N$_2$ restricts the movement of the silicon atoms. Instead, the silicon atoms react with the falling nitriding gas NH$_3$, to restrain the generation of interstitial silicon.

If the movement of the surface silicon is large, the depth of the second atomic layer varies with locations. Because nitrogen forms stable bonds when aggregating, the variation in depth of the second atomic layer causes three-dimensional island growth. As the islands merge with one another, a continuous film is formed, and accordingly, excessive-silicon regions are formed on the island boundaries. Further, since the silicon is actively discharged and scattered, a number of interstitial silicon regions are formed in the silicon nitride film and on the island boundaries. The above phenomena result in deformation of the silicon nitride film, a shift in flat-band voltage due to the increase in interstitial silicon, and deterioration of electric characteristics.

Figure 6:
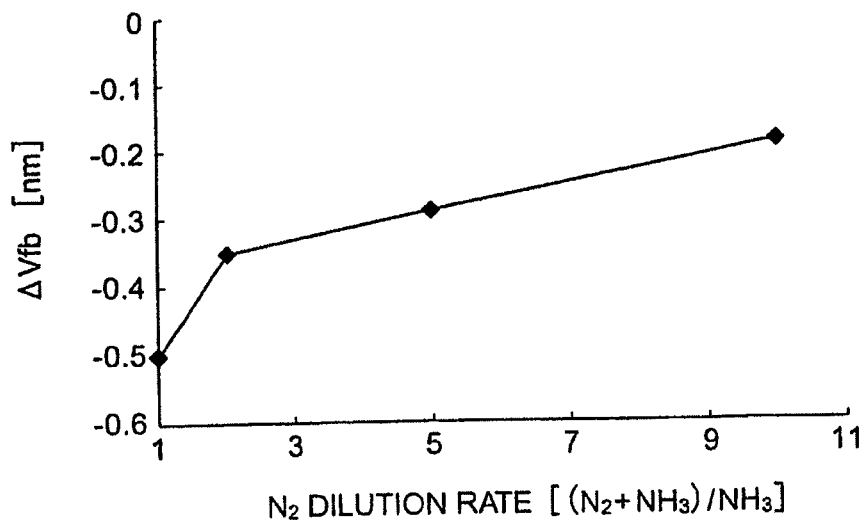
FIG. 6 shows a variation in the shift amount ($\Delta V_{fb}$) of the flat-band voltage of a p-channel MOS transistor having the silicon nitride film as a gate insulating film formed by diluting nitriding gas with $N_2$ gas, in relation to the $N_2$ gas dilution rate.

FIG. 6 shows the measurement results obtained where a p-channel MOS transistor having a silicon insulating film as a gate insulating film formed by diluting nitriding gas with N$_2$ gas is produced, and the variation in the shift amount ($\Delta V_{fb}$) of the flat-band voltage of the p-channel MOS transistor is measured while the N$_2$ dilution rate is varied. As N$_2$ dilution is carried out, the absolute value of the shift amount ($\Delta V_{fb}$) of the flat-band voltage becomes smaller, and the shift in the flat-band voltage is corrected. This is because generation of interstitial silicon is restrained by the N$_2$ dilution, and the number of fixed charges in the silicon nitride film is reduced.

Figure 7:
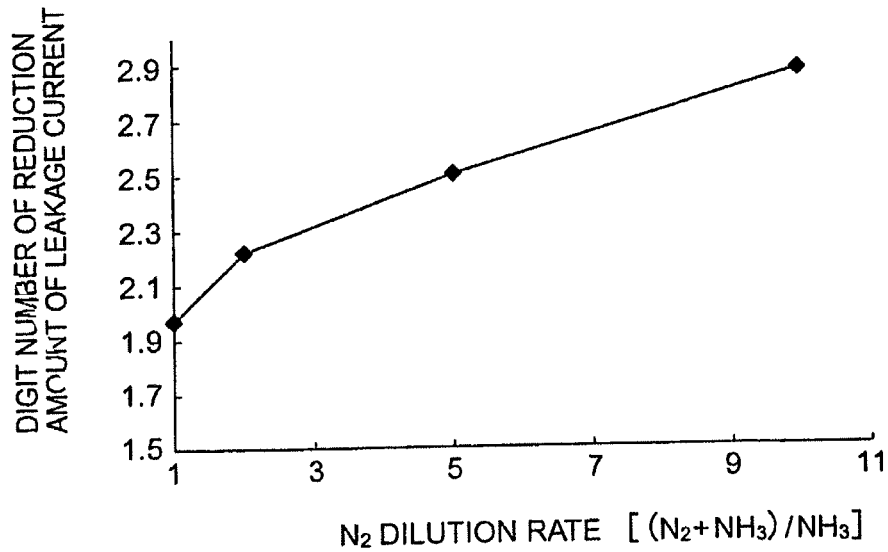
FIG. 7 shows the reduction characteristics of the leakage current of the silicon nitride film formed by diluting nitriding gas with $N_2$ gas, in relation to the $N_2$ gas dilution rate.

Referring now to FIG. 7, the variation in insulation properties of a silicon nitride film of 2 nm in physical film thickness formed through N$_2$ dilution is described. In FIG. 7, the abscissa axis indicates the N$_2$ dilution rate, and the ordinate axis indicates the digit number of the reduction amount of leakage current J$_g$ with respect to a silicon oxide film with the same SiO$_2$ equivalent thickness (hereinafter also referred to as EOT (Equivalent Oxide Thickness)). Accordingly, FIG. 7 shows the reduction amount of leakage current J$_g$ with respect to a silicon oxide film with the same EOT.

The leakage current of a silicon nitride film of 2 nm in physical film thickness that is formed only with nitriding gas NH$_3$ but is not diluted with diluent gas N$_2$ is approximately 2-digit lower than the leakage current of a silicon oxide film with the same EOT. However, as the N$_2$ dilution rate increases, the digit number of the reduction amount of the leakage current increases, and the insulation properties are further improved. This is because the generation of interstitial silicon is restrained by the N$_2$ dilution, the leakage current due to defects is reduced as the number of fixed charges in the silicon nitride film decreases, and the permittivity of the silicon nitride film is increased.

Figure 8:
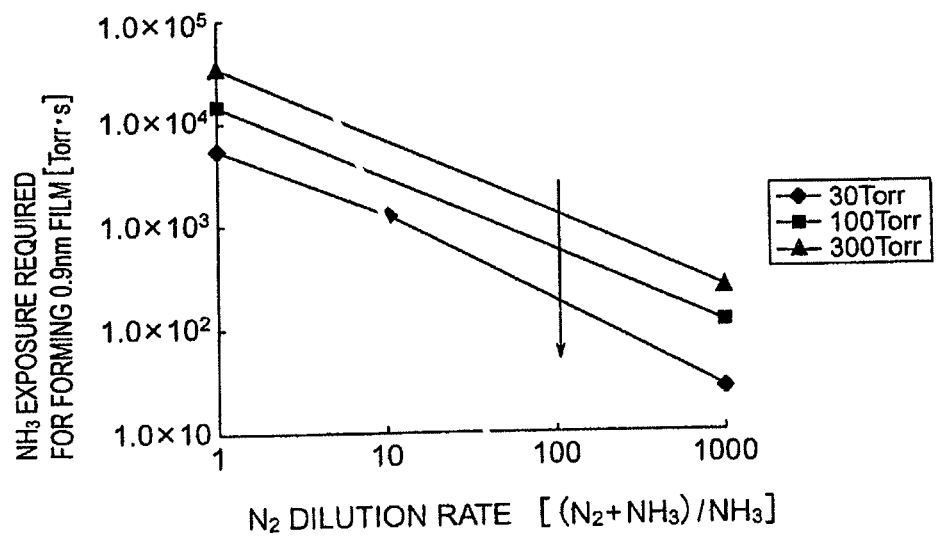
FIG. 8 shows variations in nitriding gas exposure of silicon nitride films of 0.9 nm in film thickness formed by diluting nitriding gas with $N_2$ gas, in relation to the $N_2$ gas dilution rate.

FIG. 8 shows the variations in $NH_3$ exposure amount required for forming a silicon nitride film of 0.9 nm in physical film thickness where the $N_2$ dilution rate is varied. In FIG. 8, the variations in $NH_3$ exposure amount are shown in relation to total chamber pressures of 30 Torr, 100 Torr, and 300 Torr. A variation in $NH_3$ exposure amount is the product of the partial pressure of the $NH_3$ gas and the $NH_3$ gas exposure time, and reflects the number of $NH_3$ molecules required for forming the silicon nitride film of 0.9 nm in physical film thickness. As can be seen from FIG. 8, when the total pressure in the chamber is lowered, the amount of $NH_3$ required for forming the silicon nitride film decreases. When the $N_2$ dilution rate is increased, the required amount of $NH_3$ further decreases. This implies that nitridation is performed with higher efficiency, when the total pressure is lowered and the dilution rate is increased.

Figure 9:
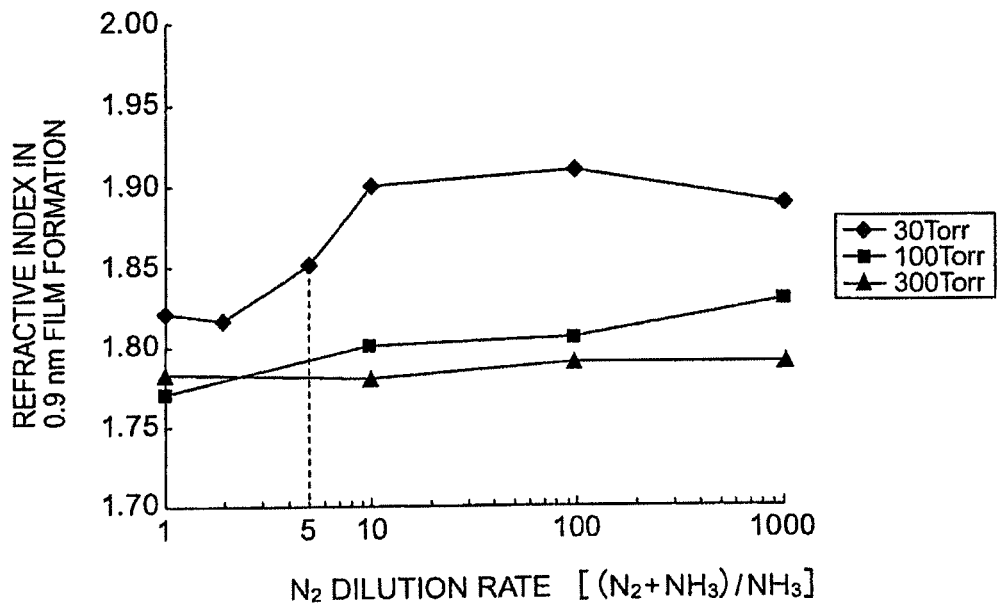
FIG. 9 shows variations in refractive index of silicon nitride films formed by diluting nitriding gas with $N_2$ gas, in relation to the $N_2$ gas dilution rate.
Figure 21:
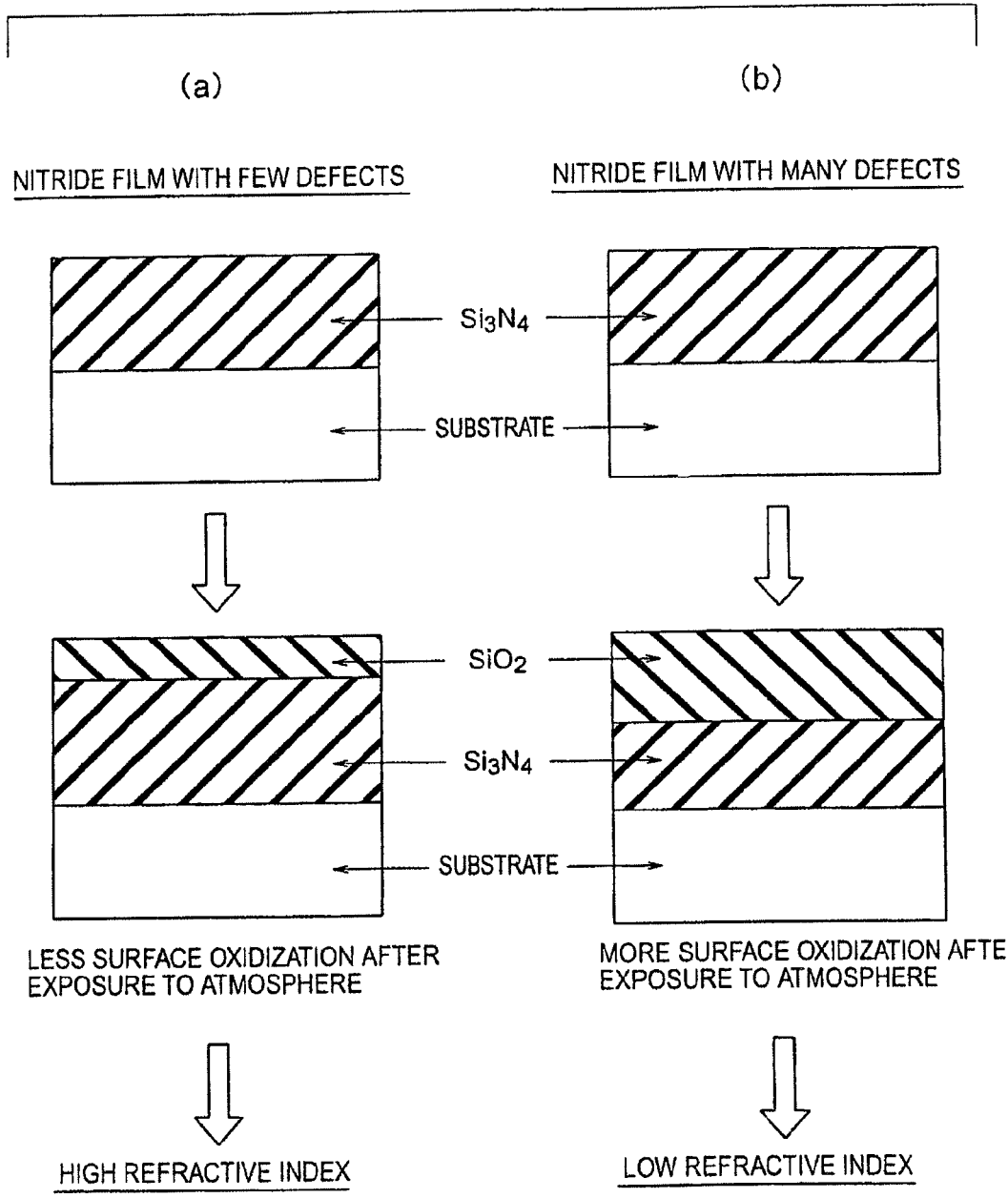
FIGS. 21(a) and 21(b) illustrate the fact that the refractive index of a silicon nitride film with high resistance to oxidization is high.

FIG. 20 shows the refractive index of the silicon nitride films of 0.9 nm in physical film thickness that are formed when the $N_2$ dilution rates are varied from 1, 2, 5, 10, 100, 1000, to 10000, and the total chamber pressures are varied from 3 Torr, 10 Torr, 30 Torr, 60 Torr, 100 Torr, 300 Torr, to 740 Torr. As an excerpt from the data shown in FIG. 20, FIG. 9 shows the variations in refractive index of silicon nitride films of 0.9 nm in physical film thickness that are formed at varied $N_2$ dilution rates. In FIG. 9, the variations in refractive index of silicon nitride films are shown in relation to total chamber pressures of 30 Torr, 100 Torr, and 300 Torr. Since the refractive indices are measured in the atmosphere, it is more difficult to oxidize a silicon nitride film with a higher refractive index. This implies that a silicon nitride film with a higher refractive index has a higher resistance to oxidization. This is because a nitride film with fewer defects has less surface oxidation than a nitride film with more defects when exposed to the atmosphere so as to measure the refractive index, and accordingly, the decrease in refractive index caused by an oxide film made of $SiO_2$ with a refractive index of 1.4 is small, as shown in FIGS. 21(a) and 21(b). With such characteristics being used, the resistance to oxidization is increased by lowering the total pressure in the chamber and increasing the $N_2$ dilution rate, as shown in FIG. 9. Especially, when the total pressure in the chamber is made 30 Torr or lower, and the $N_2$ dilution rate ($=[N_2+NH_3]/NH_3$) is made 5 or higher, the resistance to oxidization is significantly increased.

Figure 22:
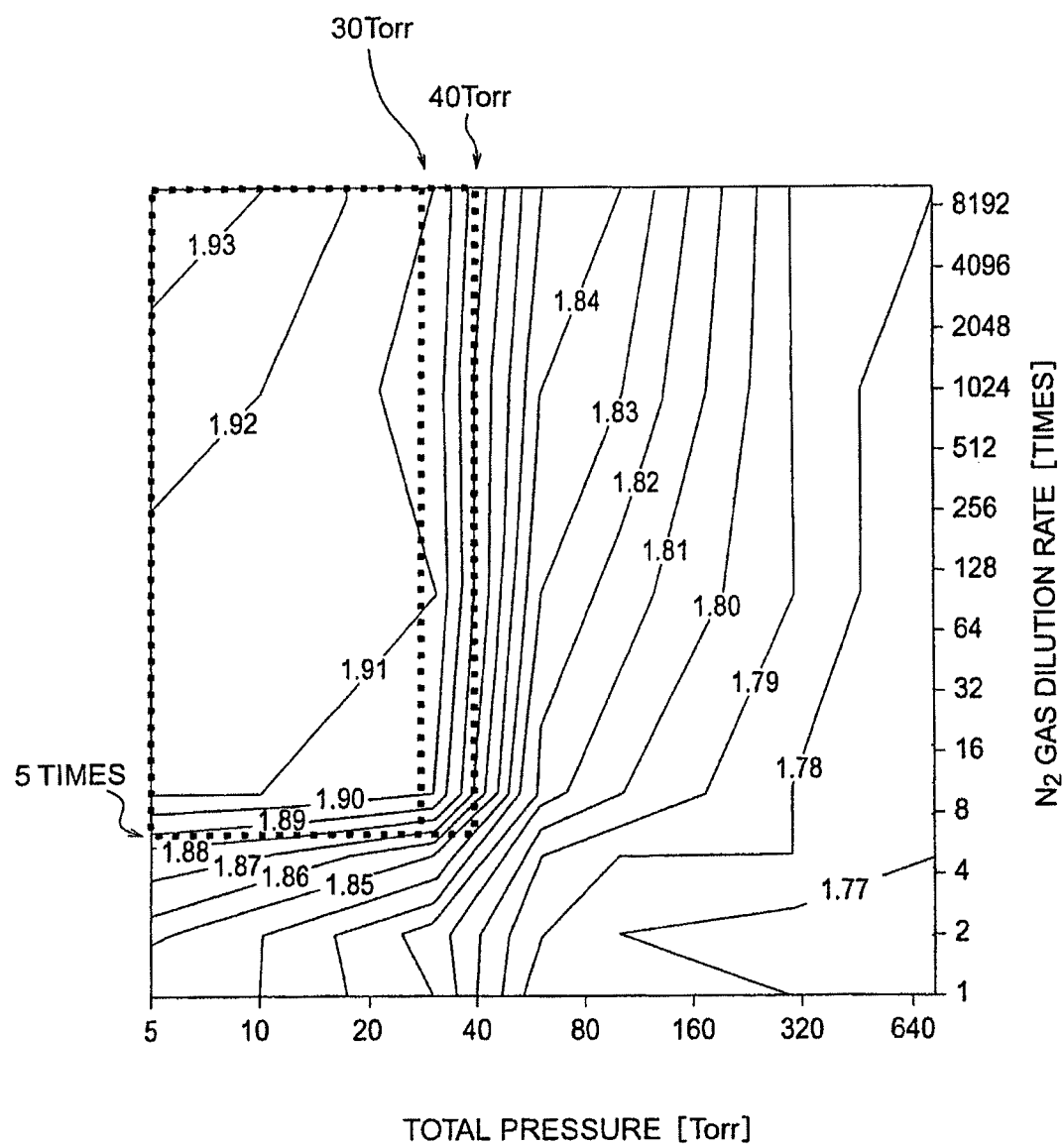
FIG. 22 shows variations indicated by contour lines in refractive index of silicon nitride films in a case where the total pressure in the chamber and the dilution rate are varied.

Next, the relationship between the total pressure in the chamber and the $N_2$ dilution rate is described. FIGS. 21(a) and 21(b) show the results of measurement carried out to determine the refractive indices of nitride films formed with varied total pressures in the chamber and varied $N_2$ dilution rates ($=[N_2+NH_3]/NH_3$). The refractive index dramatically increases in the region in which the dilution rate is 5 or higher and the total pressure is 40 Torr or lower (the region surrounded by a dotted line in FIG. 22). The results imply that it is more difficult to oxidize a nitride film when the dilution rate is higher and the total pressure is lower, or that a nitride film with high quality having high three-coordinate density and high resistance to oxidization can be formed. Accordingly, a high-quality nitride film can be formed by performing nitridation in the region in which the dilution rate is 5 or higher and the total pressure is 40 Torr or lower. A nitride film with even higher quality can be formed, with the total pressure being 30 Torr or lower and the dilution rate being 5 or higher.

In a case where thermal nitridation using $NH_3$ or the like as a nitriding gas is performed, the lowest allowable total pressure should preferably be 3 Torr or higher, and more preferably, 5 Torr or higher. The lowest allowable total pressure is equivalent to the pressure limitation of the device at the atmospheric temperature in the heating procedure employed in this embodiment. In a case where plasma nitridation using N* or $N_2$* or the like as a nitriding gas is performed, the lowest allowable total pressure should preferably be 20 mTorr or higher, and more preferably, 90 mTorr or higher. With such values being set for the lowest allowable total pressure, the radicals of the nitriding gas are corrected, and an excellent nitride film can be formed.

The highest possible dilution rate is 10000, which is the limitation of the ratio between the highest flow rate and the lowest flow rate that can be controlled by a mass flow controller of a currently available production device. To achieve high productivity, the highest possible dilution rate is preferably 100 or lower, and more preferably, 10 or lower.

The reasons why high-quality nitride films can be formed in the region in which the dilution rate is 5 or higher and the total pressure is 40 Torr or lower are as follows. As described above, since the second atomic layer of silicon on the substrate surface is the most stable attachment site for nitrogen atoms, the nitrogen atoms concentrate on the second atomic layer, and silicon atoms are discharged due to stress. The discharged silicon atoms drift on the surface, but hardly scatter on the surface of the silicon substrate and in the silicon substrate, because $N_2$ restricts the movement of the silicon atoms. Instead, the silicon atoms react with the falling nitriding gas $NH_3$, to restrain the generation of interstitial silicon. In a case where the total pressure is even lower, however, the amount of atoms and molecules that reach the surface and collide with Si decreases, and therefore, the discharged silicon atoms have fewer chances of being pushed and scattering in the substrate. More specifically, as the dilution rate is made 5 or higher, the effect of restricting the movement of the discharged Si (or lowering the possibility that the discharged silicon atoms turn into interstitial silicon) becomes more prominent. As the total pressure is reduced to 40 Torr or lower, the effect of reducing the chances of pushing the discharged Si (or lowering the possibility that the discharge silicon atoms turn into interstitial silicon) becomes even more prominent. Therefore, the dilution rate should preferably be 5 or higher, and a more preferred effect can be achieved by reducing the total pressure to 40 Torr or lower. In short, a lower pressure is essential in reducing the chances of pushing Si, and a higher dilution rate is essential in restricting the movement of Si.

As described above, in this embodiment, a high-quality silicon nitride film can be formed by not only reducing the total pressure of the chamber but also increasing the $N_2$ dilution rate. More specifically, a high-quality silicon nitride film can be formed by reducing the total pressure of the chamber to 40 Torr or lower and increasing the $N_2$ dilution rate ($=[N_2+NH_3]/NH_3$) to 5 or higher. A silicon nitride film with even higher quality can be formed by reducing the total pressure of the chamber to 30 Torr or lower and increasing the $N_2$ dilution rate ($=[N_2+NH_3]/NH_3$) to 5 or higher.

In the other embodiments described later, the total pressure of the chamber may also be set to 40 Torr or lower, or 30 Torr or lower, while the $N_2$ dilution rate ($=[N_2+NH_3]/NH_3$) is set to 5 or higher, so as to achieve the same effects as above.

As described above, in this embodiment, a high-quality silicon nitride film can be formed by lowering the total pressure in the chamber and increasing the $N_2$ dilution rate. A silicon nitride film with even higher quality can be obtained with a total inner pressure of 30 Torr or lower and a $N_2$ dilution rate ($=[N_2+NH_3]/NH_3$) of 5 or higher.

As described above, in this embodiment, a silicon nitride film with fewer defects can be formed using diluent gas as well as nitriding gas. Also, a silicon nitride film with a smaller EOT and excellent electric characteristics can be obtained in this embodiment.

Although $N_2$ gas is used as diluent gas in this embodiment, gas that does not react with or etch silicon during the manufacturing process may be used. For example, stable gas having a similar mass to silicon, such as Ar gas, may be used.

Also, $NH_3$ is used as nitriding gas in this embodiment. However, gas that can cause nitridation of silicon, such as radicals $N^*$ of nitrogen (N) or $N_2^*$, may be used.

Although the partial pressure of the nitriding gas is set at 30 Torr in this embodiment, it may not be 30 Torr. However, a lower partial pressure is preferred. Also, the partial pressure of the diluent gas is set at 270 Torr in this embodiment. However, the ratio of the partial pressure of the nitriding gas to the sum of the partial pressure of the diluent gas and the partial pressure of the nitriding gas should preferably be 5 or higher.

Also, the temperature of the atmosphere is 750° C. when a silicon nitride film in a three-coordinate bonding state is formed in this embodiment. However, it may range from 500° C. or more to 850° C. or less.

Second Embodiment

Figure 10:
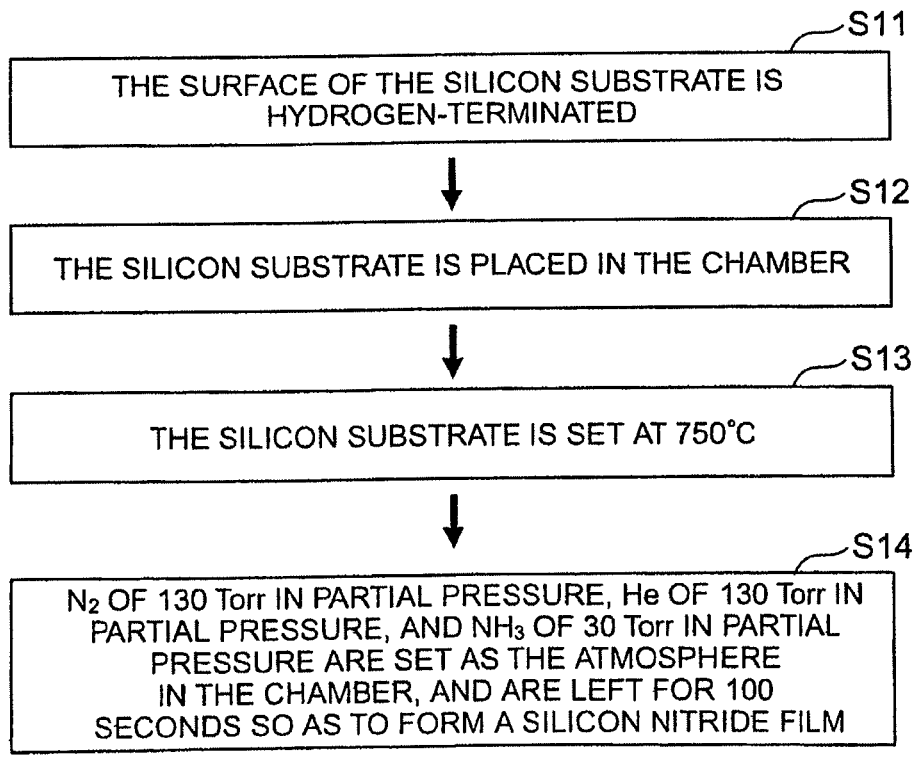
FIG. 10 is a flowchart showing the manufacturing steps in a method for manufacturing a semiconductor device in accordance with a second embodiment of the present invention.

Referring to FIG. 10, a method for manufacturing a semiconductor device in accordance with a second embodiment of the present invention is described. FIG. 10 is a flowchart showing the manufacturing steps in accordance with the semiconductor device manufacturing method of this embodiment. The semiconductor device manufacturing method of this embodiment differs from the manufacturing method of the first embodiment in that He gas is used as diluent gas as well as $N_2$ gas.

First, silicon substrates are subjected to dilution HF treatment, so that the surfaces of the silicon substrates are hydrogen-terminated (step S11 of FIG. 10). The silicon substrates are then placed in the chamber of the film forming device shown in FIG. 19 (step S12 of FIG. 10).

Only gas (a nitrogen gas, for example) that does not react with or etch the silicon during the manufacturing process is left in the atmosphere in the chamber, and the temperature of each silicon substrate is increased to 750° C., so as to completely separate hydrogen from the silicon substrates (step S13 of FIG. 10).

In the atmosphere of the chamber, a $N_2$ gas of 130 Torr in partial pressure, He gas of 130 Torr in partial pressure, and $NH_3$ gas of 30 Torr in partial pressure, for example, are left, and the surface of each silicon substrate 2 is maintained at 750° C. for 200 seconds (step S14 of FIG. 10). In this manner, the silicon nitride film 4 is formed on each silicon substrate 2 as shown in FIG. 2, as in the first embodiment.

Figure 11:
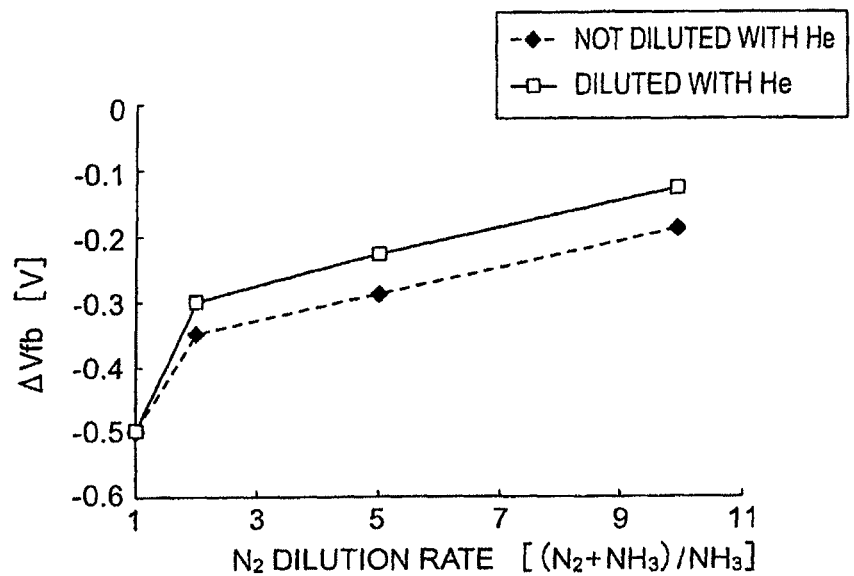
FIG. 11 shows variations in the shift amount ($\Delta V_{fb}$) of the flat-band voltage in relation to the $N_2$ gas dilution rate, one of the variations being observed in a case where He is mixed with $N_2$ as diluent gas for diluting nitriding gas, the other one being observed in a case where He is not mixed with $N_2$.

FIG. 11 shows the variations in the shift amount ($\Delta V_{fb}$) of the flat-band voltage in a case where nitriding gas $NH_3$ is diluted with $N_2$ gas and helium (He) gas at the time of silicon nitride film formation. In FIG. 11, the abscissa axis indicates the $N_2$ dilution rate (=$[N_2+NH_3]/NH_3$), which is the ratio of the sum of the partial pressure of the $N_2$ gas and the partial pressure of the $NH_3$ gas to the partial pressure of the $NH_3$ gas, and the ordinate axis indicates the shift amount ($\Delta V_{fb}$) of the flat-band voltage. More specifically, FIG. 11 shows the variation in the shift amount ($\Delta V_{fb}$) of the flat-band voltage in a case where the partial pressure of the $N_2$ gas is varied while the partial pressure of the He gas is maintained at 130 Torr and the partial pressure of the $NH_3$ gas is maintained at 30 Torr, and the variation in the shift amount ($\Delta V_{fb}$) of the flat-band voltage in a case where the partial pressure of the $N_2$ gas is varied without the addition of a helium (He) gas. As can be seen from FIG. 11, compared with the case where dilution is performed only with $N_2$ gas, the shift amount ($\Delta V_{fb}$) of the flat-band voltage is made smaller through the dilution with $N_2$ gas and He gas. This is because the interface between the silicon substrate and the silicon nitride film is deprived of atomic vibration energy by virtue of the quenching effect of the helium (He). Accordingly, thermal cutting of the Si—N bonds and the Si—Si bonds in the vicinity of the interface between the silicon nitride film and the silicon substrate is prevented, and the generation of dangling bonds is restrained.

Figure 12:
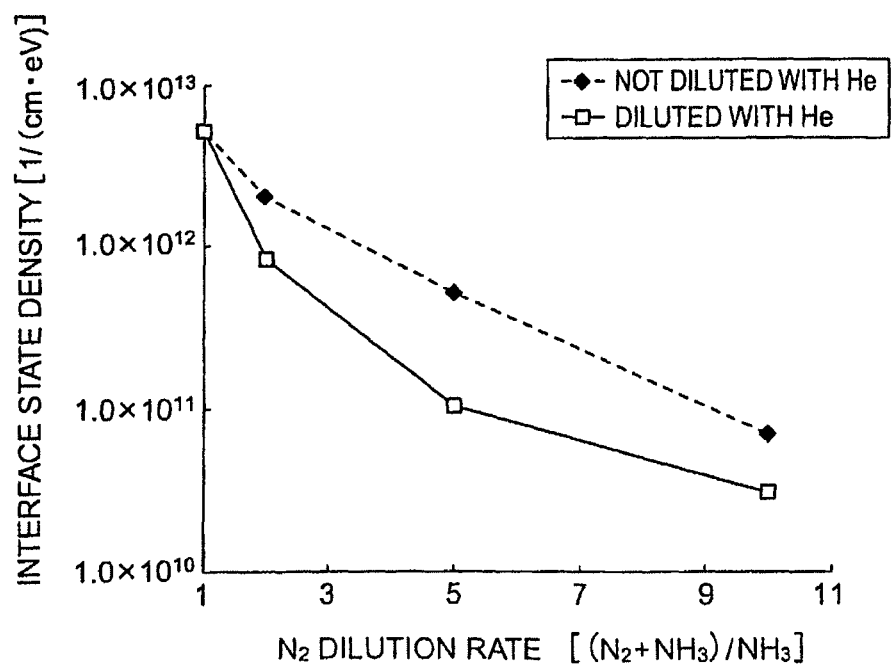
FIG. 12 shows variations in interface state density in relation to the $N_2$ gas dilution rate, one of the variations being observed in a case where He is mixed with $N_2$ as diluent gas for diluting nitriding gas, the other one being observed in a case where He is not mixed with $N_2$.

FIG. 12 shows the variations in interface state density in a case where nitriding gas is diluted with $N_2$ gas and He gas at the time of silicon nitride film formation. In FIG. 12, the abscissa axis indicates the $N_2$ dilution rate (=$[N_2+NH_3]/NH_3$), which is the ratio of the sum of the partial pressure of the $N_2$ gas and the partial pressure of the $NH_3$ gas to the partial pressure of the $NH_3$ gas, and the ordinate axis indicates the interface state density between the silicon substrate and the silicon nitride film. More specifically, FIG. 12 shows the variation in interface state density in a case where the partial pressure of the $N_2$ gas is varied while the partial pressure of the He gas is maintained at 130 Torr and the partial pressure of the $NH_3$ gas is maintained at 30 Torr, and the variation in interface state density in a case where the partial pressure of the $N_2$ gas is varied without the addition of helium (He) gas. As can be seen from FIG. 12, compared with the case where dilution is performed only with $N_2$ gas, the interface state density is made lower through the dilution with $N_2$ gas and He gas. This is because the Si—N bonds and the Si—Si bonds in the vicinity of the interface between the silicon nitride film and the silicon substrate are deprived of thermal energy by virtue of He, as described above. Accordingly, thermal cutting of the bonds is prevented, and the generation of dangling bonds is restrained.

Figure 13:
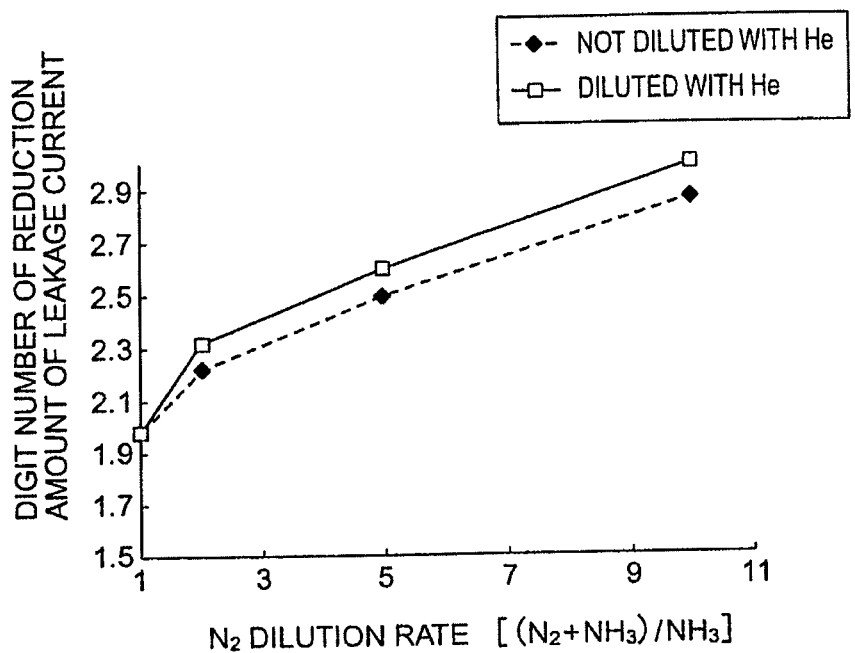
FIG. 13 shows variations in reduction characteristics of leakage current in relation to the $N_2$ gas dilution rate, one of the variations being observed in a case where He is mixed with $N_2$ as diluent gas for diluting nitriding gas, the other one being observed in a case where He is not mixed with $N_2$.

FIG. 13 shows the variations in insulation properties in a case where dilution is performed with $N_2$ gas and He gas at the time of silicon nitride film formation. In FIG. 13, the abscissa axis indicates the $N_2$ dilution rate (=$[N_2+NH_3]/NH_3$), which is the ratio of the sum of the partial pressure of the $N_2$ gas and the partial pressure of the $NH_3$ gas to the partial pressure of the $NH_3$ gas, and the ordinate axis indicates the digit number of the reduction amount of leakage current $J_g$ with respect to a silicon oxide film with the same EOT. Accordingly, FIG. 13 shows the reduction amount of leakage current $J_g$ with respect to a silicon oxide film with the same EOT in a case where the partial pressure of the $N_2$ gas is varied while the partial pressure of the He gas is maintained at 130 Torr and the partial pressure of the $NH_3$ gas is maintained at 30 Torr, and the reduction amount in a case where the partial pressure of the $N_2$ gas is varied without the addition of helium (He) gas. As can be seen from FIG. 13, compared with the case of a silicon nitride film of 2 nm in physical film thickness diluted only with $N_2$ gas, the digit number of the reduction amount of leakage current becomes larger through the dilution with $N_2$ gas and He gas, and the insulation properties are improved. This is because the generation of interstitial silicon and dangling bonds at the interface is restrained through the dilution with $N_2$ gas and He gas, and the amount of leakage current is reduced.

Figure 14:
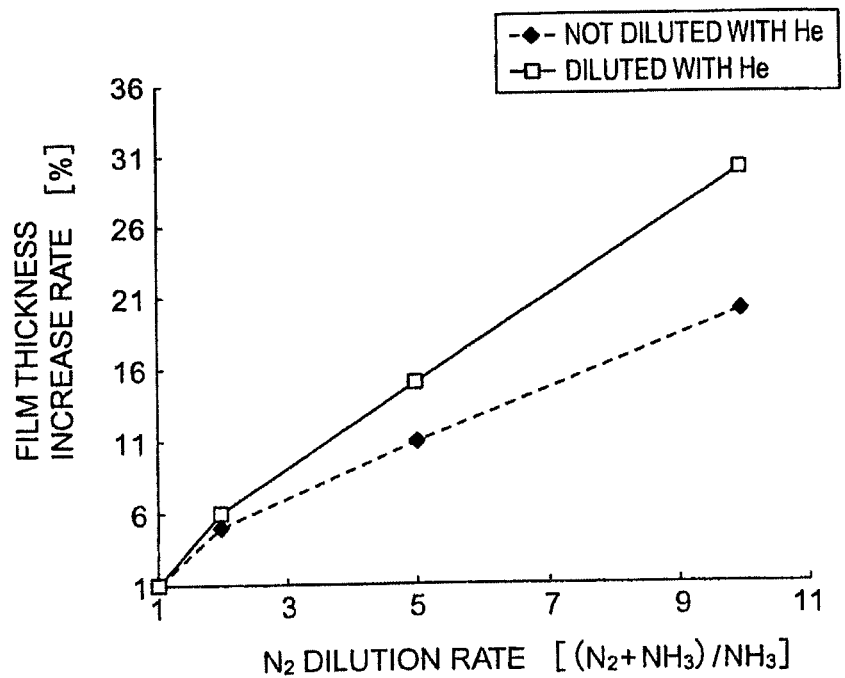
FIG. 14 shows increase rates of nitride film thickness in relation to the $N_2$ gas dilution rate, one of the variations being observed in a case where He is mixed with $N_2$ as diluent gas for diluting nitriding gas, the other one being observed in a case where He is not mixed with $N_2$.

FIG. 14 shows the relationship between the nitriding time and the nitride film thickness in a case where dilution is performed with $N_2$ gas and He gas at the time of silicon nitride film formation. In FIG. 14, the abscissa axis indicates the $N_2$ dilution rate (=$[N_2+NH_3]/NH_3$), which is the ratio of the sum of the partial pressure of the $N_2$ gas and the partial pressure of the $NH_3$ gas to the partial pressure of the $NH_3$ gas, and the ordinate axis indicates the increase rate of the nitride film thickness. As can be seen from FIG. 14, the nitridation amount per unit time is increased through the dilution with $N_2$ gas and He gas. This is because the $N_2$ gas and the He gas as diluent gases facilitate the scattering of the $NH_3$ gas as nitriding gas in the nitride film. Accordingly, the nitriding time can be reduced. Thus, the quality of the silicon nitride film can be increased, and the productivity of the silicon nitride film can be improved.

As described above, in this embodiment, a silicon nitride film with fewer defects can be formed using $N_2$ gas and He gas as diluent gases as well as nitriding gas. Also, a silicon nitride film with a smaller EOT and excellent electric characteristics can be obtained in this embodiment.

Although $N_2$ gas and He gas are used as diluent gases in this embodiment, a mixed gas of He gas and stable gas having a similar mass to that of silicon, such as Ar gas, may be used. As diluent gas, gas that does not react with or etch silicon during the manufacturing process can be employed. Using gas having similar natural vibration energy to the atomic vibration energy of the interface between the silicon substrate and the silicon nitride film, the interface between the silicon substrate and the silicon nitride film can be deprived of the atomic vibration energy during the film formation. Thus, a silicon nitride film with higher quality can be obtained.

Also, $NH_3$ gas is used as nitriding gas in this embodiment. However, gas that can cause nitridation of silicon, such as radicals N* of nitrogen (N) or $N_2$*, may be used.

Although the partial pressure of the nitriding gas is set at 30 Torr in this embodiment, it may not be 30 Torr. However, a lower partial pressure is preferred. Also, the partial pressure of each diluent gas is set at 260 Torr in this embodiment. However, the ratio of the partial pressure of the nitriding gas to the sum of the partial pressure of the diluent gases and the partial pressure of the nitriding gas should preferably be 5 or higher, as in the first embodiment.

Also, the temperature of the atmosphere is 750° C. when a silicon nitride film in a three-coordinate bonding state is formed in this embodiment. However, it may range from 500° C. or more to 850° C. or less.

Third Embodiment

Figure 15:
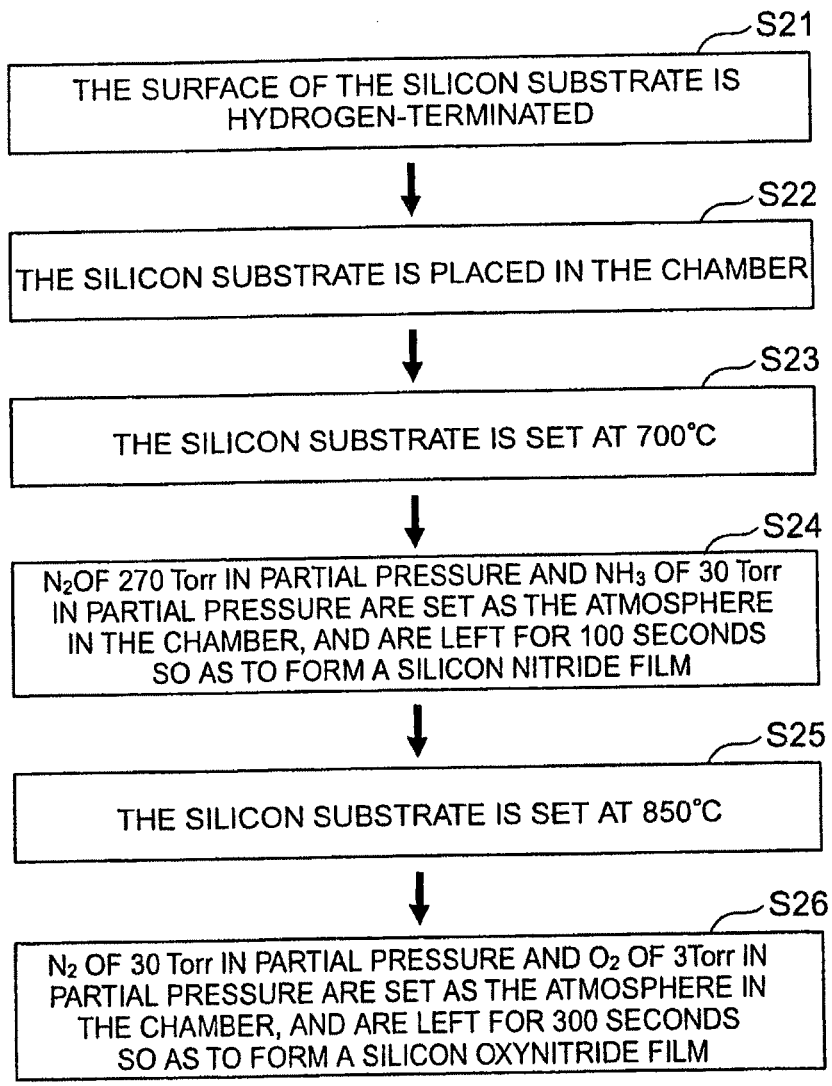
FIG. 15 is a flowchart showing the manufacturing steps in a method for manufacturing a semiconductor device in accordance with a third embodiment of the present invention.
Figure 16A:
FIGS. 16A through 16C are cross-sectional views of a semiconductor device manufactured by the manufacturing method of the third embodiment.
Figure 16B:
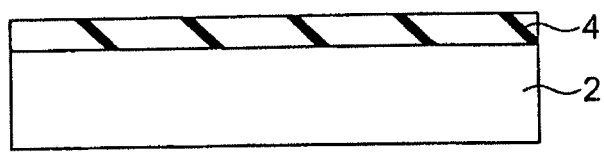
Figure 16C:
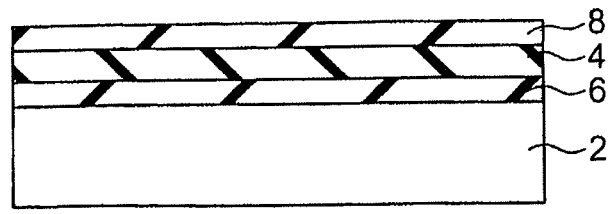

Referring now to FIG. 15 and FIGS. 16A through 16C, a method for manufacturing a semiconductor device in accordance with a third embodiment of the present invention is described. FIG. 15 is a flowchart showing the manufacturing steps in accordance with the semiconductor device manufacturing method of this embodiment. FIGS. 16A through 16C are cross-sectional views illustrating the manufacturing procedures in accordance with the semiconductor device manufacturing method of this embodiment. The semiconductor device manufacturing method of this embodiment differs from the manufacturing method of each foregoing embodiment in that nitriding gas is mixed with diluent gas to form a nitride film on the silicon substrate, and oxidization is then performed to form a silicon oxynitride layer containing oxygen at the interface between the silicon nitride film and the silicon substrate.

First, silicon substrates 2 are subjected to dilution HF treatment, so that the surface of each silicon substrate 2 is hydrogen-terminated (step S21 of FIG. 15). The silicon substrates 2 are then placed in the chamber of the film forming device shown in FIG. 19 (step S22 of FIG. 15).

Only a gas (a nitrogen gas, for example) that does not react with or etch silicon during the manufacturing process is left in the atmosphere in the chamber, and the temperature of each silicon substrate is increased to 700° C., so as to completely separate hydrogen from the silicon substrates (step S23 of FIG. 15, and FIG. 16A).

In the atmosphere of the chamber, $N_2$ gas of 270 Torr in partial pressure and $NH_3$ gas of 30 Torr in partial pressure, for example, are left, and the surface of each silicon substrate is maintained at 700° C. for 100 seconds (step S24 of FIG. 15). In this manner, the silicon nitride film 4 is formed on each silicon substrate 2, as shown in FIG. 16B.

The temperature of the silicon substrate is then increased to and maintained at 850° C. (step S25 of FIG. 15).

While the temperature of the silicon substrate is maintained at 850° C., $N_2$ gas of 30 Torr in partial pressure and $O_2$ gas of 3 Torr in partial pressure, for example, are left in the atmosphere of the chamber for 300 seconds (step S26 of FIG. 15). In this manner, a silicon oxynitride layer 6 containing oxygen is formed between the silicon substrate 2 and the silicon nitride film 4, and a silicon oxynitride layer 8 containing oxygen is formed on the surface of the silicon nitride film 4, as shown in FIG. 16C.

Figure 17:
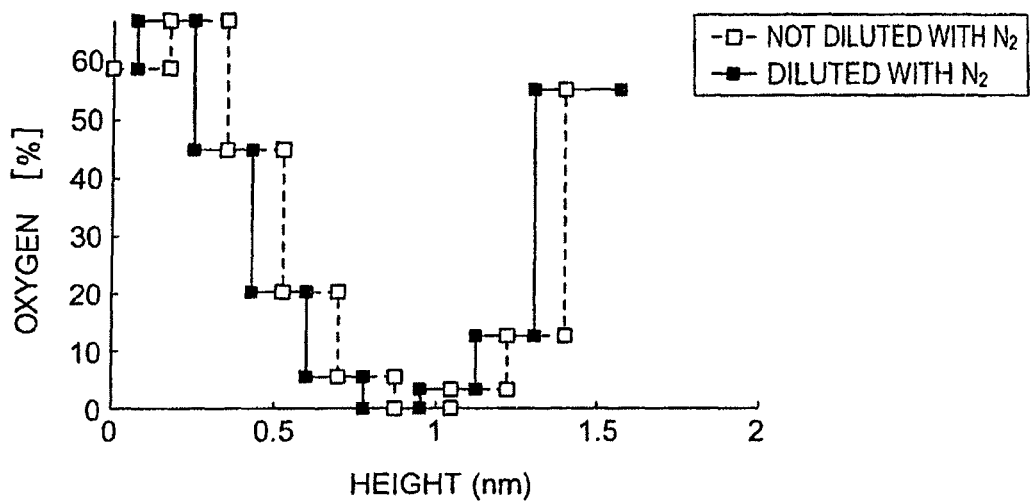
FIG. 17 shows oxygen distributions in silicon oxynitride films, one of the silicon oxynitride films being produced by diluting oxidizing gas with $N_2$ gas, the other one being produced without $N_2$ dilution.

Next, the effect of the dilution of nitriding gas with $N_2$ is described. FIG. 17 shows the oxygen distributions in the silicon oxynitride film that is formed on the silicon substrate 2 and consists of the silicon oxynitride layer 6, the silicon nitride film 4, and the silicon oxynitride layer 8. The oxygen distributions shown in FIG. 17 are observed in a case where nitriding gas is diluted with $N_2$ (where the atmosphere in the chamber contains $N_2$ gas of 270 Torr in partial pressure and $NH_3$ gas of 30 Torr in partial pressure) and in a case where nitriding gas is not diluted with $N_2$ (where the atmosphere in the chamber is $NH_3$ gas of 300 Torr in total pressure). In FIG. 17, the abscissa axis indicates the height in the film thickness direction from the interface between the silicon substrate 2 and the silicon oxynitride layer 6 to the surface of the silicon nitride film 4, and the ordinate axis indicates the oxygen concentration. As can be seen from FIG. 17, through the $N_2$ dilution, the region of oxygen distribution becomes larger and the oxygen concentration becomes higher on the substrate interface side. On the surface side of the silicon oxynitride film, on the other hand, the region of oxygen distribution becomes smaller, and the oxygen concentration becomes lower. In short, compared with the case where dilution is not performed, the oxygen distribution in the silicon oxynitride film formed shifts from the surface side of the silicon oxynitride film toward the interface between the silicon oxynitride film and the silicon substrate. This is because oxygen cannot easily be detached and absorbed from the surface of the silicon nitride film, as the $N_2$ gas as diluent gas deprives the atoms on the silicon nitride film surface of heat. Meanwhile, the inside of the silicon nitride film is heated, and oxygen is detached to cause further reaction. Accordingly, oxygen is distributed toward the interface, and nitrogen is distributed toward the surface. Thus, a silicon oxynitride film with ideal distributions can be formed.

The reason that the interface characteristics are improved by forming an interfacial oxide layer is considered as follows, based on the evaluations of defects in the substrate interface measured by ESR (Electron Spin Resonance) method.

Figure 23:
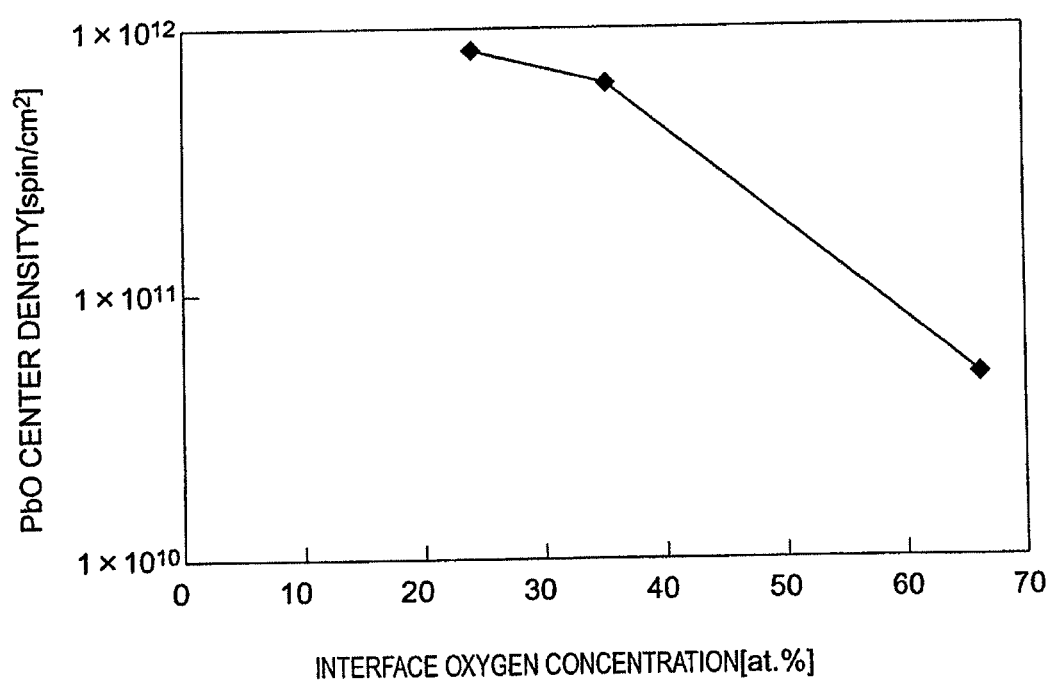
FIG. 23 illustrates the fact that an interfacial oxide layer improves the interface characteristics.

FIG. 23 shows variations in the density of the Pb0 center (the dangling bond having one Si bond cut off) at the interface (equivalent to the interface state) in relation to the oxygen concentration at the interface in the case where the interface with the nitride film is oxidized. The Pb0 center of the interface is measured by ESR. As can be seen from FIG. 23, as the interface oxidization amount increases, the density of the Pb0 center that is the Si dangling bond becomes lower. This implies that the defects existing at the interface between the nitride film and Si are oxidized and corrected, as the interface is oxidized. This is the reason that the interface characteristics are improved by oxidizing the interface between the nitride film and Si. Here, the interface characteristics indicate the force of transporting electrons and holes that are the carriers from the source to the drain, which is, the driving force. If there are defects at the interface, the defects store charges and cause the scattering of electrons and holes. As a result, efficient carrier transportation is hindered, and the driving force decreases. For the above described reason, improvement of the interface characteristics is essential to larger driving force. It is preferable that the interfacial oxide layer between the nitride film and Si does not include nitrogen.

Figure 18:
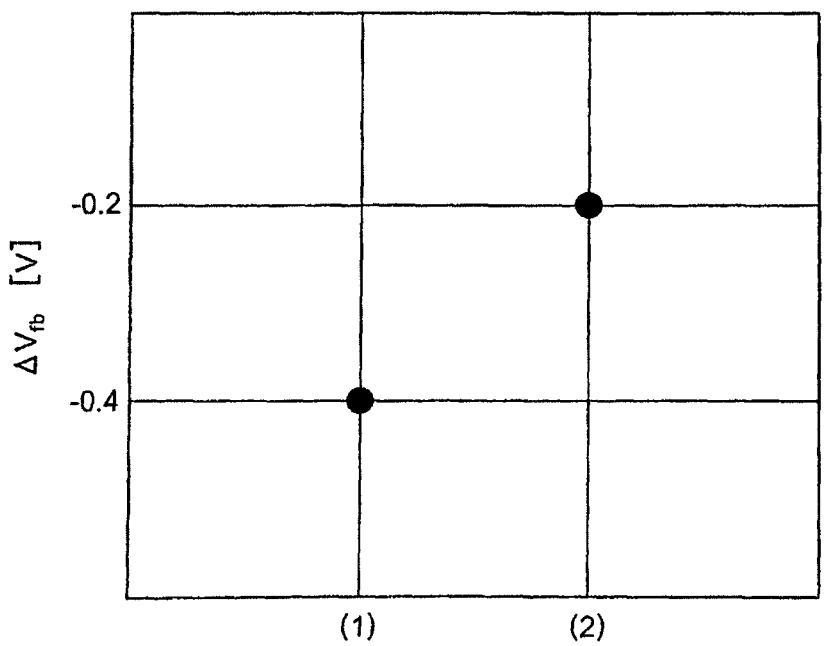
FIG. 18 shows the shift amounts ($\Delta V_{fb}$) of the flat-band voltages of p-channel MOS transistors, one of the p-channel MOS transistors having a silicon nitride film as a gate insulating film produced by diluting oxidizing gas with $N_2$ gas, the other one having a silicon nitride film as a gate insulating film produced without $N_2$ dilution.

FIG. 18 shows the comparison between the shift amounts ($\Delta V_{fb}$) of the flat-band voltages of p-channel MOS transistors. One of the p-channel MOS transistors has a gate insulating film that is a silicon oxynitride film of 2 nm in physical film thickness formed only with oxidizing gas $O_2$ without $N_2$ dilution (denoted by (1) in FIG. 18). The other one of the p-channel MOS transistors has a gate insulating film that is a silicon oxynitride film of 2 nm in physical film thickness formed by diluting oxidizing gas $O_2$ with diluent gas $N_2$ as in this embodiment (denoted by (2) in FIG. 18). As can be seen from the comparison between (1) and (2), the absolute value of the shift amount ($\Delta V_{fb}$) of the flat-band voltage becomes smaller through the $N_2$ dilution, and the shift in the flat-band voltage is reduced. These effects were achieved because a silicon nitride film with fewer defects (such as interstitial silicon and dangling bonds) is formed before the silicon oxynitride film is formed, and because the oxidization of the surface is restrained and an ideal nitrogen distribution is achieved by diluting the oxidizing gas $O_2$ with the diluent gas $N_2$, with nitrogen existing closer to the surface, i.e., charges being distributed near the surface.

As described above, in this embodiment, a silicon oxynitride film having an interface preferentially oxidized can be formed using diluent gas $N_2$ at the same time as using oxidizing gas $O_2$. Accordingly, a silicon oxynitride film with a smaller EOT and excellent electric characteristics can be obtained in this embodiment.

Although $N_2$ gas is used as diluent gas in this embodiment, gas that does not react with or etch silicon during the manufacturing process or stable gas having a similar mass to that of silicon, such as Ar gas, may be used as diluent gas.

Also, $NH_3$ gas is used as nitriding gas in this embodiment. However, gas that can cause nitridation of silicon, such as radicals N* of nitrogen (N) or $N_2$*, may be used.

Although the partial pressure of the nitriding gas is set at 30 Torr in this embodiment, it may not be 30 Torr. However, a lower partial pressure is preferred. Also, the partial pressure of the diluent gas is set at 270 Torr in this embodiment. However, the ratio of the partial pressure of the nitriding gas to the sum of the partial pressure of the diluent gas and the partial pressure of the nitriding gas should preferably be 5 or higher, as in the first embodiment.

Also, the temperature of the atmosphere is 700° C. when a silicon nitride film is formed in this embodiment. However, it may range from 500° C. or more to 850° C. or less.

Also, $O_2$ is used as an oxidizing gas in this embodiment. However, gas that can cause oxidization of silicon, such as $NO_x$, $N_2O$, or oxygen radicals O*, may be used.

Although $N_2$ gas is used as diluent gas at the time of oxidization in this embodiment, gas that does not actually react with or etch silicon during the manufacturing process may be employed. Also, the partial pressure of the diluent gas is set at 30 Torr, it may not be 30 Torr.

Also, the temperature of the atmosphere is 850° C. when a silicon oxynitride film is formed in this embodiment. However, it may range from 800° C. or more to 950° C. or less.

In accordance with each of the above described embodiments of the present invention, formation of defects can be restrained at the time of insulating film formation, and an insulating film having a smaller EOT and excellent electric characteristics can be obtained.

An insulating film that is manufactured by any of the manufacturing methods of the first through third embodiments has a high nitrogen concentration, a high permittivity, a smaller EOT and a smaller shift in flat-band voltage $V_{fb}$. Such an insulating film can be used not only as a buffer film of an insulating film with high permittivity but also as a gate insulating film.

Fourth Embodiment

Referring now to FIGS. 24 through 25C, a method for manufacturing a semiconductor device in accordance with a fourth embodiment of the present invention is described.

First, silicon substrates 12 are subjected to dilution HF treatment, so that the surface of each silicon substrate 12 is hydrogen-terminated (step S31 of FIG. 24, FIG. 25A). The silicon substrates 12 are then placed in the chamber of a film forming device (step S32 of FIG. 24). In the atmosphere of the chamber, $N_2$ gas of 270 Torr in partial pressure and $NH_3$ gas of 30 Torr in partial pressure, for example, are left, and the surface of each silicon substrate 12 is maintained at 750° C. for 10 seconds (step S33 of FIG. 24). In this manner, a nitride layer 14a is formed on a Si layer that is the second atomic layer on the surface of each silicon substrate 12 (step S34 of FIG. 24, FIG. 25B).

The atmosphere in the chamber is filled with nitrogen radicals (Ar/$N_2$ (160 sccm/40 sccm), 0.03 Torr in pressure, and 300 w in power, for example). The temperature on the surface of each silicon substrate 12 is set to room temperature and is maintained at room temperature for 10 seconds. By doing so, nitride layers 14b and 14c are formed on and below the nitride layer 14a, and a silicon nitride film 14 consisting of the nitride layers 14a, 14b, and 14c is formed on each silicon substrate 12 (step S35 of FIG. 24, FIG. 25C).

Figure 26:
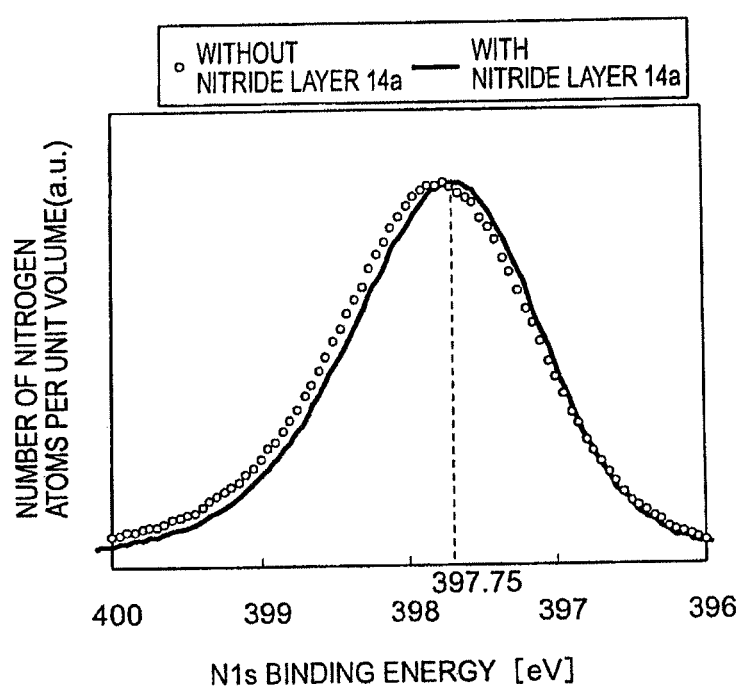
FIG. 26 illustrates the effects of the fourth embodiment.

Next, the effect of the formation of the nitride layer 14a is described. FIG. 26 shows variations in binding of nitrogen atoms in the silicon nitride film measured by XPS in a case where the silicon nitride film is formed only with nitrogen radicals through 10-second nitridation at room temperature (where the nitride layer 14a is not formed), and in a case where a silicon nitride film is formed with nitrogen radicals through 10-second nitridation at room temperature after the nitride layer 14a is formed. In FIG. 26, the abscissa axis indicates the binding energy in the case where the silicon nitride film contains nitrogen (N) in the is state, and the ordinate axis indicates the number of nitrogen atoms having the binding energy per unit volume. Here, the film thicknesses of both silicon nitride films are the same. As can be seen from FIG. 26, the energy of the nitrogen in the 1s state in the silicon nitride film with the nitride layer 14a becomes closer to the binding energy (397.75 eV) of nitrogen in a stable three-coordinate bonding state than the energy of the nitrogen in the silicon nitride film formed only with nitrogen radicals. Thus, a silicon nitride film with a more stable bonding state can be formed with the nitride layer 14a.

Figure 27:
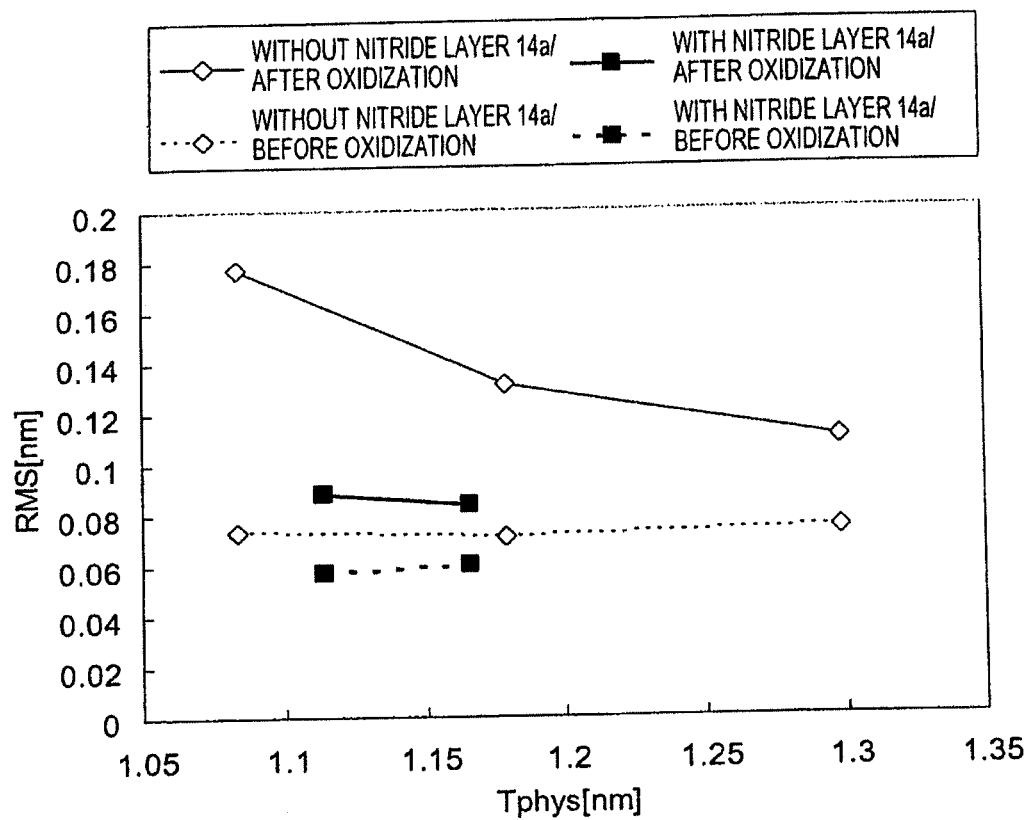
FIG. 27 illustrates the effects of the fourth embodiment.

The more stable bonding state can be seen in the variation in surface roughness due to oxidization. FIG. 27 shows the variation in surface roughness (RMS: Root-Mean-Square) in a case where silicon nitride films formed at varied $N_2$ dilution rates are oxidized. In FIG. 27, the abscissa axis indicates the physical thickness Tphys of each silicon nitride film, and the ordinate axis indicates the surface roughness RMS. The silicon nitride film formed with nitrogen radicals after the formation of the nitride layer 14a has smaller surface roughness due to oxidization. This result implies that the oxidization of the silicon nitride film is dominant at the interface, but hardly occurs on the surface. Since oxidization hardly occurs on the surface of the silicon nitride film, the oxygen that has reached the silicon nitride film is not easily detached. In other words, the amounts of unstable interstitial silicon (Si) and dangling bonds that cause oxygen to be detached are small in the silicon nitride film and on the surface of the silicon nitride film, and the silicon nitride film has the (almost) same strength as a Si—O bond.

Figure 28:
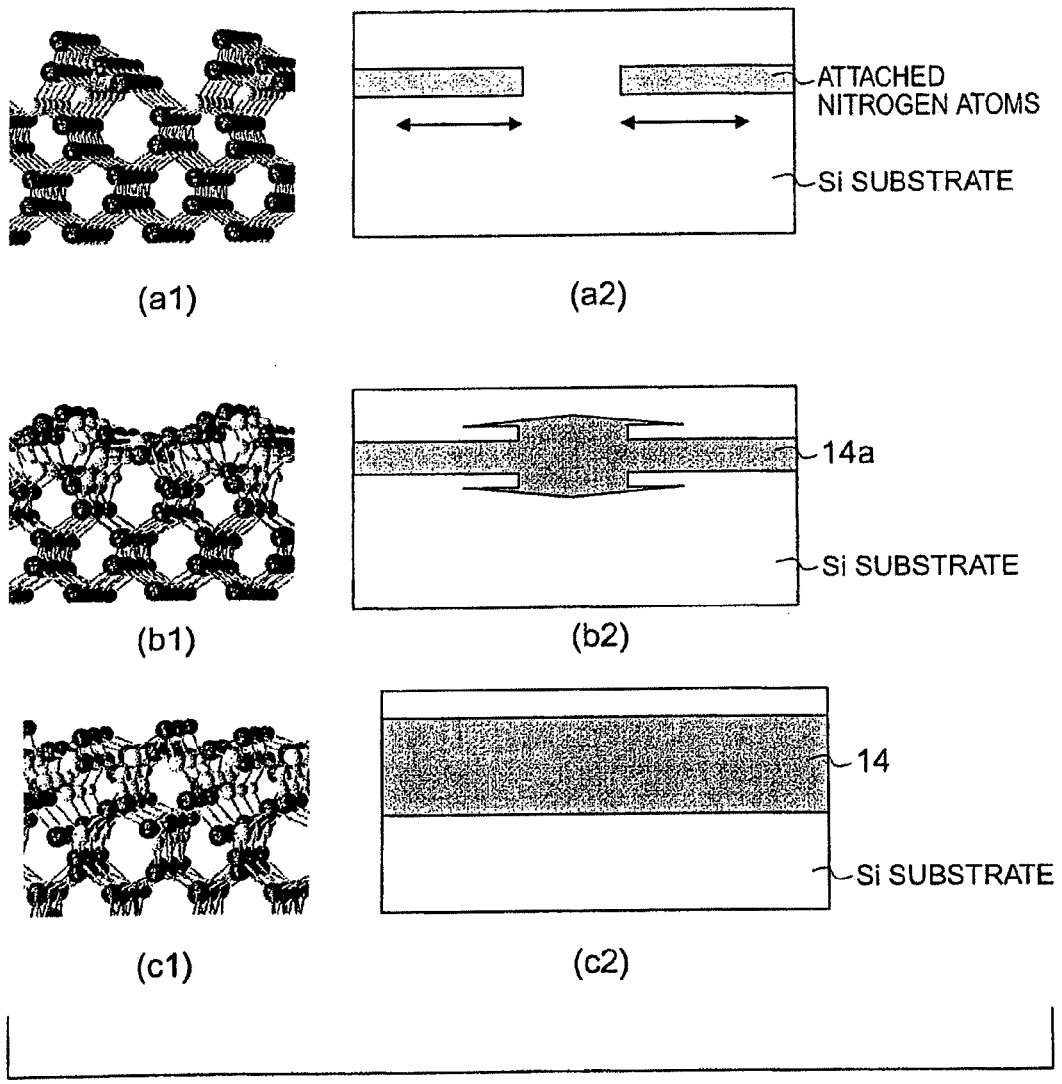
FIGS. 28(a1) through 28(c2) show the mechanism of the formation of a silicon nitride film by the manufacturing method in accordance with the fourth embodiment.

Through examinations, we discovered the mechanism of the formation of the silicon nitride film in accordance with this embodiment as shown in FIGS. 28(a1) through 28(c2). FIGS. 28(a1), 28(b1), and 28(c1) show the molecule models indicating the process of the formation mechanism. FIGS. 28(a2), 28(b2), and 28(c2) are cross-sectional views showing the process of the formation mechanism. As described above, since the second atomic layer of silicon on the substrate surface is the most stable attachment site for nitrogen atoms, the nitrogen atoms first adhere in the second atomic layer (FIGS. 28(a1) and 28(a2)), and nitridation occurs mainly in the second atomic layer (FIGS. 28(b1) and 28(b2)). After that, nitridation occurs up and down the second atomic layer (FIGS. 28(c1) and 28(c2)). When the nitridation further proceeds, upward nitridation ceases of itself and downward nitridation proceeds.

Furthermore, we discovered that nitridation thereafter occurs while carrying the information as to the second atomic layer that is first formed. Accordingly, as a high-quality nitride layer is first formed in the second atomic layer, a high-quality nitride film can be formed even under conditions of the formation of a nitride film with poor quality at a high nitriding speed, as in radical nitridation. In general, to form a high-quality nitride film, it is necessary to cause nitrogen to react slowly with Si. As a result, the period of time required for forming a high-quality nitride film is very long. However, if the information as to the single nitride layer that is first formed is carried in the later nitridation, it is not necessary to perform slow nitridation from beginning to end. Nitridation should be first performed under conditions of the formation of a high-quality nitride film only for a short period of time, and later nitridation can be performed in poor conditions. In this manner, a high-quality nitride film with a large thickness can be quickly formed.

Figure 29:
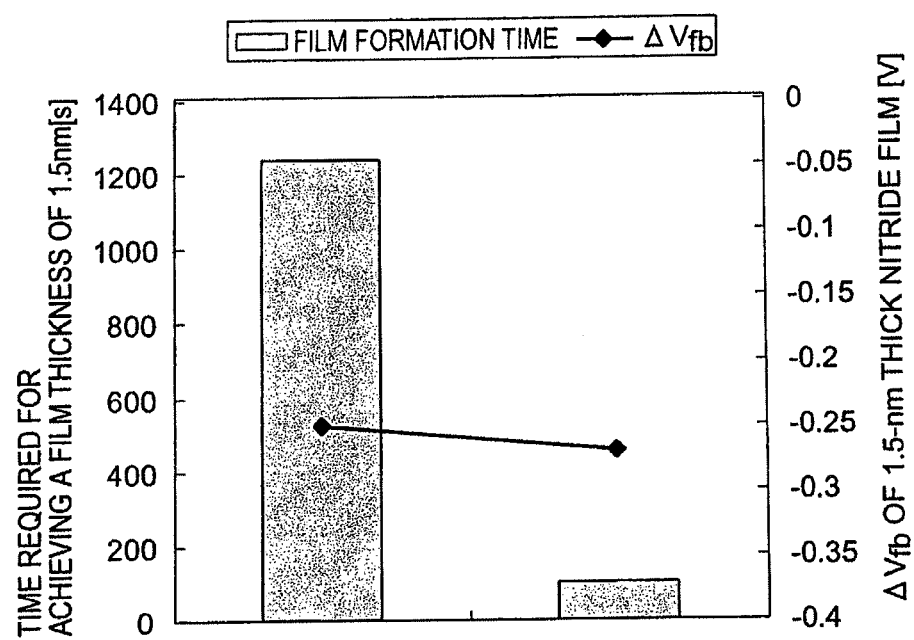
FIG. 29 illustrates the effects of the fourth embodiment.

FIG. 29 shows the time required for forming each nitride film of 1.5 nm in thickness and the shift amount ($\Delta V_{fb}$) (proportional to the amount of defects in the film) of the flat-band voltage of each obtained nitride film in the case where a nitride film is formed through nitridation under conditions of a high-quality nitride film from beginning to end and in the case where a nitride film is formed through nitridation in poor conditions after nitridation is performed under conditions of a high-quality nitride film only for the first 10 seconds. As can be seen from FIG. 29, in the latter case, the same shift amount of the flat-band voltage ($\Delta V_{fb}$) as that in the former case is obtained, though the period of time required for forming a nitride film is reduced to ⅒ or less. This implies that both nitride films have substantially the same amount of defects, and the nitride film formed through short-time nitridation in the latter case has the same quality as the nitride film in the former case. Also, the information as to the first single nitride layer formed at first is inherited by the nitride films that are formed and grown later.

As described above, in this embodiment, even if a high-quality nitride layer is formed in the second atomic layer and nitridation is then performed in poor conditions, a SiN film with fewer defects can be quickly formed.

Although the first nitridation time is 10 seconds in the above description, it may be longer than 10 seconds. Also, $N_2$ gas is employed as an example of the dilution gas. However, it is also possible to employ some other gas that has similar mass to Si and has stable properties, such as Ar gas. Although $NH_3$ gas is employed as the nitriding gas, it is possible to employ some other gas that can nitride Si, such as N* gas. Although the partial pressure is 30 Torr, it may not be 30 Torr, and a lower partial pressure is more preferred. Although the partial pressure of the dilution gas is 270 Torr, it may not be 270 Torr.

Also, the preferred film thickness of the high-quality nitride film that is first formed ranges from 4 Å to 1 nm. As the film thickness is 4 Å or larger, it is easier to achieve stable properties of a film. As the film thickness is 1 nm or smaller, a high-quality nitride film can be more quickly formed. To restrict variations, the more preferred film thickness of the high-quality nitride film that is first formed is 7 Å or larger.

The method for manufacturing a semiconductor device in accordance with the fourth embodiment is particularly suitable in a case where a nitride film having a relatively large film thickness is required, such as a gate insulating film of a CMISFET with low power consumption, a tunnel insulating film of a floating-gate non-volatile memory, or a tunnel insulating film of a MONOS non-volatile memory. Particularly, the method in accordance with the fourth embodiment is most suitable for a gate insulating film of a CMISFET with low consumption power.

Fifth Embodiment

Figure 30:
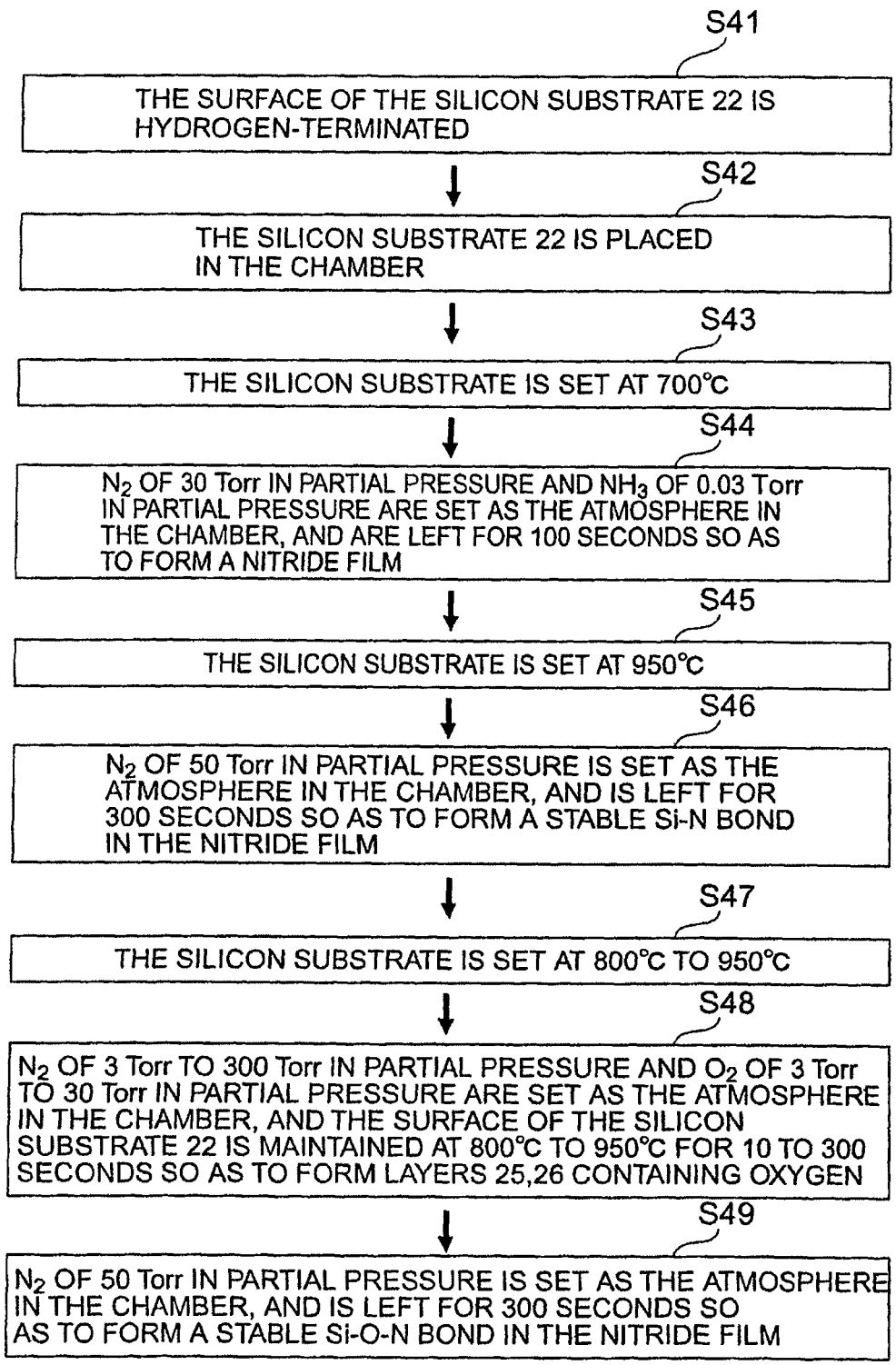
FIG. 30 is a flowchart showing the manufacturing steps in a method for manufacturing a semiconductor device in accordance with a fifth embodiment of the present invention.
Figure 31A:
FIGS. 31A through 31D are cross-sectional views of a semiconductor device manufactured by the manufacturing method of the fifth embodiment.
Figure 31B:
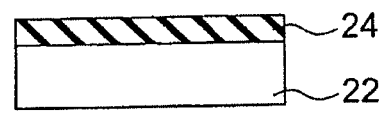
Figure 31C:
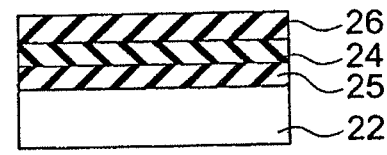
Figure 31D:
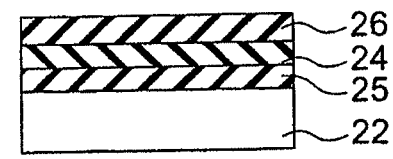

Referring now to FIGS. 30 through 31D, a method for manufacturing a semiconductor device in accordance with a fifth embodiment of the present invention is described. This method in accordance with the fifth embodiment aims to form a SiON film having the optimized shift amount ($\Delta V_{fb}$) of the flat-band voltage at the time of oxidization of a nitride film. FIGS. 30 through 31D illustrate the manufacturing procedures in accordance with this method.

First, silicon substrates 22 are subjected to dilution HF treatment, so that the surface of each silicon substrate 22 is hydrogen-terminated (step S41 of FIG. 30). The silicon substrates 22 are then placed in the chamber of a film forming device (step S42 of FIG. 30). In the atmosphere of the chamber, $N_2$ gas of 30 Torr in partial pressure and $NH_3$ gas of 0.03 Torr in partial pressure, for example, are left, and the surface of each silicon substrate 22 is maintained at 700° C. for 100 seconds (steps S43 and S44 of FIG. 30). In this manner, a nitride film 24 is formed on the surface of each silicon substrate 22 (FIG. 31B).

In the atmosphere in the chamber, $N_2$ gas of 50 Torr in partial pressure, for example, is left, and the surface of each silicon substrate 22 is maintained at 950° C. for 300 seconds (step S45 of FIG. 30). As a result, the dangling bonds in the nitride film 24 are bonded to nitrogen atoms, so as to form a stable Si—N bond in the nitride film 24 (step S46 of FIG. 30). Next, in the atmosphere in the chamber, $N_2$ gas of 3 Torr to 300 Torr in partial pressure and $O_2$ gas of 3 Torr to 30 Torr in partial pressure, for example, are left, and the surface of each silicon substrate 22 is maintained at 800° C. to 950° C. for 10 to 300 seconds (steps S47 and S48 of FIG. 30). In this manner, an oxynitride layer 25 containing oxygen is formed between the silicon substrate 22 and the nitride film 24, and an oxynitride layer 26 containing oxygen is formed on the surface of the nitride film 24 (FIG. 31C).

In the atmosphere in the chamber, $N_2$ gas of 50 Torr in partial pressure, for example, is left, and the surface of each silicon substrate 22 is maintained at 950° C. for 300 seconds (step S49 of FIG. 30, FIG. 31D). As a result, the dangling bonds in the oxynitride layer 25, the nitride film 24, and the oxynitride layer 26 reunite with one another, and the amount of defects in an insulating film having a three-layer structure of the oxynitride layer 25, the nitride film 24, and the oxynitride layer 26 is reduced.

Figure 32:
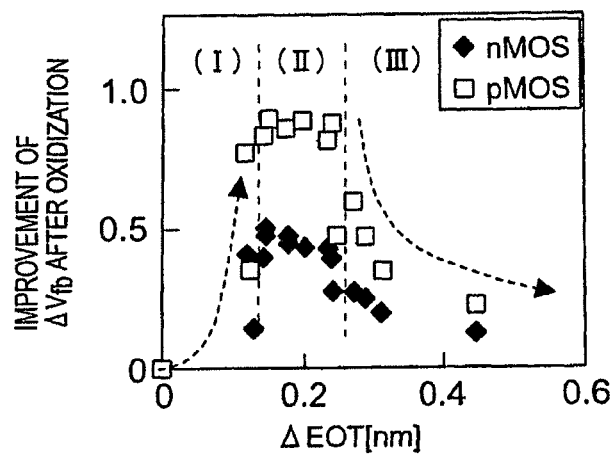
FIG. 32 illustrates the effects of the fifth embodiment.

FIG. 32 shows variations in $\Delta V_{fb}$ improvement rate in a case where the amount of oxidization is varied by changing the oxidization time, the oxidization temperature, and the oxidization pressure (the increase in EOT ($\Delta$EOT) caused by oxidizing a $Si_3N_4$ film of 1 nm in physical thickness). As can be seen the results shown in FIG. 32, there are three regions in the relationship between $\Delta$EOT and $\Delta V_{fb}$. These three regions are: (I) the region in which $\Delta V_{fb}$ is rapidly improved; (II) the region in which the most improved $\Delta V_{fb}$ is observed and maintained; and (III) the region in which $\Delta V_{fb}$ deteriorates. So as to maximize the amount of improvement of $\Delta V_{fb}$, the oxidization time, the oxidization temperature, and the oxidization pressure should be determined in such a manner as to stop oxidization in the region (II). In such a case, the optimum range is 1 Å<$\Delta$EOT<3 Å.

Figure 33:
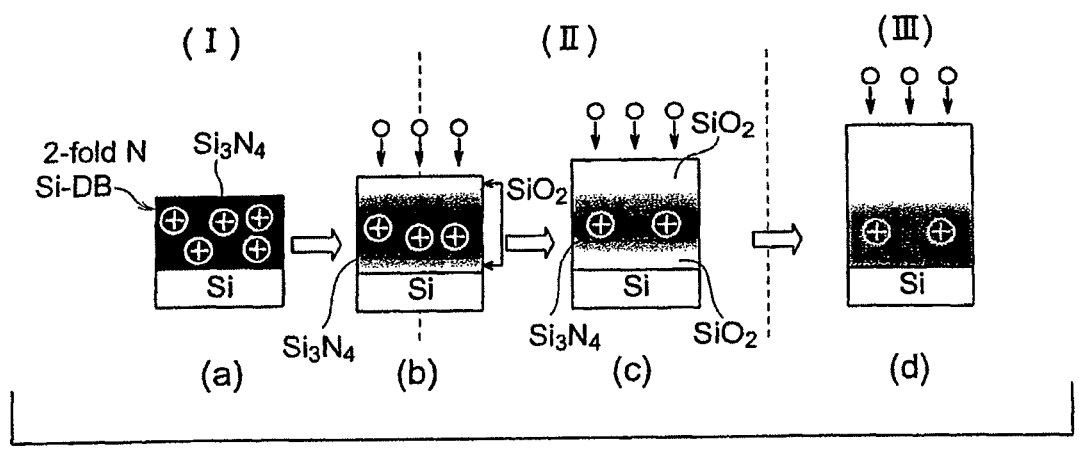
FIGS. 33(a) through 33(d) illustrate the effects of the fifth embodiment.

Through examinations, we discovered that the oxidization mechanism of a $Si_3N_4$ film is as shown in FIGS. 33(a) through 33(b). (I) The defects (two-coordinate nitrogen: 2-fold N, Si defects: Si-DB) in the nitride film are oxidized and corrected (FIGS. 33(a) and 33(b)). As a result of this, $\Delta V_{fb}$ is rapidly improved. (II) Although the defects are corrected as the oxidization progresses, the oxidization of the nitride film also progresses (FIG. 33(c)). The oxidization occurs mainly on the surface, but some oxygen atoms penetrate through the nitride film and reach the substrate. The effect of correcting the defects and the effect of reducing the permittivity due to the surface oxidization cancel each other, and $\Delta V_{fb}$ exhibits a constant value. (III) When the surface becomes thicker as the oxidization progresses, oxygen atoms hardly scatter in the film (FIG. 33(d)). As the oxidation progresses only on the surface, the correction also slows down. As a result, $\Delta V_{fb}$ deteriorates. Therefore, before entering stage (III) in which oxidation occurs only on the surface, oxidization should be stopped in the stage (II), so as to optimize $\Delta V_{fb}$.

As described above, in accordance with this embodiment, a SiON film having an optimized shift amount ($\Delta V_{fb}$) of the flat-band voltage can be formed.

Sixth Embodiment

Figure 34:
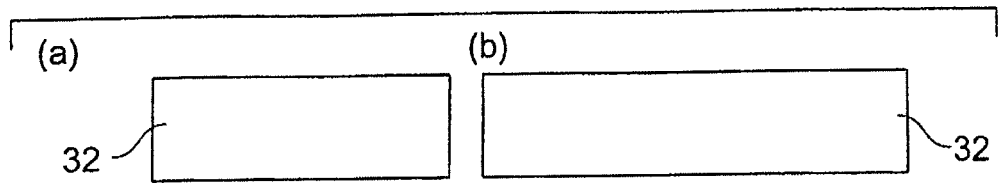
FIGS. 34(a) and 34(b) are cross-sectional views illustrating procedures for manufacturing a FG non-volatile memory in accordance with a sixth embodiment of the present invention.
Figure 35:
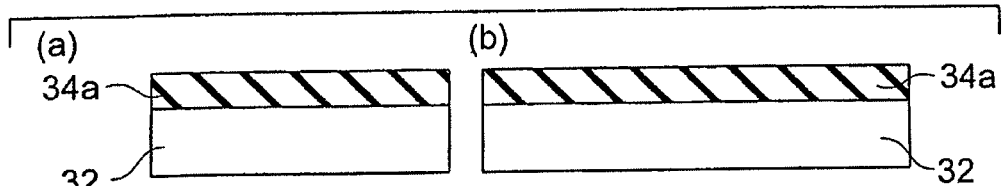
FIGS. 35(a) and 35(b) are cross-sectional views illustrating procedures for manufacturing the FG non-volatile memory in accordance with the sixth embodiment.
Figure 36:
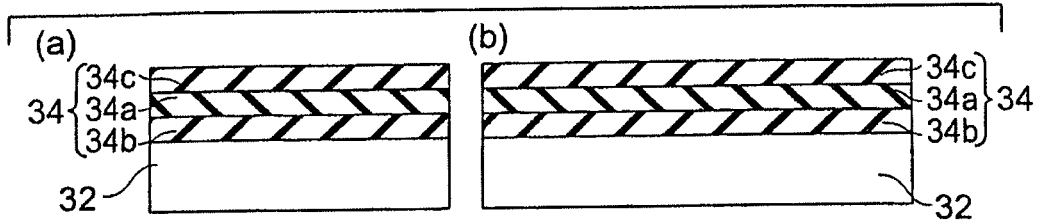
FIGS. 36(a) and 36(b) are cross-sectional views illustrating procedures for manufacturing the FG non-volatile memory in accordance with the sixth embodiment.
Figure 37:
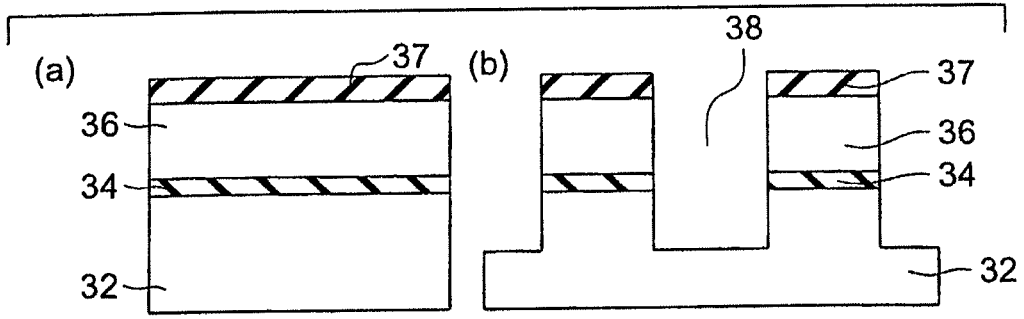
FIGS. 37(a) and 37(b) are cross-sectional views illustrating procedures for manufacturing the FG non-volatile memory in accordance with the sixth embodiment.
Figure 38:
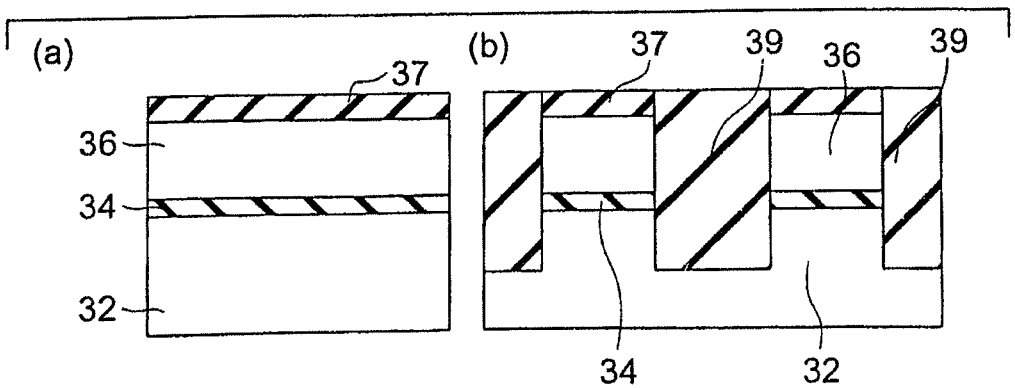
FIGS. 38(a) and 38(b) are cross-sectional views illustrating procedures for manufacturing the FG non-volatile memory in accordance with the sixth embodiment.
Figure 39:
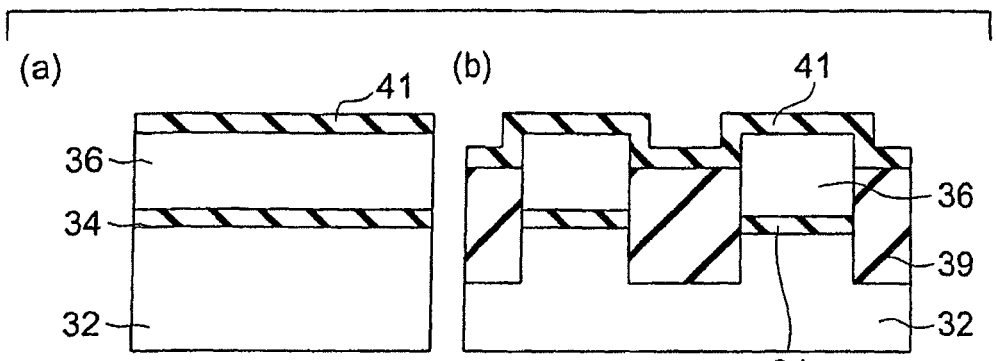
FIGS. 39(a) and 39(b) are cross-sectional views illustrating procedures for manufacturing the FG non-volatile memory in accordance with the sixth embodiment.
Figure 40:
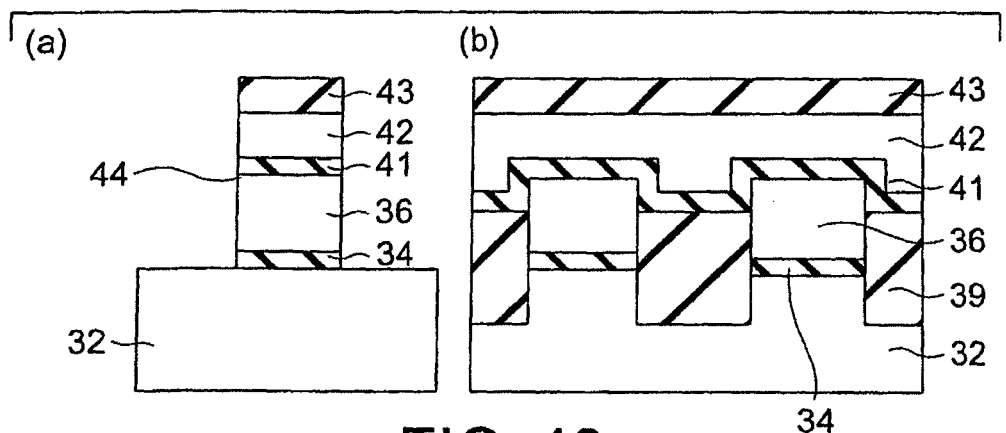
FIGS. 40(a) and 40(b) are cross-sectional views illustrating procedures for manufacturing the FG non-volatile memory in accordance with the sixth embodiment.
Figure 41:
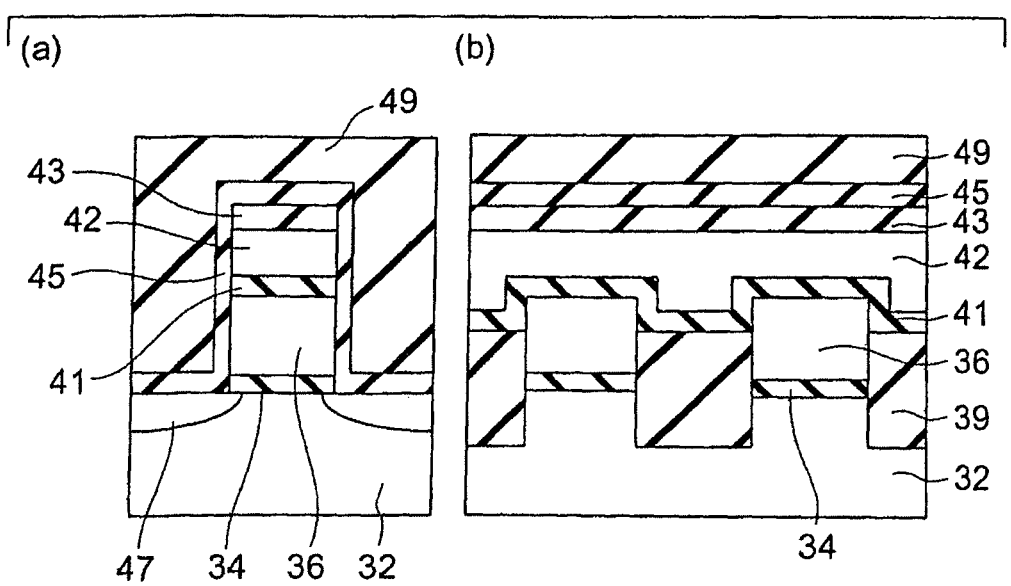
FIGS. 41(*a*) and 41(*b*) are cross-sectional views illustrating procedures for manufacturing the FG non-volatile memory in accordance with the sixth embodiment.

Next, a method for manufacturing a semiconductor device in accordance with a sixth embodiment of the present invention is described. A semiconductor device to be manufactured by the method in accordance with this embodiment is a FG (Floating Gate) non-volatile memory and contains memory cells. Referring to FIGS. 34(a) through 41(b), the method for manufacturing the memory in accordance with this embodiment is described. FIGS. 34(a) and 34(b) show cross sections that are perpendicular to each other. The same applies to FIGS. 35(a) and 35(b), FIGS. 36(a) and 36(b), FIGS. 37(a) and 37(b), FIGS. 38(a) and 38(b), FIGS. 39(a) and 39(b), FIGS. 40(a) and 40(b), and FIGS. 41(a) and 41(b).

First, as shown in FIGS. 34(a) and 34(b), silicon substrates 32 doped with given impurities are subjected to dilution HF treatment, so that the surface of each silicon substrate 32 is hydrogen-terminated. The silicon substrates 32 are then placed in the chamber of a film forming device. In the atmosphere in the chamber, only a gas that does not react with silicon or etch silicon during production (nitrogen gas, for example) is left. The temperature of each silicon substrate is then increased to 700° C., so that hydrogen atoms are completely detached from each silicon substrate.

In the atmosphere in the chamber, $N_2$ gas of 30 Torr in partial pressure and $NH_3$ gas of 0.03 Torr in partial pressure, for example, are left, and the surface of each silicon substrate is maintained at 700° C. for 100 seconds. In this manner, a silicon nitride film 34a is formed on each silicon substrate 32, as shown in FIGS. 35(a) and 35(b). The temperature of each silicon substrate 32 is then increased to 850° C. and is maintained. While each silicon substrate 32 is maintained at 850° C., $N_2$ gas of 30 Torr in partial pressure and $O_2$ gas of 3 Torr in partial pressure, for example, are left in the atmosphere in the chamber, and are maintained for 300 seconds. As a result, a silicon oxynitride layer 34b containing oxygen is formed between the silicon substrate 32 and the silicon nitride film 34a, and a silicon oxynitride layer 34c containing oxygen is formed on the surface of the silicon nitride film 34a, as shown in FIGS. 36(a) and 36(b). Thus, a tunnel insulating film 34 consisting of the silicon oxynitride layer 34b, the silicon nitride film 34a, and the silicon oxynitride layer 34c is formed. The tunnel insulating film formed in this manner is a nitride film with few defects, as described in the first through third embodiments.

After that, a phosphorus-doped polycrystalline silicon layer 36 that is to be a floating gate electrode and has a thickness of 60 nm, and a mask material 37 for device isolation are successively deposited by CVD (Chemical Vapor Deposition). Etching is then performed on the mask material 37, the polycrystalline silicon layer 36, and the tunnel insulating film 34 in this order by RIE (Reactive Ion Etching) using a resist mask (not shown). Further, etching is performed on the exposed region of the silicon substrate 32, so as to form device isolating grooves 38 of 100 nm in depth (FIGS. 37(a) and 37(b)).

Next, a silicon oxide film 39 for device isolation is deposited on the entire surface, so as to fill the device isolating grooves 38 completely. After that, the portions of the silicon oxide film 39 existing on the surface are removed by CMP (Chemical Mechanical Polishing), so as to smoothen the surface. At this point, the mask material 37 is exposed (FIGS. 38(a) and 38(b)).

After the exposed mask material 37 is selectively removed by etching, the exposed surfaces of the silicon oxide film 39 are removed by etching with diluted fluoric acid, so that the side faces 40 of the polycrystalline silicon layer 36 are partially exposed. An alumina film that is to be an interelectrode insulating film and has a thickness of 15 nm is then deposited on the entire surface by ALD (Atomic Layer Deposition). Due to the oxidizing agent used for the film formation by ALD, an extremely thin silicon oxide layer is formed at each interface between the alumina film and the polycrystalline silicon layer 36. As a result, a 16-nm thick interelectrode insulating film 41 having a two-layer structure of the alumina film and the silicon oxide layer is formed (FIGS. 39(a) and 39(b)).

A 100-nm thick conductive layer 42 that is to be a control gate electrode and has a two-layer structure consisting of a tungsten silicide layer and a polycrystalline silicon layer is then deposited by CVD, and a RIE mask material 43 is further deposited by CVD. Etching is then performed on the mask material 43, the conductive layer 42, the interelectrode insulating film 41, the polycrystalline silicon layer 36, and the tunnel insulating film 34 in this order by RIE using a resist mask (not shown), so as to form slit portions 44 extending in the word-line direction. In this manner, the shapes of the polycrystalline silicon layer 36 to be the floating gate electrode and the conductive layer 42 to be the control gate electrode are determined (FIGS. 40(a) and 40(b)).

Lastly, after a silicon oxide film 45 that is called an electrode sidewall oxide film is formed on the exposed surface through thermal oxidization, source/drain diffusion layers 47 are formed through ion implantation, and an interlayer insulating film 49 to cover the entire surface is formed by CVD. Thereafter, a wiring layer or the likes are formed by a conventional technique, so as to complete non-volatile memory cells (FIGS. 41(a) and 41(b)).

Figure 42:
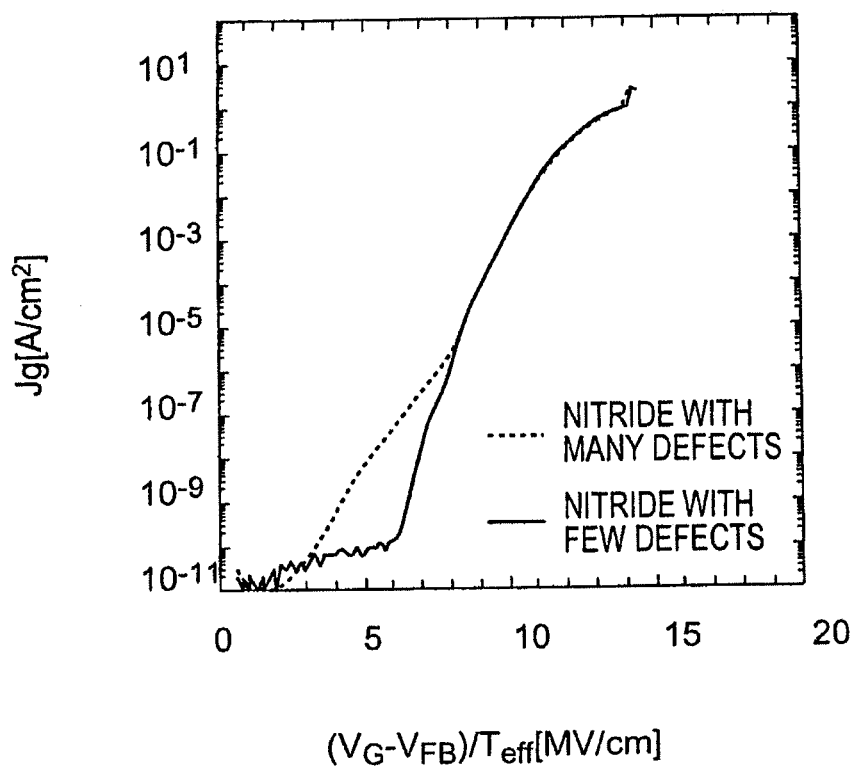
FIG. 42 illustrates the effect of the FG non-volatile memory in accordance with the sixth embodiment.

FIG. 42 shows the variations in SILC (Stress Induced Leakage Current) characteristics under varied conditions for nitride film formation. In FIG. 42, the abscissa axis indicates the value obtained by dividing the difference between the gate voltage $V_G$ and the flat-band voltage $V_{fb}$ by the electrically effective thickness $T_{eff}$ of the transistor, and the ordinate axis indicates the leakage current Jg. The value represented by the abscissa axis $((V_G-V_{fb})/T_{eff})$ is equivalent to the electric field induced in the insulating film. With this arrangement, the influence of the fixed charges in the insulating films is eliminated, and insulating property comparison can be performed simply at the field intensity applied to the insulating films. This is because $V_{fb}$ varies with changes in fixed charge amount in the film, and the electric field induced in the insulating film is wrongly measured if comparison is performed only with $V_G$. As already described in this embodiment, the amount of leakage current in the low-voltage region rapidly decreases by forming a nitride film with few defects on a silicon substrate at 700° C. and 30 Torr, rather than a film with many defects formed by performing plasma nitridation on a substrate at room temperature. Here, the electrically effective thickness $T_{eff}$ of the transistor include not only the electrically effective thickness of the gate insulating film, but also the thicknesses of the depletion layer in the polysilicon electrode and the thickness of the inverted layer on the semiconductor substrate side. This is because, when a voltage is applied to a MOS structure, the voltage is applied not only to the gate insulating film, but also to the gate electrode and the semiconductor substrate. By virtue of this voltage, the inverted layer is formed on the semiconductor substrate side, and the depletion layer is formed on the gate electrode side. Those layers are connected as capacitances in series to the capacitance of the gate insulating film. The series-connected capacitances function as an electrically effective thickness while the transistor is on.

Figure 43:
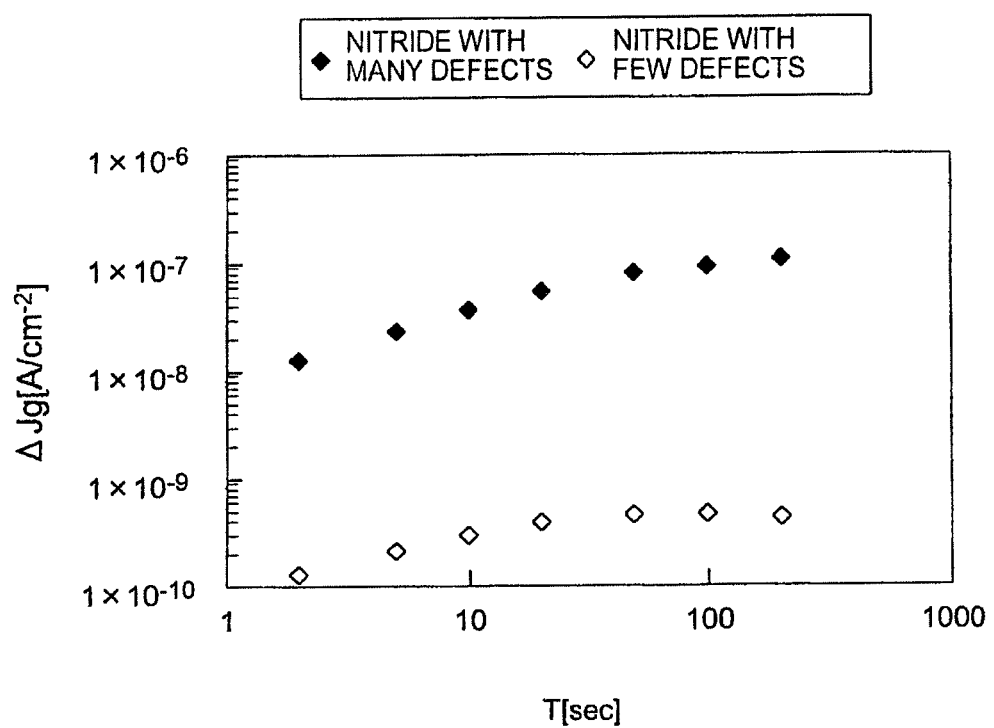
FIG. 43 illustrates the effect of the FG non-volatile memory in accordance with the sixth embodiment.

FIG. 43 shows the charge retention characteristics of memory cells observed with varied SILC characteristics. In FIG. 43, the abscissa axis indicates time T, and the ordinate axis indicates variations ΔJg in leakage current Jg. As can be seen from FIG. 43, by forming a high-quality nitride film, the amount of leakage current decreases under low-voltage stress, and the charge retention characteristics are greatly improved. These results are obtained, because the generation of defects at the time of writing/erasing is restrained, and the occurrence frequency of a leakage path in the bulk is reduced, as the bond between Si and N is firmly established. As described above, the FG non-volatile memory of this embodiment has a highly reliable tunnel insulating film formed with SiON with high nitrogen concentration. With such a tunnel insulating film, the amount of leakage current under low-voltage stress is reduced, and the charge retention characteristics are greatly improved.

As the interelectrode insulating film 41, an oxide containing La and Al, which have higher permittivity, may be employed (such as $LaAlO_3$).

Seventh Embodiment

Figure 44:
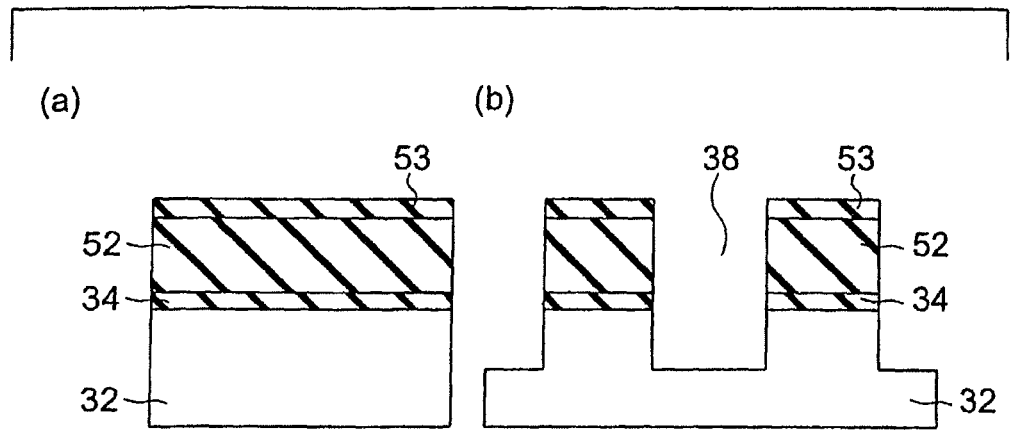
FIGS. 44(*a*) and 44(*b*) are cross-sectional views illustrating procedures for manufacturing a MONOS non-volatile memory in accordance with a seventh embodiment of the present invention.
Figure 45:
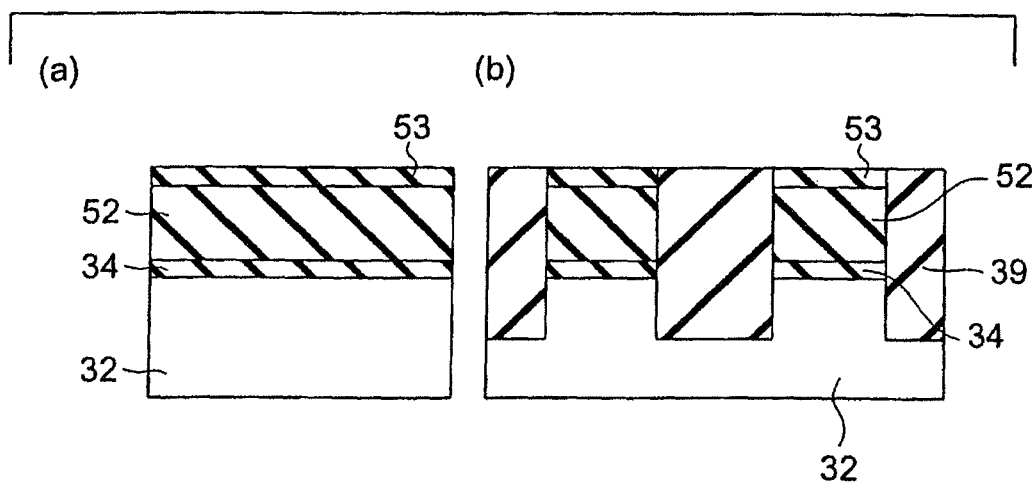
FIGS. 45(*a*) and 45(*b*) are cross-sectional views illustrating procedures for manufacturing the MONOS non-volatile memory in accordance with the seventh embodiment.
Figure 46:
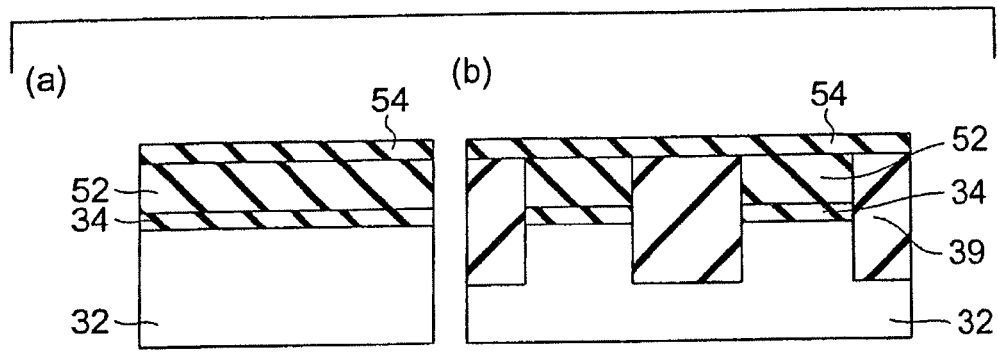
FIGS. 46(*a*) and 46(*b*) are cross-sectional views illustrating procedures for manufacturing the MONOS non-volatile memory in accordance with the seventh embodiment.
Figure 47:
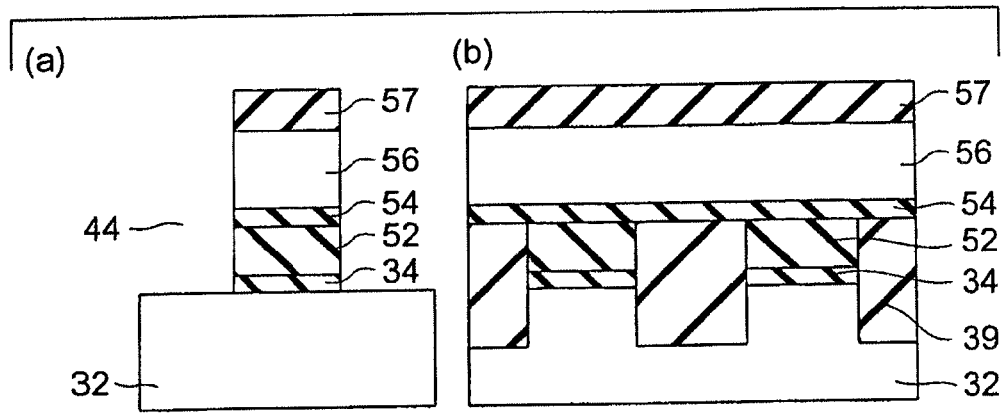
FIGS. 47(*a*) and 47(*b*) are cross-sectional views illustrating procedures for manufacturing the MONOS non-volatile memory in accordance with the seventh embodiment.

Next, a method for manufacturing a semiconductor device in accordance with a seventh embodiment of the present invention is described. A semiconductor device manufactured by the manufacturing method in accordance with this embodiment is a MONOS (a laminated structure of Metal-Oxide ($SiO_2$)-Nitride ($Si_3N_4$)-Oxide ($SiO_2$)—Si) non-volatile memory, and includes memory cells. Referring to FIGS. 44(a) through 48(b), the method for manufacturing the memory in accordance with this embodiment is described. FIGS. 44(a) and 44(b) show cross sections that are perpendicular to each other. The same applies to FIGS. 45(a) and 45(b), FIGS. 46(a) and 46(b), FIGS. 47(a) and 47(b), and FIGS. 48(a) and 48(b).

First, a tunnel insulating film 34 consisting of a silicon oxynitride layer, a silicon nitride film, and a silicon oxynitride layer is formed on the silicon substrate 32 by the same procedures as those in the sixth embodiment. Like the tunnel insulating film in the sixth embodiment, this tunnel insulating film 34 is a nitride film with few defects.

After that, a nitride film 52 that is to be a charge storing layer and has a thickness of 6 nm, and a mask material 53 for device isolation are successively deposited by CVD. Etching is then performed on the mask material 53, the nitride film 52, and the tunnel insulating film 34 in this order by RIE using a resist mask (not shown). Further, etching is performed on the exposed region of the silicon substrate 32, so as to form device isolating grooves 38 of 100 nm in depth, as shown in FIG. 44(b).

Next, a silicon oxide film 39 for device isolation is deposited on the entire surface, so as to fill the device isolating grooves 38 completely. The portions of the silicon oxide film 39 existing on the surface are removed by CMP, so as to smoothen the surface. At this point, the mask material 53 is exposed (FIGS. 45(a) and 45(b)).

After the exposed mask material 53 is selectively removed by etching, the exposed surfaces of the silicon oxide film 39 are removed by etching with diluted fluoric acid. An alumina film that is to be an interelectrode insulating film and has a thickness of 15 nm is then deposited on the entire surface by ALD. Due to the oxidizing agent used for the film formation by ALD, an extremely thin silicon oxide layer is formed at each interface between the alumina film and the nitride film 52. As a result, a 16-nm thick interelectrode insulating film 54 having a two-layer structure of the alumina film and the silicon oxide layer is formed (FIGS. 46(a) and 46(b)).

A 100-nm thick conductive layer 56 that is to be a control gate electrode and has a two-layer structure consisting of a tungsten silicide layer and a polycrystalline silicon layer is then deposited by CVD, and a RIE mask material 57 is further deposited by CVD. Etching is then performed on the mask material 57, the conductive layer 56, the interelectrode insulating film 54, the charge storing nitride film 52, and the tunnel insulating film 34 in this order by RIE using a resist mask (not shown), so as to form slit portions 44 extending in the word-line direction (FIGS. 47(a) and 47(b)). In this manner, the shapes of the charge storing layer 52 and the control gate electrode 56 are determined.

Figure 48:
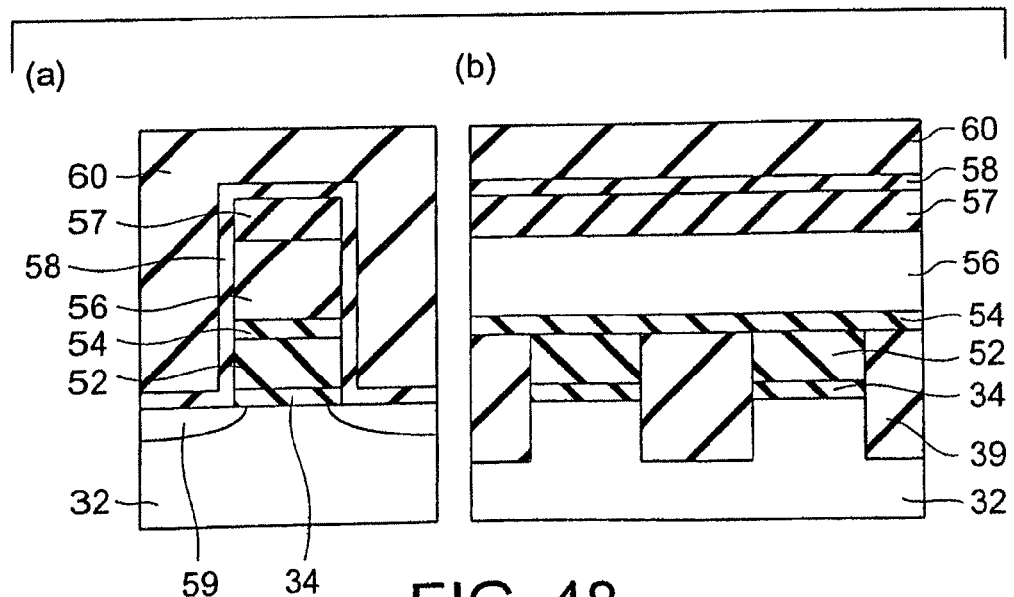
FIGS. 48(*a*) and 48(*b*) are cross-sectional views illustrating procedures for manufacturing the MONOS non-volatile memory in accordance with the seventh embodiment.

Lastly, after a silicon oxide film 58 that is called an electrode sidewall oxide film is formed on the exposed surface through thermal oxidization, source/drain diffusion layers 59 are formed through ion implantation, and an interlayer insulating film 60 to cover the entire surface is formed by CVD (FIGS. 48(*a*) and 48(*b*)). Thereafter, a wiring layer or the likes are formed by a conventional technique, so as to complete non-volatile memory cells.

Figure 49:
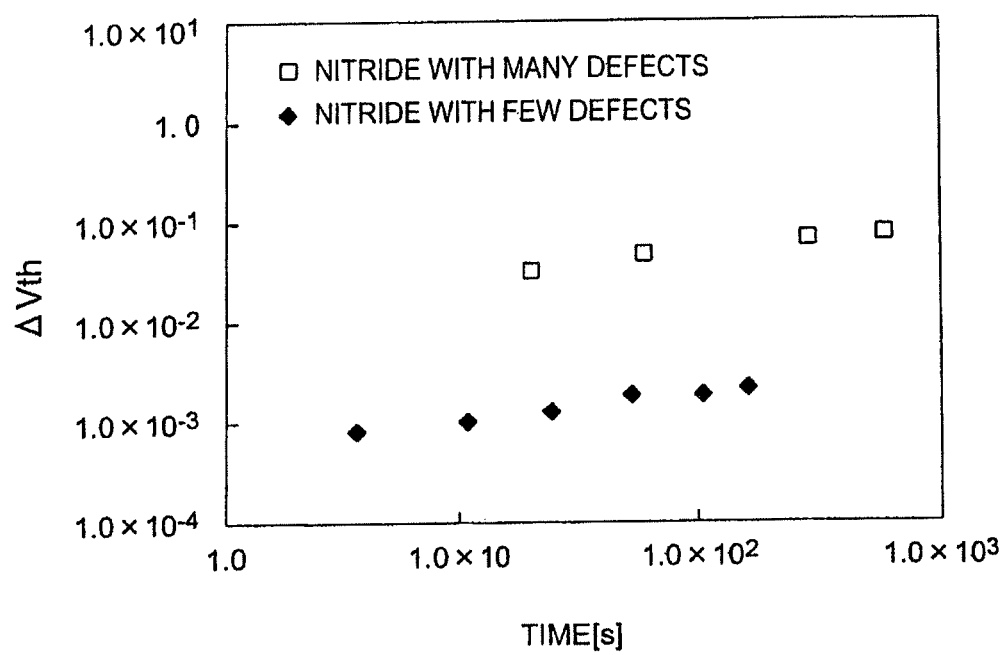
FIG. 49 illustrates the effects of the MONOS non-volatile memory in accordance with the seventh embodiment.

FIG. 49 shows the relationship between the stress time and variations ($\Delta V_{th}$) in threshold value $V_{th}$ due to changes in the amount of retained charges, which is the charge retention characteristics of the memory cells, with a constant voltage being applied to the non-volatile memory of this embodiment. As can be seen from FIG. 49, with a high-quality nitride film being formed, the shift amount of the threshold voltage is reduced, as the amount of stored charges decreases. This implies that the charge retention characteristics are greatly improved. These results are obtained, because the occurrence frequency of a leakage path in the bulk is reduced by firmly establishing the bond between Si and N, and the amount of leakage current decreases. As described above, the MONOS non-volatile memory of this embodiment has a highly reliable tunnel insulating film formed with SiON with high nitrogen concentration. With such a tunnel insulating film, the amount of leakage current is reduced, and the charge retention characteristics are greatly improved.

As the interelectrode insulating film 54, an oxide containing La and Al, which have higher permittivity, may be employed (such as $LaAlO_3$).

Eighth Embodiment

Next, a method for manufacturing a semiconductor device in accordance with an eighth embodiment of the present invention is described. The manufacturing method in accordance with this embodiment is a method for manufacturing a MISFET, and the manufacturing procedures are illustrated in FIGS. 50A through 52B.

Figure 50A:
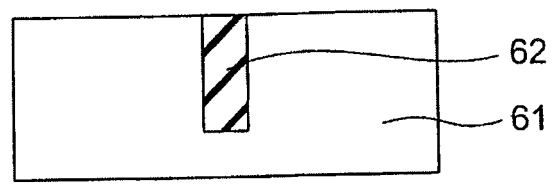
FIGS. 50A through 50E are cross-sectional views illustrating procedures for manufacturing a MISFET in accordance with an eighth embodiment of the present invention.
Figure 50B:
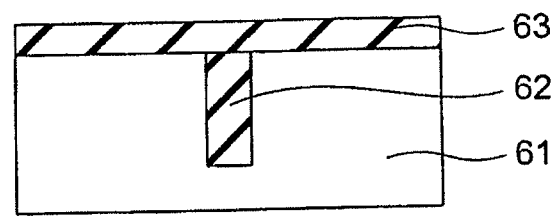
Figure 50C:
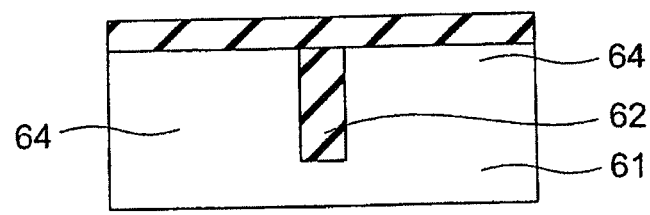

First, device isolating regions 62 are formed in a silicon substrate 61 having a (100)-plane orientation, as shown in FIG. 50A. A $SiO_2$ film 63 of 50 nm in thickness is then formed on the entire surface, as shown in FIG. 50B. Ion implantation using both boron and indium elements is then performed via the $SiO_2$ film 63, so as to form a steep impurity profile in each region 64 to be used as a channel (see FIG. 50C).

Figure 50D:
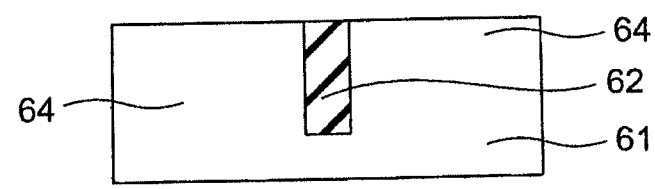

After the $SiO_2$ film 63 is removed by etching with an ammonia fluoride solution, as shown in FIG. 50D, the surface of the silicon substrate 61 is subjected to dilution HF treatment, so that the surface of the silicon substrate 61 is hydrogen-terminated.

Figure 50E:
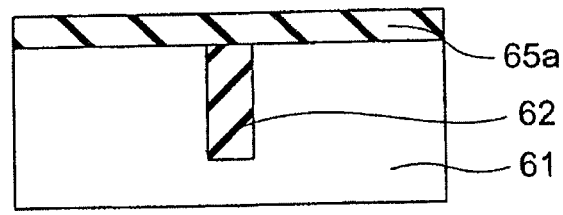

In the atmosphere in the chamber, $N_2$ gas of 30 Torr in partial pressure and $NH_3$ gas of 0.03 Torr in partial pressure, for example, are left, and the surface of the silicon substrate is maintained at 700° C. for 100 seconds. In this manner, a silicon nitride film 65*a* is formed on the silicon substrate 61, as shown in FIG. 50E.

Figure 51A:
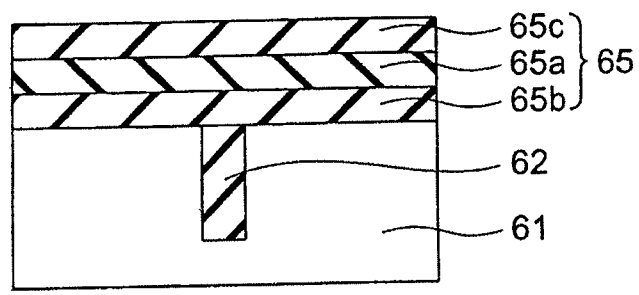
FIGS. 51A through 51C are cross-sectional views illustrating the MISFET in accordance with the eighth embodiment.

The temperature of the silicon substrate is then increased to 850° C. and is maintained at that temperature. While the silicon substrate is maintained at 850° C., $N_2$ gas of 30 Torr in partial pressure and $O_2$ gas of 3 Torr in partial pressure, for example, are left in the atmosphere in the chamber, and are maintained for 300 seconds. As a result, a silicon oxynitride layer 65*b* containing oxygen is formed between the silicon substrate 61 and the silicon nitride film 65*a*, and a silicon oxynitride layer 65*c* containing oxygen is formed on the surface of the silicon nitride film 65*a*, as shown in FIG. 51A. Thus, a gate insulating film 65 consisting of the silicon oxynitride layer 65*b*, the silicon nitride film 65*a*, and the silicon oxynitride layer 65*c* is formed. This gate insulating film is a nitride film with few defects, as described in the first through third embodiments.

Figure 51B:
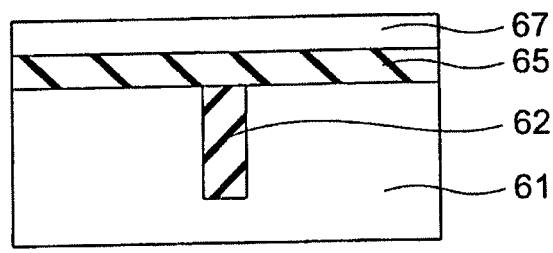
Figure 51C:
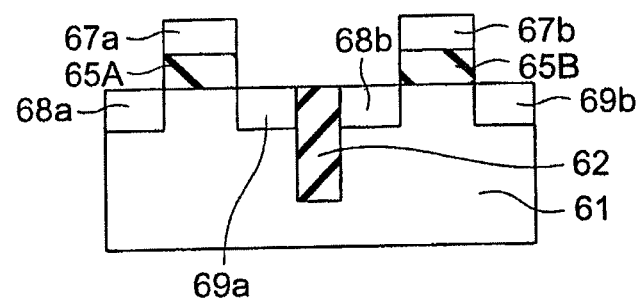

After that, a polysilicon film 67 that is to be a gate electrode is deposited on the entire surface by CVD, as shown in FIG. 51B. The polysilicon film 67 and the insulating film 65 are then patterned by an anisotropic etching technique such as RIE, so as to form gate insulating films 65A and 65B and gate electrodes 67*a* and 67*b* on the channel regions 64, as shown in FIG. 51C. With the gate electrodes 67*a* and 67*b* serving as a mask, ion implantation and heat treatment are performed, so as to form source regions 68*a* and 68*b* and drain regions 69*a* and 69*b* doped with impurities.

Figure 52A:
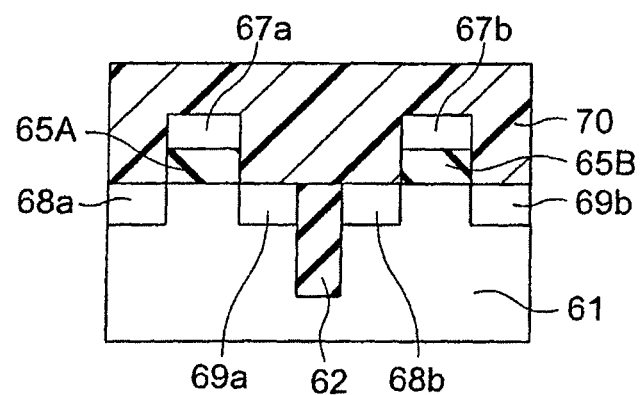
FIGS. 52A and 52B are cross sectional views illustrating the MISFET in accordance with the eighth embodiment.
Figure 52B:
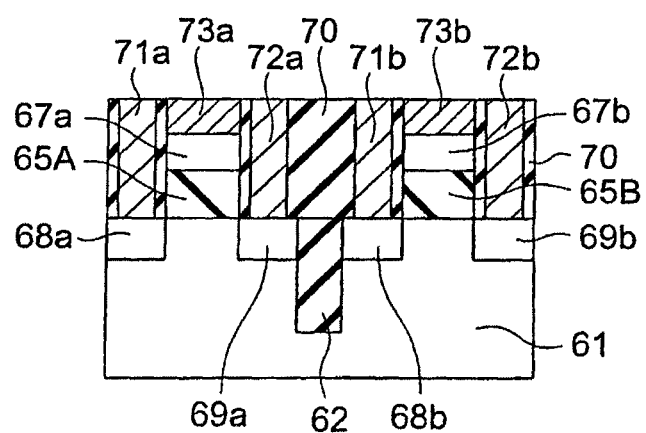

A $SiO_2$ film 70 is then deposited on the entire surface by CVD, as shown in FIG. 52A. Contact holes are then formed in the source and drain regions 68*a*, 68*b*, 69*a*, and 69*b*, as show in FIG. 52B, and a metal film is formed on the entire surface through vapor deposition of a metal such as Al. In this manner, source electrodes 71*a* and 71*b*, drain electrodes 72*a* and 72*b*, and gate electrodes 73*a* and 73*b* are formed, thereby completing a CMISFET.

Figure 53:
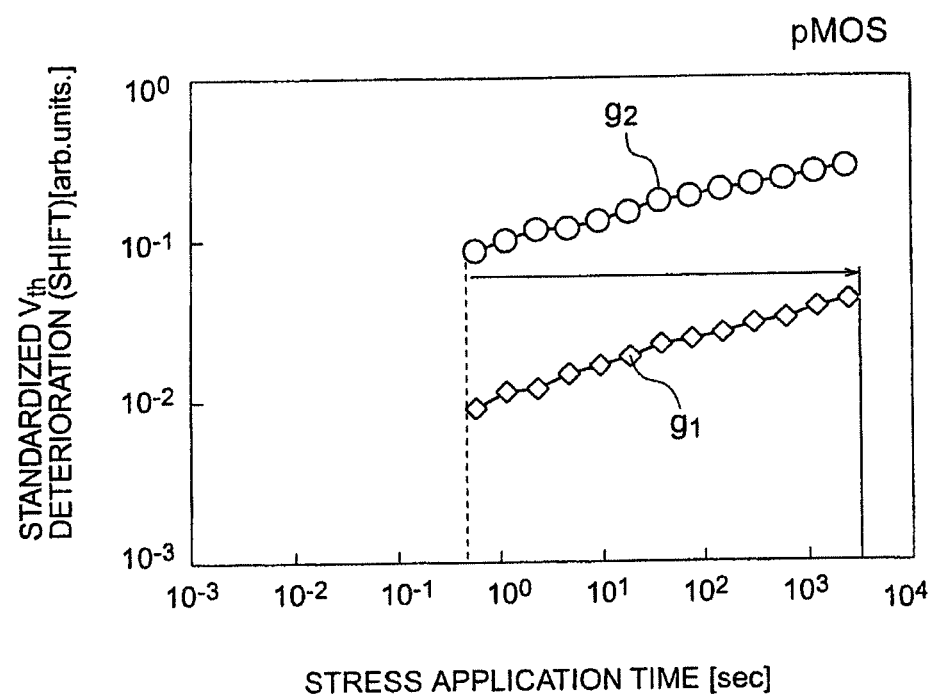
FIG. 53 illustrates the effects of the MISFET in accordance with the eighth embodiment.

FIG. 53 shows the stress voltage application time and variations in threshold voltage (variations in NBTI (Negative Bias Temperature Instability) characteristics) with respect to a SiON film that is obtained by forming a nitride film in an atmosphere of $N_2$ gas of 30 Torr in partial pressure and $NH_3$ gas of 0.03 Torr in partial pressure (or in an atmosphere in which $NH_3$ gas is diluted with $N_2$ gas) at a nitridation temperature of 700° C. and then oxidizing the nitride film at 850° C., and a SiON film that is obtained by forming a nitride film in an atmosphere of $NH_3$ gas of 300 Torr in partial pressure (or in an undiluted atmosphere) at a nitridation temperature of 700° C. and then oxidizing the nitride film a 850° C. In FIG. 53, graph $g_1$ indicates the characteristics of the SiON film obtained by forming a nitride film in a diluted atmosphere, while graph $g_2$ indicates the characteristics of the SiON film obtained by forming an undiluted atmosphere. The applied voltage is 10 MV/cm, and the set temperature is 105° C.

As can be seen from FIG. 53, since a nitride film with few defects is formed in a diluted atmosphere, the period of time required for the threshold voltage $V_{th}$ decreases by 0.1 V becomes longer, for example. If a nitride film is formed with undiluted nitriding gas, the threshold voltage $V_{th}$ decreases in about 0.7 seconds. If a nitride film is formed with diluted nitriding gas, the threshold voltage $V_{th}$ decreases by 0.1 V only after about 7000 seconds have passed. Accordingly, by forming a high-quality nitride film with diluted nitriding gas, the NBTI characteristics are improved 10000 times or more. The NBTI characteristics are observed in the phenomenon that causes a negative-direction shift of the threshold voltage, a decrease in saturation current, an increase in interface state density, and deterioration of maximum mutual conductance, when a p-MOSFET is left in an ON state. The NBTI characteristics exhibit dependence on temperature. Poor NBTI characteristics indicate that the interface characteristics easily deteriorate at the time of voltage application.

The NBTI characteristics are improved, as the bond between Si and N is firmly established so as to decrease the defects in the SiON film and restrain the generation of new defects at the time of stress application. By the technique in accordance with each of the above described embodiments of the present invention, or by the technique for forming a nitride film with diluted nitriding gas, a highly reliable SiON film with few defects and high nitrogen concentration can be formed.

Ninth Embodiment

Figure 54:
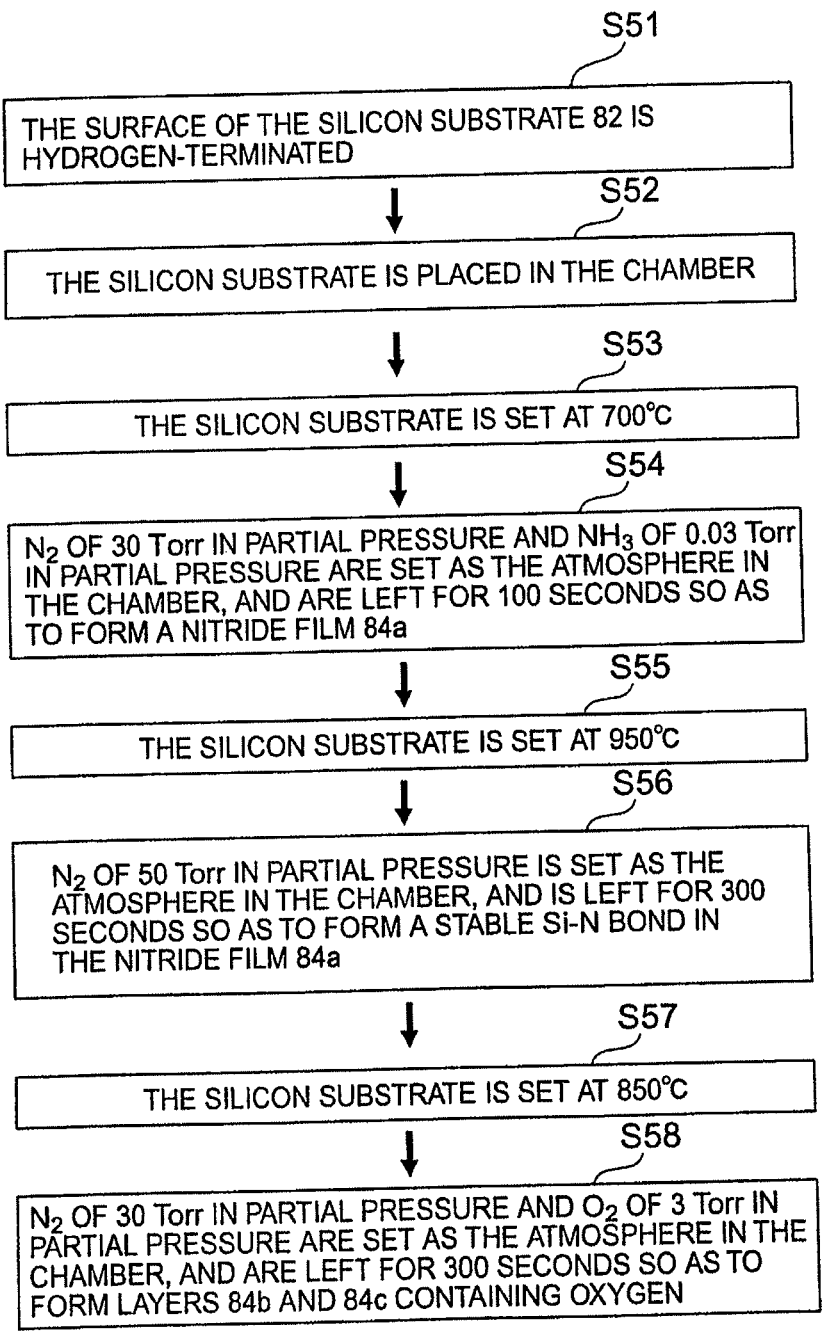
FIG. 54 is a flowchart showing the manufacturing steps in a method for manufacturing a semiconductor device in accordance with a ninth embodiment of the present invention.
Figure 55A:
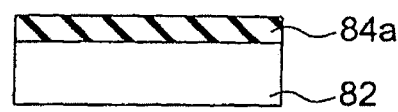
FIGS. 55A and 55B are cross-sectional views illustrating the procedures for manufacturing a semiconductor device in accordance with the ninth embodiment.
Figure 55B:
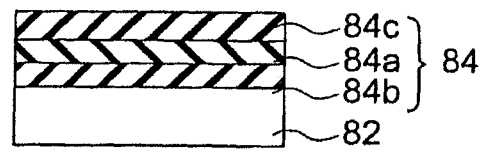

Referring now to FIGS. 54 through 55B, a method for manufacturing a semiconductor device in accordance with a ninth embodiment of the present invention is described.

First, silicon substrates 82 are subjected to dilution HF treatment, so that the surface of each silicon substrate 82 is hydrogen-terminated (step S51 of FIG. 54). The silicon substrates 82 are then placed in a film forming chamber (step S52). In the atmosphere of the chamber, $N_2$ gas of 30 Torr in partial pressure and $NH_3$ gas of 0.03 Torr in partial pressure, for example, are left, and the surface of each silicon substrate 82 is maintained at 700° C. for 100 seconds (step S53). In this manner, a nitride film 84a is formed on the surface of each silicon substrate 82 (step S54, FIG. 55A).

In the atmosphere in the chamber, $N_2$ gas of 50 Torr in partial pressure, for example, is left, and the surface of each silicon substrate 82 is maintained at 950° C. for 300 seconds (step S55). As a result, the dangling bonds in the nitride film are bonded to nitrogen atoms, so as to form a stable Si—N bond in the nitride film 84a (step S56).

Next, in the atmosphere in the chamber, $N_2$ gas of 30 Torr in partial pressure and $O_2$ gas of 3 Torr in partial pressure, for example, are left, and the surface of each silicon substrate 82 is maintained at 850° C. for 300 seconds (step S57). In this manner, an oxynitride layer 84b containing oxygen is formed between the silicon substrate 82 and the nitride film 84a, and an oxynitride layer 84c containing oxygen is formed on the surface of the nitride film 84a. Thus, a silicon oxynitride film 84 consisting of the oxynitride layer 84b, the nitride film 84a, and the oxynitride layer 84c is obtained (FIG. 55B).

Figure 56:
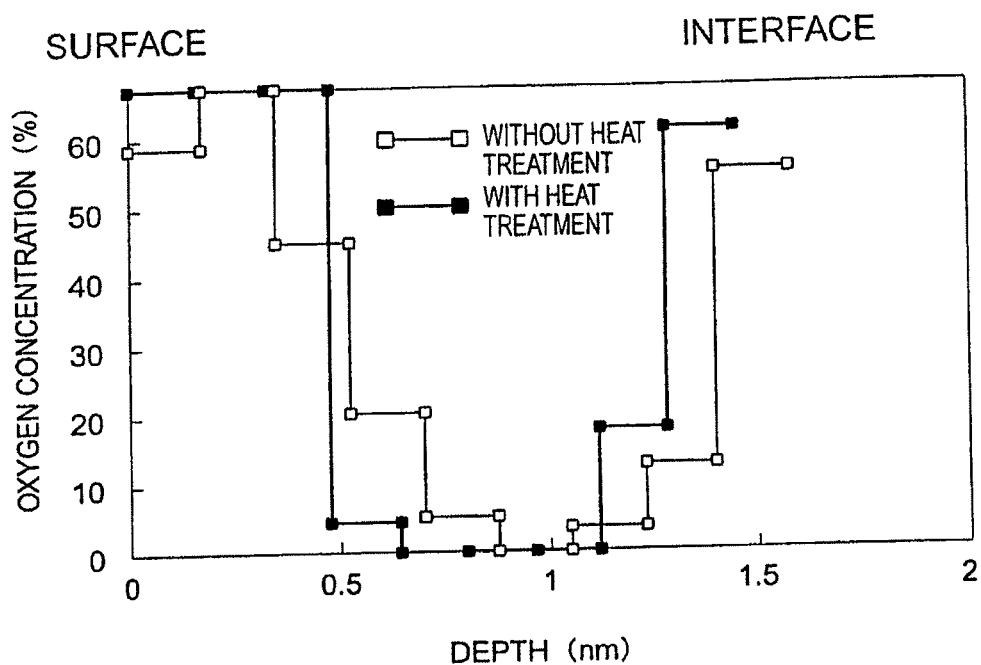
FIG. 56 illustrates the effects of the ninth embodiment.

The effects of the heat treatment are now described. FIG. 56 shows the difference in oxygen distribution in silicon oxynitride films between a case where a silicon oxynitride film is formed by performing heat treatment on a nitride film and then oxidizing the nitride film and a case where a silicon oxynitride film is formed by oxidizing a nitride film without heat treatment. As can be seen from FIG. 56, in the case where heat treatment is performed, the oxygen amount at the interface between the silicon oxynitride film and the Si substrate is larger, and the film thickness of the oxynitride layer 84b on the interface side is smaller. This is because the defects in the nitride film decreases through the heat treatment, and oxygen is less often detached due to the defects and cannot easily be absorbed in the nitride film. Meanwhile, the bond at the interface between silicon nitride film and the Si substrate becomes weaker due to the structural stress, and the scattered oxygen is detached, resulting in oxidization. Accordingly, a silicon oxynitride film with an ideal distribution pattern, having oxygen distributed on the interface side and nitrogen distributed on the surface side, can be formed. This silicon oxynitride film has a smaller EOT than that in the case where heat treatment is not performed.

Figure 57:
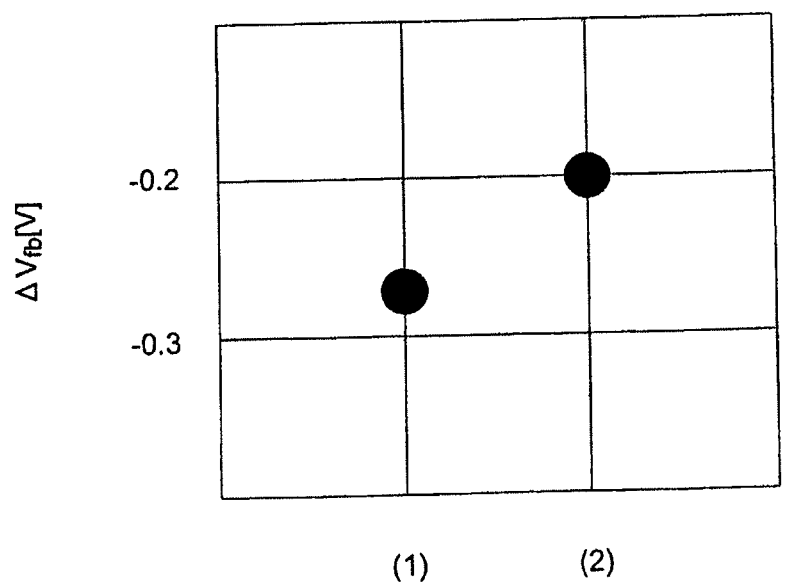
FIG. 57 illustrates the effects of the ninth embodiment.

FIG. 57 shows the comparison between the shift amounts ($\Delta V_{fb}$) of the flat-band voltages of p-channel MOS transistors. In one of the p-channel MOS transistors, a silicon oxynitride film of 1.5 nm in physical thickness is formed without heat treatment after the formation of a nitride film. In the other p-channel MOS transistor, a silicon oxynitride film of 1.5 nm in physical thickness is formed by oxidizing a nitride film after heat treatment. Between the two cases, the shift amount $\Delta V_{fb}$ in the case where heat treatment is performed is reduced. This is because the heat treatment reduces the defects in a nitride film and restrains oxidization of the surface and a nitride film, and nitrogen distribution having nitrogen atoms on the surface side, or charge distribution on the surface side, is achieved.

For the above described reasons, a SiON film having the interface preferentially oxidized can be formed by performing heat treatment after nitridation.

As described above, in accordance with this embodiment, a SiON film (silicon oxynitride film) with a small EOT and excellent reliability can be formed by performing heat treatment after the nitride film 84a is formed.

Although the temperature during the heat treatment after nitridation is 950° C. in this embodiment, it may range from 900° C. or more to 1000° C. or less.

Although $N_2$ gas is used as diluent gas in this embodiment, gas that does not react with or etch silicon during the manufacturing process or stable gas having a similar mass to that of silicon, such as Ar gas, may be used as diluent gas.

Also, $NH_3$ gas is used as nitriding gas in this embodiment. However, gas that can cause nitridation of silicon, such as N*, may be used.

Although the partial pressure of the nitriding gas is set at 0.03 Torr in this embodiment, it may not be 0.03 Torr. However, a lower partial pressure is preferred.

Also, the partial pressure of the diluent gas is set at 30 Torr in this embodiment. However, it may not be 30 Torr.

Also, $O_2$ is used as an oxidizing gas in this embodiment. However, gas that can cause oxidization of silicon, such as $NO_x$, may be used.

Also, the partial pressure of the diluent gas at the time of oxidization is set at 30 Torr, it may not be 30 Torr.

Tenth Embodiment

Figures 58, 59:
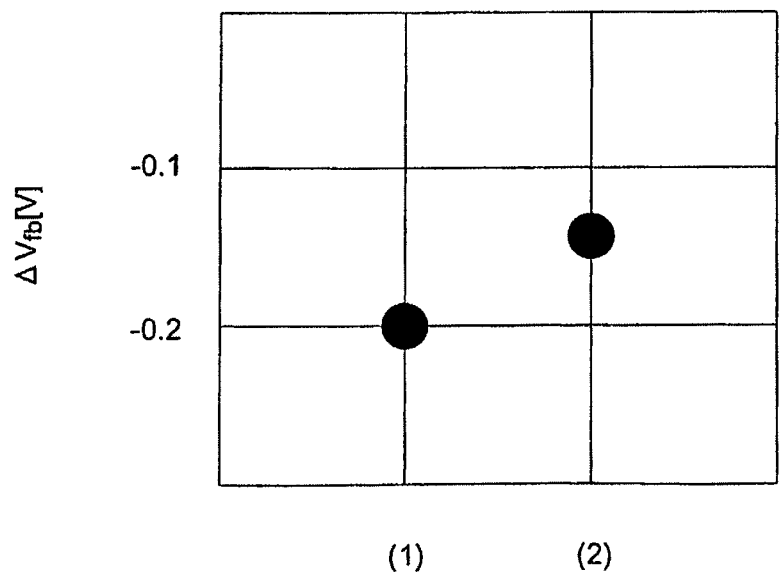
FIG. 58 shows a part of the manufacturing steps in a method for manufacturing a semiconductor device in accordance with a tenth embodiment of the present invention.
FIG. 59 illustrates the effects of the tenth embodiment.

Referring now to FIG. 58, a method for manufacturing a semiconductor device in accordance with a tenth embodiment of the present invention is described. The method for manufacturing a semiconductor device in accordance with the tenth embodiment is the same as the manufacturing method in accordance with the ninth embodiment illustrated in FIG. 54, except that a procedure for performing heat treatment (step S59 of FIG. 58) is additionally carried out after step S58. The heat treatment is to be performed after the nitride film 84a is oxidized, and the oxynitride layers 84b and 84c are formed, with the nitride film 84a being interposed in between. The conditions of the heat treatment in this embodiment are that $N_2$ gas of 50 Torr in partial pressure, for example, is set as the atmosphere in the chamber and that the surface of the silicon substrate 82 is maintained at 950° C. for 300 seconds (FIG. 58). In such conditions, the dangling bonds in the silicon oxynitride film 84 reunite with one another, and a stable Si—O—N bond is formed. Thus, the defects in the silicon oxynitride film become fewer.

The effects of the heat treatment are now described. FIG. 59 shows the comparison between the shift amounts ($\Delta V_{fb}$) of the flat-band voltages of a silicon oxynitride film of 1.5 nm in physical thickness that is formed without heat treatment after the formation of a nitride film and a silicon oxynitride film of 1.5 nm in physical thickness that is formed by oxidizing a nitride film after heat treatment. Between the two cases, the shift amount $\Delta V_{fb}$ in the case where heat treatment is performed is smaller. This is because the heat treatment reduces the defects in the film.

Also, as described in the ninth embodiment, a SiON film having the interface preferentially oxidized can be formed by performing heat treatment after nitridation. Accordingly, the silicon oxynitride film (SiON film) formed by the manufacturing method in accordance with this embodiment has a smaller EOT than that achieved in the case where heat treatment is not performed.

As described above, in accordance with this embodiment, a SiON film with a small EOT and excellent reliability can be formed by performing heat treatment after oxidization.

Although the temperature during the heat treatment after oxidization is 950° C. in this embodiment, it may range from 900° C. or more to 1000° C. or less.

Eleventh Embodiment

Figures 60, 61:
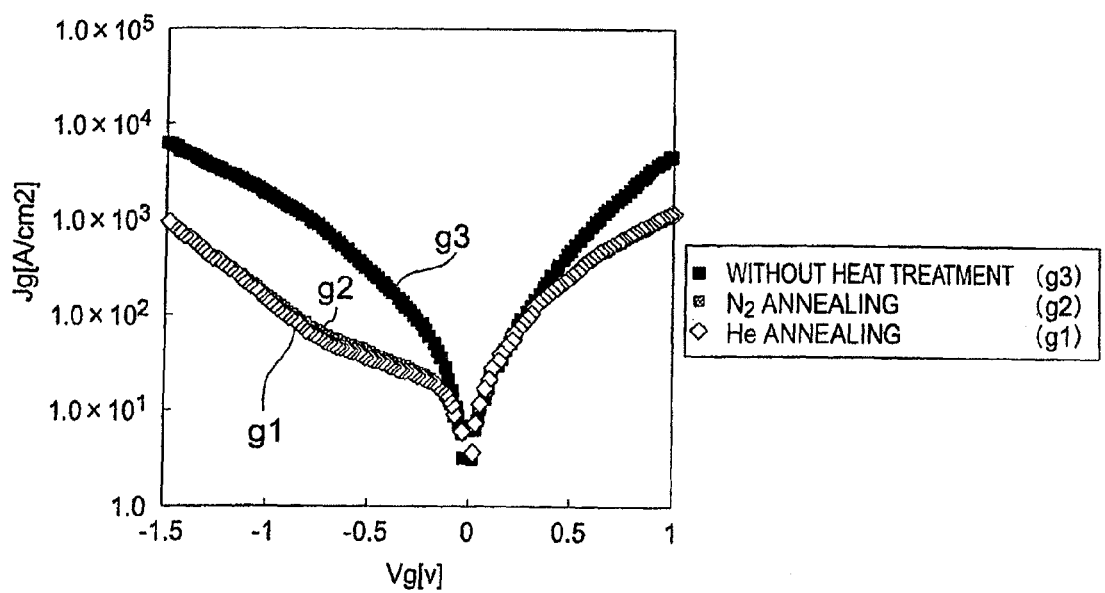
FIG. 60 shows a part of the manufacturing steps in a method for manufacturing a semiconductor device in accordance with an eleventh embodiment of the present invention.
FIG. 61 illustrates the effects of the eleventh embodiment.

Referring now to FIG. 60, a method for manufacturing a semiconductor device in accordance with an eleventh embodiment of the present invention is described. The method for manufacturing a semiconductor device in accordance with the eleventh embodiment is the same as the manufacturing method in accordance with the tenth embodiment shown in FIG. 58, except that the gas used in the heat treatment in step S59 after oxidization is changed from $N_2$ gas of 50 Torr in partial pressure to He gas of 50 Torr in partial pressure (step 59A of FIG. 60). Through the heat treatment after oxidization by the manufacturing method of this embodiment, the dangling bonds in the silicon oxynitride film also reunite with one another, and a stable Si—O—N bond is formed. Thus, the defects in the silicon oxynitride film become fewer.

Figure 62:
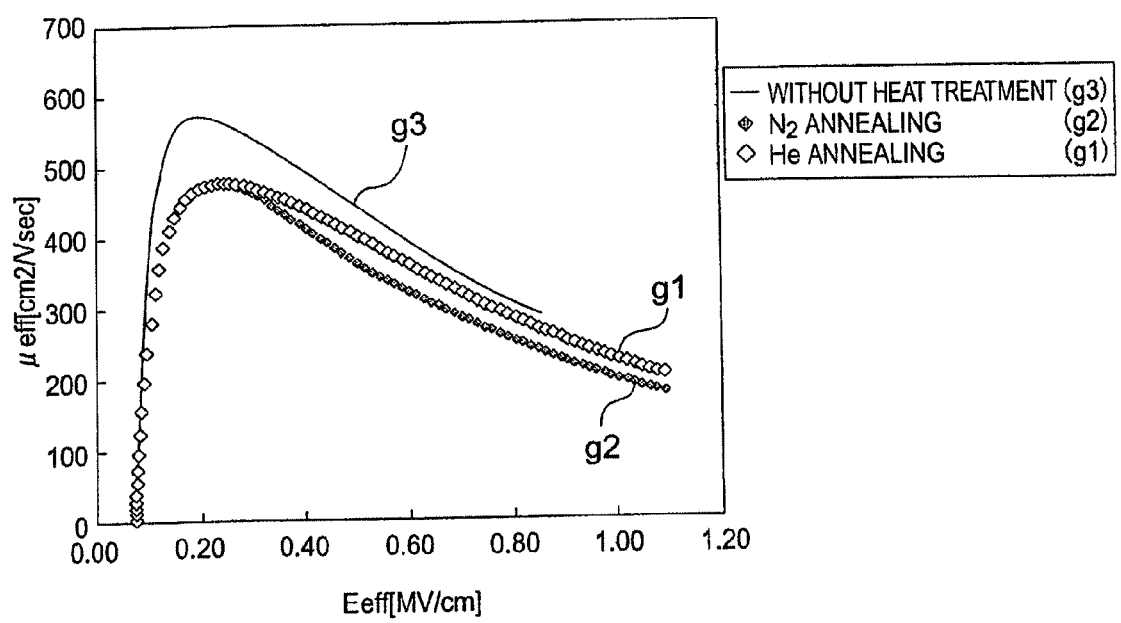
FIG. 62 illustrates the effects of the eleventh embodiment.

Referring now to FIGS. 61 and 62, the effects of this embodiment are described. FIG. 61 shows the comparison of the dependency of the leakage current Jg on the gate voltage Vg among a case where a gate insulating film is formed with a silicon oxynitride film subjected to heat treatment in a helium gas atmosphere (graph g1), a case where a gate insulating film is formed with a silicon oxynitride film subjected to heat treatment in a nitrogen gas atmosphere, instead of a helium gas atmosphere (graph g2), and a case where a gate insulating film is formed with a silicon oxynitride film not subjected to heat treatment (graph g3). As can be seen from FIG. 61, there is not a difference in leakage current Jg between the case of He gas and the case of $N_2$ gas.

With respect to the dependency of the effective mobility μeff on the effective electric field Eeff, FIG. 62 shows the comparison between the case where a gate insulating film is formed with a silicon oxynitride film subjected to heat treatment in a helium gas atmosphere (graph g1) and the case where a gate insulating film is formed with a silicon oxynitride film subjected to heat treatment in a nitrogen gas atmosphere, instead of a helium gas atmosphere (graph g2), with the case of a gate insulating film formed with a silicon oxynitride film not subjected to heat treatment (graph g3) being the reference case. Here, the effective mobility is the effective mobility of the electrons or holes flowing through the silicon substrate located immediately below the gate insulating film. High effective mobility means that the signal processing speed of the semiconductor device is high. As can be seen from FIG. 62, the gate insulating film subjected to heat treatment in a helium gas atmosphere has a smaller decrease in effective mobility on the high field side than the gate insulating film subjected to heat treatment in a nitrogen gas atmosphere.

The reason that the decrease in effective mobility is smaller in this embodiment is as follows. Due to a quenching effect of helium, the interface between the gate insulating film and the silicon substrate is deprived of atomic vibration energy, and the reaction of the $SiO_2$ of the gate insulating film with the Si of the silicon substrate is restrained. Accordingly, the surface roughness of the interface between the oxynitride layer on the silicon substrate side and the silicon substrate is restricted to substantially the same value as that of the surface roughness observed before the heat treatment. As a result, the decrease in effective mobility is made smaller in this embodiment.

As described above, in accordance with this embodiment, a SiON film having the interface preferentially oxidized can be formed by performing heat treatment after nitridation, as in the ninth embodiment. Accordingly, a SiON film with a smaller EOT can be obtained. Also, a SiON film with excellent reliability can be quickly formed by performing heat treatment using He gas after oxidization. In this embodiment, the shift amount ($\Delta V_{fb}$) of the flat-band voltage can be of course made smaller, as in the ninth and tenth embodiments.

Although the temperature during the heat treatment is 950° C. in this embodiment, it may range from 900° C. or more to 1000° C. or less.

Twelfth Embodiment

Figure 63:
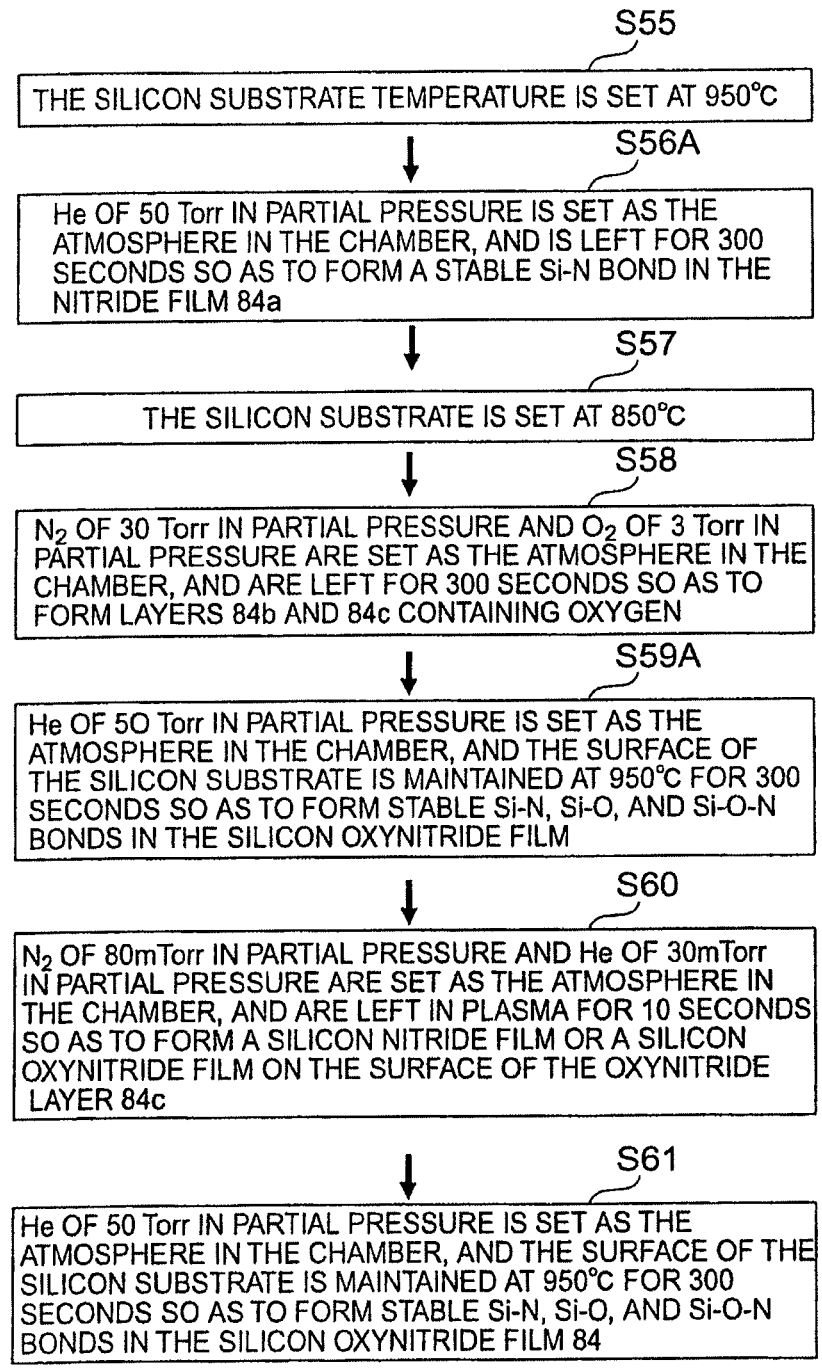
FIG. 63 is a flowchart showing the manufacturing steps in a method for manufacturing a semiconductor device in accordance with a twelfth embodiment of the present invention.
Figure 64A:
FIGS. 64A through 64C are cross-sectional views illustrating the procedures for manufacturing a semiconductor device in accordance with the twelfth embodiment.
Figure 64B:
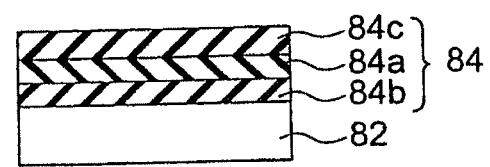
Figure 64C:
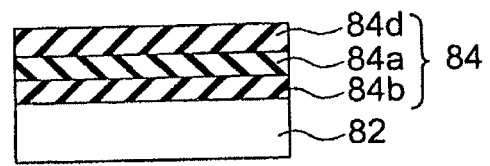

Referring now to FIGS. 63 through 64C, a method for manufacturing a semiconductor device in accordance with a twelfth embodiment of the present invention is described.

First, a nitride film 84a is formed on a silicon substrate (step S54 of FIG. 54) in the same manner as in the manufacturing method in accordance with the ninth embodiment shown in FIG. 54.

In the atmosphere in the chamber, He gas of 50 Torr in partial pressure, for example, is left, and the surface of each silicon substrate 82 is maintained at 950° C. for 300 seconds (steps S55 and S56A of FIG. 63). As a result, the dangling bonds in the nitride film 84a are bonded to nitrogen atoms, so as to form a stable Si—N bond in the nitride film 84a (FIG. 64A).

Next, in the atmosphere in the chamber, $N_2$ gas of 30 Torr in partial pressure and $O_2$ gas of 3 Torr in partial pressure, for example, are left, and the surface of each silicon substrate 82 is maintained at 850° C. for 300 seconds (steps S57 and S58). In this manner, an oxynitride layer 84b containing oxygen is formed between the silicon substrate 82 and the nitride film 84a, and an oxynitride layer 84c containing oxygen is formed on the surface of the nitride film 84a. Thus, a silicon oxynitride film 84 consisting of the oxynitride layer 84b, the nitride film 84a, and the oxynitride layer 84c is obtained (FIG. 64B).

In the atmosphere in the chamber, He gas of 50 Torr in partial pressure, for example, is left, and the surface of each silicon substrate 82 is maintained at 950° C. for 300 seconds (step S59A of FIG. 63). As a result, the dangling bonds in the SiON film 84 are bonded to nitrogen atoms, so as to reduce the defects in the SiON film 84.

The silicon substrate 82 is then left in plasma of $N_2$ gas of 80 mTorr in partial pressure and He gas of 30 mTorr in partial pressure, for example, for 10 seconds (step S60 of FIG. 63). By doing so, nitrogen is introduced into the oxynitride layer 84c, so as to form a silicon oxynitride layer 84d on the surface of the silicon oxynitride film 84a, as shown in FIG. 64C. Thus, a silicon oxynitride film 84 consisting of the oxynitride layer 84b, the nitride film 84a, and the silicon oxynitride layer 84d is formed.

In the atmosphere in the chamber, the silicon substrate 82 is subjected to heat treatment in a He gas atmosphere at an atmospheric pressure of about 50 Torr at 950° C. for 300 seconds (step S61 of FIG. 63). As a result, the dangling bonds in the SiON film 84 are bonded to nitrogen atoms, so as to form stable Si—N, Si—O, and Si—O—N bonds in the SiON film 84.

Figure 65:
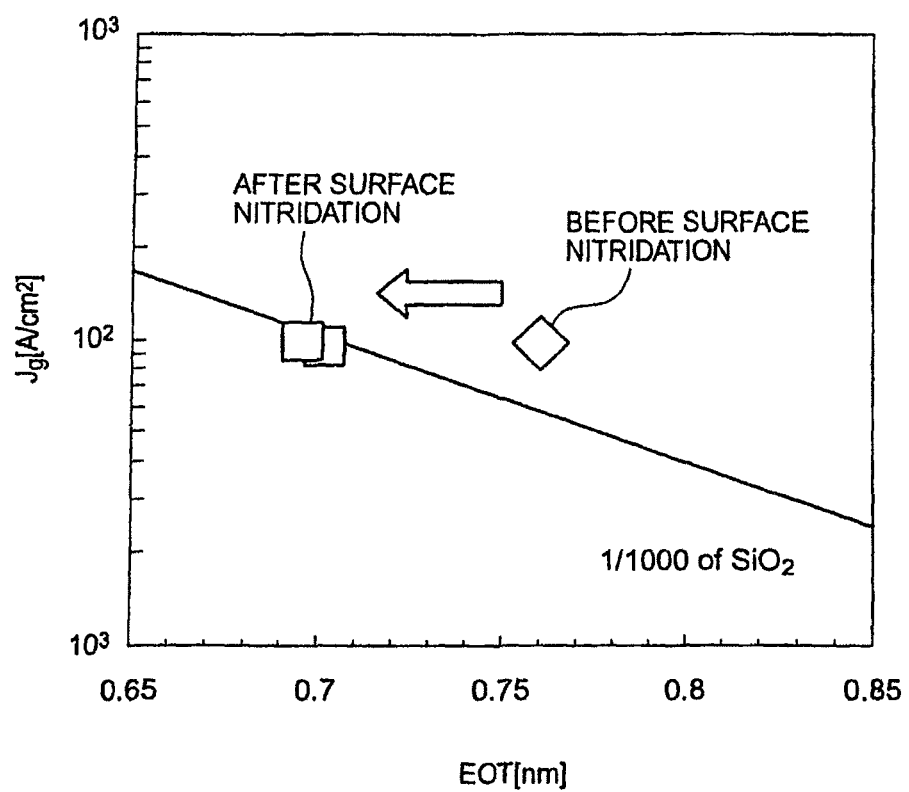
FIG. 65 illustrates the effects of the twelfth embodiment.

FIG. 65 shows variations in insulation properties before and after nitridation of the surface, in terms of the EOT dependency of the leakage current Jg. The leakage current Jg shown in FIG. 65 indicates the value measured when the electric field is 4.5 MV/cm. Since nitridation is performed on the surface, the leakage current Jg hardly varies, though the EOT becomes smaller. This implies that the insulation properties are improved.

The insulation properties are improved, because the permittivity of the silicon oxynitride layer 84d on the surface of the silicon oxynitride film 84 becomes higher. In the case where nitridation is not performed after oxidization, the existence of the silicon oxynitride layer 84c with low permittivity on the surface of the silicon nitride film 84 lowers the permittivity of the entire gate insulating film and increases the EOT. As a result, the insulation properties deteriorate. In the case where nitridation is performed after oxidization, on the other hand, nitrogen is introduced into the silicon oxynitride layer formed on the surface, and the increase in EOT is restrained as the permittivity is increased. Thus, excellent insulation properties can be achieved.

In this manner, a SiON film with higher permittivity and excellent insulation properties can be formed by performing nitridation of the surface after oxidization.

In accordance with this embodiment, a SiON film with a smaller EOT, excellent isolation properties, and excellent reliability, can be quickly obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A method for manufacturing a semiconductor device, comprising:
   exposing a silicon layer to a first atmosphere to form a nitride layer on the silicon layer, the first atmosphere containing a nitriding gas nitriding the silicon layer and a first diluent gas not actually reacting with the silicon layer during production, the ratio of the sum of the partial pressure of the first diluent gas and the partial pressure of the nitriding gas to the partial pressure of the nitriding gas being 5 or higher, and the total pressure of the first atmosphere being 3 Torr or higher but 40 Torr or lower; and
   exposing the silicon layer having the nitride layer to a second atmosphere, the second atmosphere containing an oxidizing gas and a second diluent gas not actually reacting with the silicon layer during production.

2. A method for manufacturing a semiconductor device, comprising:
   exposing a silicon layer to a first atmosphere to form a nitride layer on the silicon layer, the first atmosphere containing a nitriding gas nitriding the silicon layer and a first diluent gas not actually reacting with the silicon layer during production, the ratio of the sum of the partial pressure of the first diluent gas and the partial pressure of the nitriding gas to the partial pressure of the nitriding gas being 5 or higher, and the total pressure of the first atmosphere being 3 Torr or higher but 40 Torr or lower;
   exposing the silicon layer having the nitride layer to a second atmosphere containing radical N* gas or radical $N_2$* gas to form a first nitride film between the silicon layer and the nitride layer, and to form a second nitride film on the nitride layer; and
   exposing the silicon layer having the first nitride film, the nitride layer, and the second nitride film to a third atmosphere, the third atmosphere containing an oxidizing gas and a second diluent gas not actually reacting with the silicon layer during production.

3. A method for manufacturing a semiconductor device, comprising:
   exposing a silicon layer to a first atmosphere to form a nitride layer on the silicon layer, the first atmosphere containing a nitriding gas nitriding the silicon layer and a first diluent gas not actually reacting with the silicon layer during production, the ratio of the sum of the partial pressure of the first diluent gas and the partial pressure of the nitriding gas to the partial pressure of the nitriding gas being 5 or higher, and the total pressure of the first atmosphere being 3 Torr or higher but 40 Torr or lower;
   exposing the silicon layer having the nitride layer to a second atmosphere containing a nitride gas to form a first nitride film between the silicon layer and the nitride layer, and to form a second nitride film on the nitride layer; and
   exposing the silicon layer having the first nitride film, the nitride layer, and the second nitride film to a third atmosphere, the third atmosphere containing an oxidizing gas and a second diluent gas not actually reacting with the silicon layer during production,
   wherein a nitriding speed of forming the first and second nitride films is faster than that of forming the nitride layer.

4. The method for manufacturing a semiconductor device according to claim 1, wherein the oxidizing gas is one of $O_2$ gas, $N_2O$ gas, NO gas, and O* gas.

5. The method for manufacturing a semiconductor device according to claim 1, wherein the second diluent gas is $N_2$ gas.

6. The method for manufacturing a semiconductor device according to claim 1, wherein the exposing of the silicon layer having the nitride layer to the second atmosphere comprises forming a first oxynitride layer between the silicon layer and the nitride layer, and a second oxynitride layer on a surface of the nitride layer.

7. The method for manufacturing a semiconductor device according to claim 1, further comprising:
   performing heat treatment for the silicon layer having the nitride layer, the silicon layer being placed into a third atmosphere containing a gas not actually reacting with the silicon layer, the heat treatment being performed after exposing of the silicon layer to the first atmosphere and before exposing of the silicon layer to the second atmosphere.

8. The method for manufacturing a semiconductor device according to claim 1, wherein exposing of the silicon layer to the second atmosphere is carried out at a temperature of 800° C. or more but 950° C. or less.

9. The method for manufacturing a semiconductor device according to claim 1, further comprising:
   performing heat treatment for the silicon layer exposed to a fourth atmosphere containing a gas not actually reacting with the silicon layer, the heat treatment being performed after the exposing of the silicon layer to the second atmosphere.

10. The method for manufacturing a semiconductor device according to claim 9, wherein the gas not actually reacting with the silicon layer is $N_2$ gas or He gas.

11. The method for manufacturing a semiconductor device according to claim 6, further comprising:
   introducing nitrogen into the second oxynitride layer after the exposing of the silicon layer to the second atmosphere.

12. The method for manufacturing a semiconductor device according to 1, wherein the nitriding gas is one of $NH_3$ gas, radical $N^*$ gas, and radical $N_2^*$ gas.

13. The method for manufacturing a semiconductor device according to claim 1, wherein the total pressure of the first atmosphere is 30 Torr or lower.

14. The method for manufacturing a semiconductor device according to claim 1, wherein the first diluent gas contains $N_2$ gas.

15. The method for manufacturing a semiconductor device according to claim 1, wherein the first diluent gas contains a component having natural vibration energy similar to atomic vibration energy at the interface between the silicon layer and the nitride layer.

16. The method for manufacturing a semiconductor device according to claim 1, further comprising:

performing heat treatment for the silicon layer exposed to an atmosphere of a gas not actually reacting with the silicon layer, after the exposing of the silicon layer to the first atmosphere.

17. The method for manufacturing a semiconductor device according to claim 16, wherein the gas not actually reacting with the silicon layer is $N_2$ gas or He gas.

18. The method for manufacturing a semiconductor device according to claim 1, wherein, in the first atmosphere for forming the nitride layer, the ratio of the sum of the partial pressure of the first diluent gas and the partial pressure of the nitriding gas to the partial pressure of the first nitriding gas is 10000 or lower.

19. The method for manufacturing a semiconductor device according to claim 1, wherein the exposing of the silicon layer to the first atmosphere is performed at a temperature of 700° C. or more but 850° C. or less.

20. The method for manufacturing a semiconductor device according to claim 1, wherein a film thickness of the nitride layer is 4 Å or more but 1 nm or less.

21. The method for manufacturing a semiconductor device according to claim 1, wherein the silicon layer is a silicon substrate.

22. The method for manufacturing a semiconductor device according to claim 6, wherein the first oxynitride layer, the nitride layer, and the second oxynitride layer are included in a tunnel insulating film of a floating-gate non-volatile memory.

23. The method for manufacturing a semiconductor device according to claim 6, wherein the first oxynitride layer, the nitride layer, and the second oxynitride layer are included in a tunnel insulating film of a MONOS non-volatile memory.

24. The method for manufacturing a semiconductor device according to claim 6, wherein the first oxynitride layer, the nitride layer, and the second oxynitride layer are included in a gate insulating film of a MISFET.

* * * * *